(12) United States Patent
Swillam et al.

(10) Patent No.: US 11,994,808 B2
(45) Date of Patent: May 28, 2024

(54) LITHOGRAPHIC APPARATUS, METROLOGY SYSTEMS, PHASED ARRAY ILLUMINATION SOURCES AND METHODS THEREOF

(71) Applicant: ASML Holding N.V., Veldhoven (NL)

(72) Inventors: Mohamed Swillam, Wilton, CT (US); Tamer Mohamed Tawfik Ahmed Elazhary, New Canaan, CT (US); Stephen Roux, New Fairfield, CT (US); Yuxiang Lin, Wilton, CT (US); Justin Lloyd Kreuzer, Trumbull, CT (US)

(73) Assignee: ASML Holding N.V., Veldhoven (NL)

( * ) Notice: Subject to any disclaimer, the term of this patent is extended or adjusted under 35 U.S.C. 154(b) by 464 days.

(21) Appl. No.: 17/029,845

(22) Filed: Sep. 23, 2020

(65) Prior Publication Data

US 2021/0095957 A1    Apr. 1, 2021

Related U.S. Application Data

(60) Provisional application No. 63/079,211, filed on Sep. 16, 2020, provisional application No. 63/010,367, filed on Apr. 15, 2020, provisional application No. 62/907,024, filed on Sep. 27, 2019.

(51) Int. Cl.
*G03F 7/00* (2006.01)
*G01B 11/14* (2006.01)
(Continued)

(52) U.S. Cl.
CPC .......... *G03F 7/70633* (2013.01); *G01B 11/14* (2013.01); *G01B 11/272* (2013.01);
(Continued)

(58) Field of Classification Search
CPC ..... G01B 11/02; G01B 11/06; G01B 11/0616; G01B 11/08; G01B 11/14; G01B 11/16;
(Continued)

(56) References Cited

U.S. PATENT DOCUMENTS 3,841,733 A * 10/1974 Ebersole ............... G02F 1/2955
                                                             359/254
6,297,876 B1   10/2001 Bornebroek
(Continued)

FOREIGN PATENT DOCUMENTS

CN      108896977 A  * 11/2018
JP      2020112582 A * 7/2020
(Continued)

OTHER PUBLICATIONS

Niu et al., "Specular Spectroscopic Scatterometry in DUV Lithography", Proc. SPIE, vol. 3677, Metrology, Inspection, and Process Control Microlithography XIII (Jun. 14, 1999); 10 pages.
(Continued)

*Primary Examiner* — Gordon J Stock, Jr.
(74) *Attorney, Agent, or Firm* — Sterne, Kessler, Goldstein & Fox P.L.L.C.

(57) ABSTRACT

A system includes a radiation source, first and second phased arrays, and a detector. The first and second phased arrays include optical elements, a plurality of ports, waveguides, and phase modulators. The optical elements radiate radiation waves. The waveguides guide radiation from a port of the plurality of ports to the optical elements. Phase modulators adjust phases of the radiation waves. One or both of the first and second phased arrays form a first beam and/or a second beam of radiation directed toward a target structure based on the port coupled to the radiation source. The detector receives radiation scattered by the target structure and generates a measurement signal based on the received radiation.

24 Claims, 25 Drawing Sheets

(51) Int. Cl.
*G01B 11/27* (2006.01)
*G02B 6/12* (2006.01)
*G02B 6/293* (2006.01)
*H01L 21/67* (2006.01)

(52) U.S. Cl.
CPC ..... *G02B 6/12007* (2013.01); *G03F 7/70575* (2013.01); *G03F 7/70616* (2013.01); *G03F 7/7085* (2013.01); *G01B 2210/56* (2013.01); *G02B 6/29301* (2013.01); *G02B 6/29395* (2013.01); *G03F 7/70608* (2013.01); *H01L 21/67259* (2013.01)

(58) Field of Classification Search
CPC ..... G01B 11/24; G01B 11/25; G01B 11/2518; G01B 11/27; G01B 11/272; G01B 11/28; G01B 11/285; G01B 11/30; G01B 11/303; G01B 11/306; G01B 2210/56; G01N 21/25; G01N 21/251; G01N 21/255; G01N 21/27; G01N 21/29; G01N 21/47; G01N 21/4788; G01N 21/55; G01N 21/57; G01N 21/8422; G01N 21/88; G01N 21/8803; G01N 21/8806; G01N 21/8851; G01N 21/95; G01N 21/9501; G01N 21/956; G01N 21/95684; G01N 21/95692; G01N 2021/8816; G01N 2021/8835; G01N 2021/8845; G01N 2021/8848; G03F 7/70483; G03F 7/70575; G03F 7/70591; G03F 7/706; G03F 7/70608; G03F 7/70616; G03F 7/70625; G03F 7/70633; G03F 7/70651; G03F 7/7065; G03F 7/70683; G02B 6/12007; G02B 6/12009; G02B 6/12011; G02B 6/12014; G02B 6/12016; G02B 6/12019; G02B 6/12021; G02B 6/293; G02B 6/29301; G02B 6/29304; G02B 6/29313; G02B 6/29379; G02B 6/2938; G02B 6/29386; G02B 6/29388; G02B 6/29395

See application file for complete search history.

(56) References Cited

U.S. PATENT DOCUMENTS

| | | | |
|---|---|---|---|
| 6,961,116 B2 | 11/2005 | Den Boef et al. | |
| 7,511,799 B2 | 3/2009 | Tel et al. | |
| 8,339,595 B2 | 12/2012 | Den Boef | |
| 8,706,442 B2 | 4/2014 | Mos et al. | |
| 8,908,175 B1 | 12/2014 | Kandel et al. | |
| 9,557,585 B1 * | 1/2017 | Yap | H01L 23/5226 |
| 10,613,274 B2 | 4/2020 | Sahni et al. | |
| 10,690,995 B2 | 6/2020 | Kumar et al. | |
| 11,016,195 B2 * | 5/2021 | Margallo | G01S 17/32 |
| 11,294,061 B1 * | 4/2022 | Doerr | H01S 5/0071 |
| 11,307,092 B2 * | 4/2022 | Atabaki | G01J 1/4257 |
| 11,480,818 B2 * | 10/2022 | Inada | G02B 6/29343 |
| 11,582,399 B2 * | 2/2023 | Matsuda | G06T 15/506 |
| 2008/0160431 A1 * | 7/2008 | Scott | H01L 29/66659 257/E21.241 |
| 2009/0195768 A1 | 8/2009 | Bijnen et al. | |
| 2012/0212718 A1 | 8/2012 | Den Boef | |
| 2015/0261098 A1 | 9/2015 | Zhang et al. | |
| 2016/0139266 A1 * | 5/2016 | Montoya | G01S 17/42 356/5.01 |
| 2016/0188784 A1 | 6/2016 | Bhattacharyya et al. | |
| 2018/0052378 A1 * | 2/2018 | Shin | G02F 1/292 |
| 2019/0113452 A1 | 4/2019 | Pisarenco et al. | |
| 2019/0243000 A1 | 8/2019 | Shim | |
| 2019/0258004 A1 | 8/2019 | Puckett | |
| 2019/0285407 A1 * | 9/2019 | Chuang | G03F 7/70633 |
| 2019/0302570 A1 | 10/2019 | Kumar et al. | |
| 2019/0391243 A1 * | 12/2019 | Nicolaescu | G01S 17/32 |
| 2022/0342228 A1 * | 10/2022 | Setija | G02F 1/2955 |
| 2023/0003938 A1 * | 1/2023 | Zilkie | G01J 3/4412 |

FOREIGN PATENT DOCUMENTS

| | | |
|---|---|---|
| TW | 2018-04740 A | 2/2018 |
| TW | 2018-09921 A | 3/2018 |
| TW | 2019-37314 A | 9/2019 |
| WO | WO-2020121452 A1 * | 6/2020 |
| WO | WO-2020145266 A1 * | 7/2020 |

OTHER PUBLICATIONS

Raymond et al., "Multiparameter grating metrology using optical scatterometry", J. Vac. Sci. Tech. B, vol. 15, No. 2, (Mar./Apr. 1997); pp. 361-368.

International Search Report and Written Opinion of the International Searching Authority directed to related International Patent Application No. PCT/EP2020/076578, dated Jan. 20, 2021; 11 pages.

Chinese Office Action directed to Chinese Patent Application No. 202080067850.7, mailed Jan. 25, 2024; 14 pages.

* cited by examiner

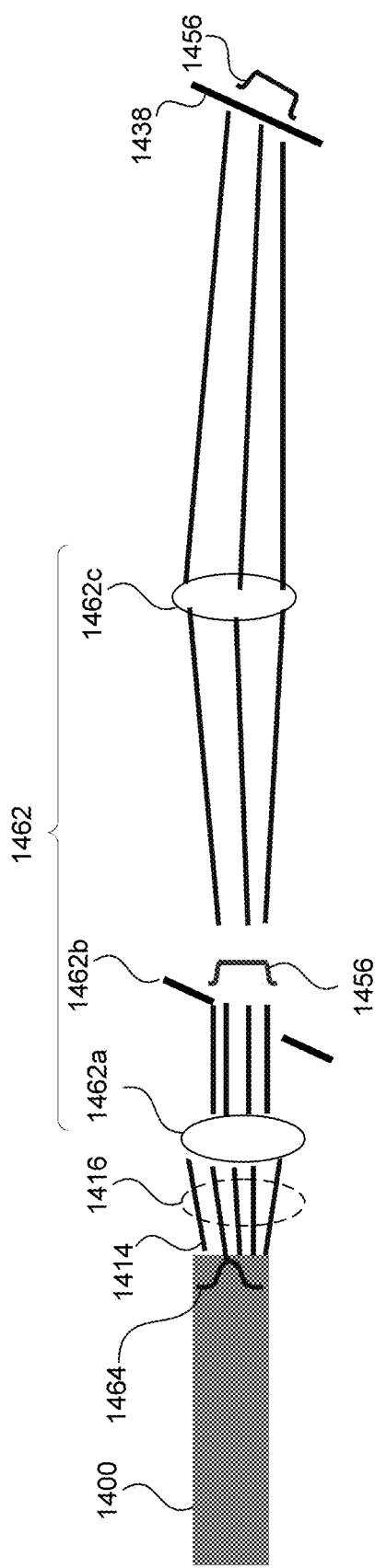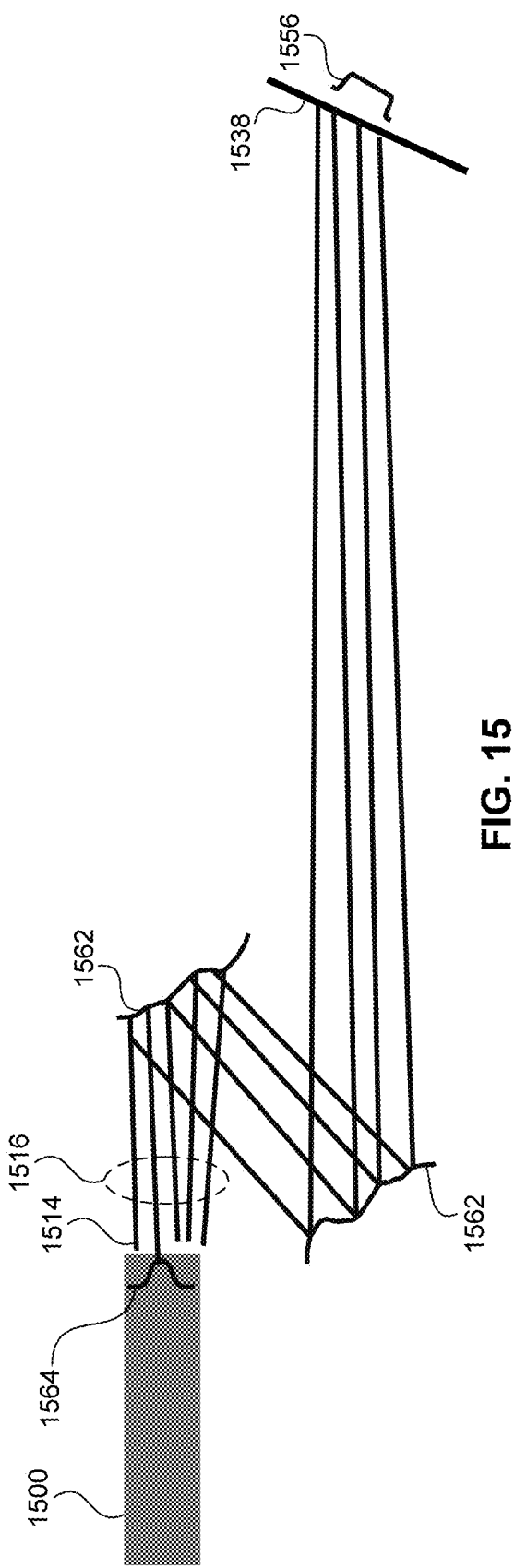
FIG. 14
FIG. 15

LITHOGRAPHIC APPARATUS, METROLOGY SYSTEMS, PHASED ARRAY ILLUMINATION SOURCES AND METHODS THEREOF

CROSS-REFERENCE TO RELATED APPLICATIONS

This application claims benefit of U.S. application No. 62/907,024, filed Sep. 27, 2019, U.S. application No. 63/010,367, filed Apr. 15, 2020, and U.S. application No. 63/079,211, filed Sep. 16, 2020, which are all incorporated herein in its entirety by reference.

FIELD

The present disclosure relates to metrology systems with integrated optics, for example, illumination systems with integrated phased arrays used in metrology systems for inspecting lithographic processes and wafer alignment.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, can be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the target portions parallel or anti-parallel to this scanning direction. It is also possible to transfer the pattern from the patterning device to the substrate by imprinting the pattern onto the substrate.

Another lithographic system is an interferometric lithographic system where there is no patterning device, but rather a light beam is split into two beams, and the two beams are caused to interfere at a target portion of the substrate through the use of a reflection system. The interference causes lines to be formed at the target portion of the substrate.

During lithographic operation, different processing steps may require different layers to be sequentially formed on the substrate. Accordingly, it can be necessary to position the substrate relative to prior patterns formed thereon with a high degree of accuracy. Generally, alignment marks are placed on the substrate to be aligned and are located with reference to a second object. A lithographic apparatus may use an inspection apparatus (e.g., alignment apparatus) for detecting positions of the alignment marks and for aligning the substrate using the alignment marks to ensure accurate exposure from a mask. Misalignment between the alignment marks at two different layers is measured as overlay error.

In order to monitor the lithographic process, parameters of the patterned substrate are measured. Parameters may include, for example, the overlay error between successive layers formed in or on the patterned substrate and critical linewidth of developed photosensitive resist. This measurement can be performed on a product substrate and/or on a dedicated metrology target. There are various techniques for making measurements of the microscopic structures formed in lithographic processes, including the use of scanning electron microscopes and various specialized tools. A fast and non-invasive form of a specialized inspection tool is a scatterometer in which a beam of radiation is directed onto a target on the surface of the substrate and properties of the scattered or reflected beam are measured. By comparing the properties of the beam before and after it has been reflected or scattered by the substrate, the properties of the substrate can be determined. This can be done, for example, by comparing the reflected beam with data stored in a library of known measurements associated with known substrate properties. Spectroscopic scatterometers direct a broadband radiation beam onto the substrate and measure the spectrum (intensity as a function of wavelength) of the radiation scattered into a particular narrow angular range. By contrast, angularly resolved scatterometers may use a monochromatic radiation beam and measure the intensity of the scattered radiation as a function of angle.

Such optical scatterometers can be used to measure parameters, such as critical dimensions of developed photosensitive resist or overlay error (OV) between two layers formed in or on the patterned substrate. Properties of the substrate can be determined by comparing the properties of an illumination beam before and after the beam has been reflected or scattered by the substrate.

As ICs become smaller and more densely packed, so too increases the number of features that must be inspected per wafer. It is desirable to improve the capabilities of metrology systems in order to keep pace with current high-volume manufacturing rates and improve production speeds beyond what is currently available. Accordingly, there is a need to provide metrology tools capable of quickly and accurately measuring a large number of lithographic features. Metrology solutions may include, e.g., increasing the number of simultaneous measurements and/or increasing the speed of a measurement.

SUMMARY

In some embodiments, a system includes a radiation source, first and second phased arrays, and a detector. The first and second phased arrays include optical elements, a plurality of ports, waveguides, and phase modulators. The optical elements radiate radiation waves. The waveguides guide radiation from a port of the plurality of ports to the optical elements. Phase modulators adjust phases of the radiation waves. One or both of the first and second phased arrays form a first beam and/or a second beam of radiation directed toward a target structure based on the port coupled to the radiation source. The detector receives radiation scattered by the target structure and generates a measurement signal based on the received radiation.

In some embodiments, a system includes a radiation source, a phased array, a detector, and a controller. The phased array generates a beam of radiation and directs the beam toward a target structure on a substrate. The detector receives radiation scattered by the target structure and generates a measurement signal based on the received radiation. A controller controls a phase offset of each respective optical element to control a direction of the beam. The phased array includes optical elements, waveguides, and phase modulators. The optical elements radiate radiation waves. The waveguides guide radiation from the radiation source to the optical elements. The phase modulators adjust phases of the radiation waves such that the radiation waves accumulate to form the beam.

In some embodiments, a system includes a phased array. The phased array includes optical elements, waveguides, phase modulators, and one or metal elements. The optical elements radiate or detect radiation waves. The waveguides guide radiation from the radiation source to the optical elements or from the optical elements to a detector. The phase modulators adjust phases of the radiation waves. The one or more metal elements are interposed between the waveguides configured to reduce coupling between optical elements.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIGS. 14 and 15 show schematics of illumination branches of metrology systems, according to some embodiments.

Figure 1A:
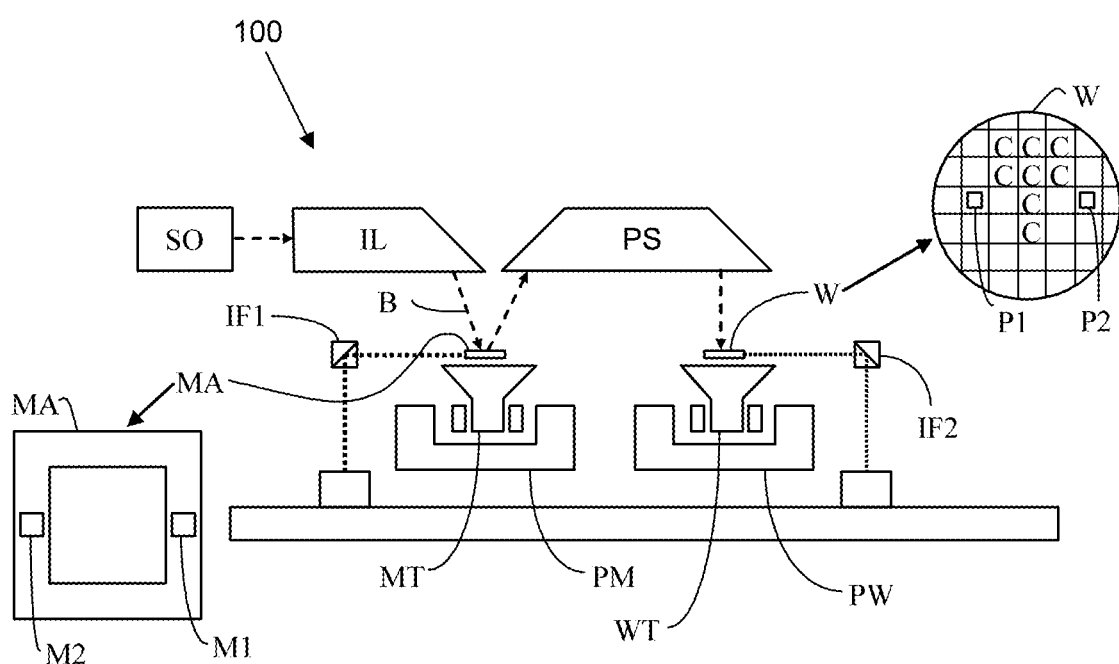
FIG. 1A shows a schematic of a reflective lithographic apparatus, according to some embodiments.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. Additionally, generally, the left-most digit(s) of a reference number identifies the drawing in which the reference number first appears. Unless otherwise indicated, the drawings provided throughout the disclosure should not be interpreted as to-scale drawings.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Spatially relative terms, such as "beneath," "below," "lower," "above," "on," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "about" as used herein indicates the value of a given quantity that can vary based on a particular technology. Based on the particular technology, the term "about" may indicate a value of a given quantity that varies within, for example, 10-30% of the value (e.g., ±10%, ±20%, or ±30% of the value).

Embodiments of the disclosure can be implemented in hardware, firmware, software, or any combination thereof. Embodiments of the disclosure may also be implemented as instructions stored on a machine-readable medium, which can be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, and/or instructions can be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present disclosure can be implemented.

Example Lithographic Systems

Figure 1B:
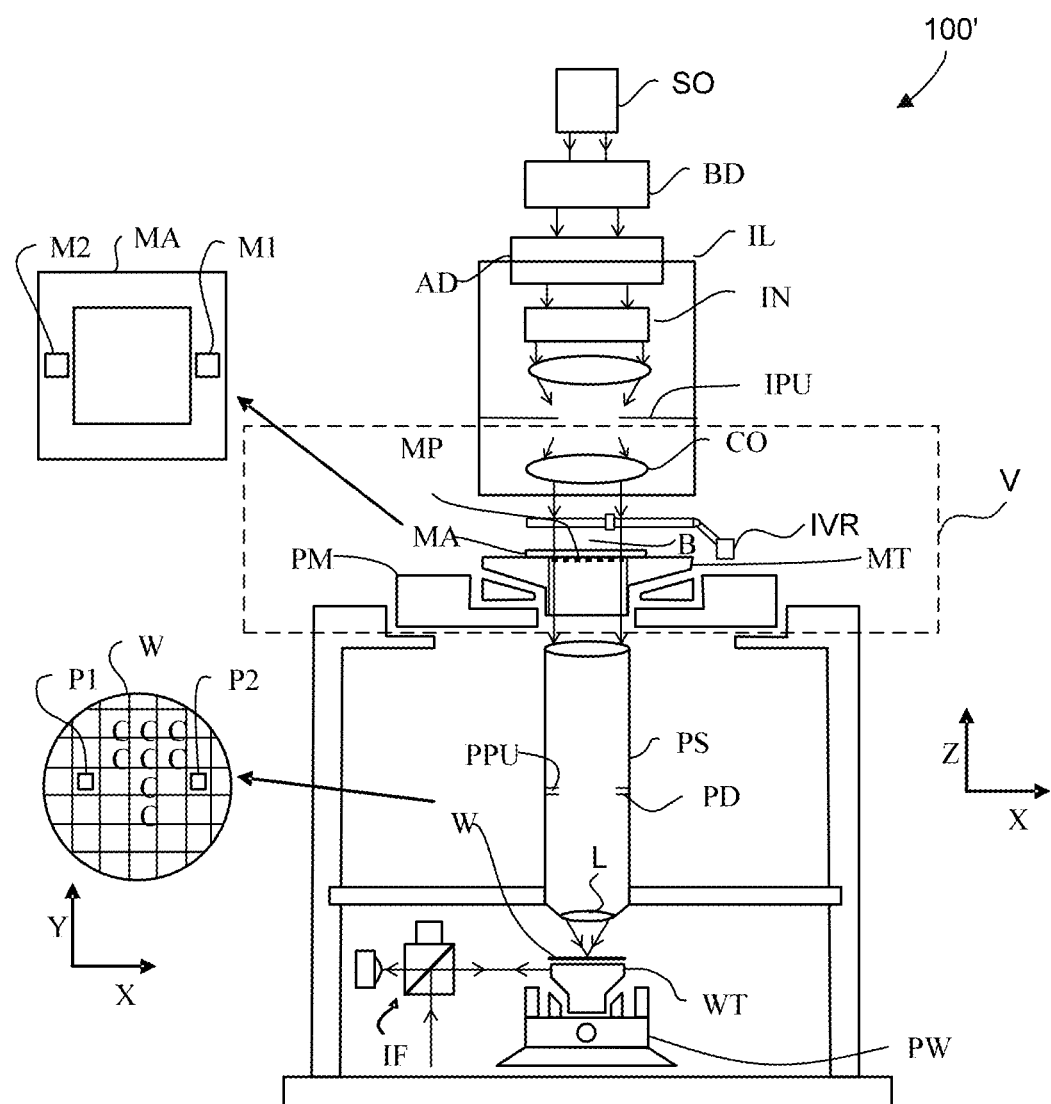
FIG. 1B shows a schematic of a transmissive lithographic apparatus, according to some embodiments.

FIGS. 1A and 1B show schematic illustrations of a lithographic apparatus 100 and lithographic apparatus 100', respectively, in which embodiments of the present disclosure may be implemented. Lithographic apparatus 100 and lithographic apparatus 100' each include the following: an illumination system (illuminator) IL configured to condition a radiation beam B (for example, deep ultra violet or extreme ultra violet radiation); a support structure (for example, a mask table) MT configured to support a patterning device (for example, a mask, a reticle, or a dynamic patterning device) MA and connected to a first positioner PM configured to accurately position the patterning device MA; and, a substrate table (for example, a wafer table) WT configured to hold a substrate (for example, a resist coated wafer) W and connected to a second positioner PW configured to accurately position the substrate W. Lithographic apparatus 100 and 100' also have a projection system PS configured to project a pattern imparted to the radiation beam B by patterning device MA onto a target portion (for example, comprising one or more dies) C of the substrate W. In lithographic apparatus 100, the patterning device MA and the projection system PS are reflective. In lithographic apparatus 100', the patterning device MA and the projection system PS are transmissive.

The illumination system IL may include various types of optical components, such as refractive, reflective, catadioptric, magnetic, electromagnetic, electrostatic, or other types of optical components, or any combination thereof, for directing, shaping, or controlling the radiation beam B.

The support structure MT holds the patterning device MA in a manner that depends on the orientation of the patterning device MA with respect to a reference frame, the design of at least one of the lithographic apparatus 100 and 100', and other conditions, such as whether or not the patterning device MA is held in a vacuum environment. The support structure MT may use mechanical, vacuum, electrostatic, or other clamping techniques to hold the patterning device MA. The support structure MT may be a frame or a table, for example, which may be fixed or movable, as required. By using sensors, the support structure MT may ensure that the patterning device MA is at a desired position, for example, with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C to form an integrated circuit.

The terms "inspection apparatus," "metrology apparatus," and the like may be used herein to refer to, e.g., a device or system used for measuring a property of a structure (e.g., overlay error, critical dimension parameters) or used in a lithographic apparatus to inspect an alignment of a wafer (e.g., alignment apparatus).

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, or programmable LCD panels. Masks are well known in lithography, and include mask types such as binary, alternating phase shift, or attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B, which is reflected by a matrix of small mirrors.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid on the substrate W or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables WT (and/or two or more mask tables). In such "multiple stage" machines, the additional substrate tables WT may be used in parallel, or preparatory steps may be carried out on one or more tables while one or more other substrate tables WT are being used for exposure. In some situations, the additional table may not be a substrate table WT.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIGS. 1A and 1B, the illuminator IL receives a radiation beam from a radiation source SO. The source SO and the lithographic apparatus 100, 100' can may be separate physical entities, for example, when the source SO is an excimer laser. In such cases, the source SO is not considered to form part of the lithographic apparatus 100 or 100', and the radiation beam B passes from the source SO to the illuminator IL with the aid of a beam delivery system BD (in FIG. 1B) including, for example, suitable directing mirrors and/or a beam expander. In other cases, the source SO may be an integral part of the lithographic apparatus 100, 100', for example, when the source SO is a mercury lamp. The source SO and the illuminator IL, together with the beam delivery system BD, if required, may be referred to as a radiation system.

The illuminator IL may include an adjuster AD (in FIG. 1B) for adjusting the angular intensity distribution of the radiation beam. Generally, at least the outer and/or inner radial extent (commonly referred to as "σ-outer" and "σ-inner," respectively) of the intensity distribution in a pupil plane of the illuminator may be adjusted. In addition, the illuminator IL may comprise various other components (in FIG. 1B), such as an integrator IN and a condenser CO. The illuminator IL may be used to condition the radiation beam B to have a desired uniformity and intensity distribution in its cross section.

Referring to FIG. 1A, the radiation beam B is incident on the patterning device (for example, mask) MA, which is held on the support structure (for example, mask table) MT, and is patterned by the patterning device MA. In lithographic apparatus 100, the radiation beam B is reflected from the patterning device (for example, mask) MA. After being reflected from the patterning device (for example, mask) MA, the radiation beam B passes through the projection system PS, which focuses the radiation beam B onto a target portion C of the substrate W. With the aid of the second positioner PW and position sensor IF2 (for example, an interferometric device, linear encoder, or capacitive sensor), the substrate table WT may be moved accurately (for example, so as to position different target portions C in the path of the radiation beam B). Similarly, the first positioner PM and another position sensor IF1 may be used to accurately position the patterning device (for example, mask) MA with respect to the path of the radiation beam B. Patterning device (for example, mask) MA and substrate W may be aligned using mask alignment marks M1, M2 and substrate alignment marks P1, P2.

Referring to FIG. 1B, the radiation beam B is incident on the patterning device (for example, mask MA), which is held on the support structure (for example, mask table MT), and is patterned by the patterning device. Having traversed the mask MA, the radiation beam B passes through the projection system PS, which focuses the beam onto a target portion C of the substrate W. The projection system has a pupil conjugate PPU to an illumination system pupil IPU. Portions of radiation emanate from the intensity distribution at the illumination system pupil IPU and traverse a mask pattern without being affected by diffraction at the mask pattern and create an image of the intensity distribution at the illumination system pupil IPU.

The projection system PS projects an image MP' of the mask pattern MP, where image MP' is formed by diffracted beams produced from the mark pattern MP by radiation from the intensity distribution, onto a photoresist layer coated on the substrate W. For example, the mask pattern MP may include an array of lines and spaces. A diffraction of radiation at the array and different from zeroth order diffraction generates diverted diffracted beams with a change of direction in a direction perpendicular to the lines. Undiffracted beams (i.e., so-called zeroth order diffracted beams) traverse the pattern without any change in propagation direction. The zeroth order diffracted beams traverse an upper lens or upper lens group of the projection system PS, upstream of the pupil conjugate PPU of the projection system PS, to reach the pupil conjugate PPU. The portion of the intensity distribution in the plane of the pupil conjugate PPU and associated with the zeroth order diffracted beams is an image of the intensity distribution in the illumination system pupil IPU of the illumination system IL. The aperture device PD, for example, is disposed at or substantially at a plane that includes the pupil conjugate PPU of the projection system PS.

The projection system PS is arranged to capture, by means of a lens or lens group L, not only the zeroth order diffracted beams, but also first-order or first- and higher-order diffracted beams (not shown). In some embodiments, dipole illumination for imaging line patterns extending in a direction perpendicular to a line may be used to utilize the resolution enhancement effect of dipole illumination. For example, first-order diffracted beams interfere with corresponding zeroth-order diffracted beams at the level of the wafer W to create an image of the line pattern MP at highest possible resolution and process window (i.e., usable depth of focus in combination with tolerable exposure dose deviations). In some embodiments, astigmatism aberration may be reduced by providing radiation poles (not shown) in opposite quadrants of the illumination system pupil IPU. Further, in some embodiments, astigmatism aberration may be reduced by blocking the zeroth order beams in the pupil conjugate PPU of the projection system associated with radiation poles in opposite quadrants. This is described in more detail in U.S. Pat. No. 7,511,799 B2, issued Mar. 31, 2009, which is incorporated by reference herein in its entirety.

With the aid of the second positioner PW and position sensor IF (for example, an interferometric device, linear encoder, or capacitive sensor), the substrate table WT may be moved accurately (for example, so as to position different target portions C in the path of the radiation beam B). Similarly, the first positioner PM and another position sensor (not shown in FIG. 1B) may be used to accurately position the mask MA with respect to the path of the radiation beam B (for example, after mechanical retrieval from a mask library or during a scan).

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner), the mask table MT may be connected to a short-stroke actuator only or may be fixed. Mask MA and substrate W may be aligned using mask alignment marks M1, M2, and substrate alignment marks P1, P2. Although the substrate alignment marks (as illustrated) occupy dedicated target portions, they may be located in spaces between target portions (known as scribe-lane alignment marks). Similarly, in situations in which more than one die is provided on the mask MA, the mask alignment marks may be located between the dies.

Mask table MT and patterning device MA may be in a vacuum chamber V, where an in-vacuum robot IVR may be used to move patterning devices such as a mask in and out of vacuum chamber. Alternatively, when mask table MT and patterning device MA are outside of the vacuum chamber, an out-of-vacuum robot may be used for various transportation operations, similar to the in-vacuum robot IVR. Both the in-vacuum and out-of-vacuum robots need to be calibrated for a smooth transfer of any payload (e.g., mask) to a fixed kinematic mount of a transfer station.

The lithographic apparatus 100 and 100' may be used in at least one of the following modes:

1. In step mode, the support structure (for example, mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

2. In scan mode, the support structure (for example, mask table) MT and the substrate table WT are scanned synchronously while a pattern imparted to the radiation beam B is projected onto a target portion C (i.e., a single dynamic exposure). The velocity and direction of the substrate table WT relative to the support structure (for example, mask table) MT may be determined by the (de-)magnification and image reversal characteristics of the projection system PS.

3. In another mode, the support structure (for example, mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes a programmable patterning device, such as a programmable mirror array.

Combinations and/or variations on the described modes of use or entirely different modes of use may also be employed.

In a further embodiment, lithographic apparatus 100 includes an extreme ultraviolet (EUV) source, which is configured to generate a beam of EUV radiation for EUV lithography. In general, the EUV source is configured in a radiation system, and a corresponding illumination system is configured to condition the EUV radiation beam of the EUV source.

Figure 2:
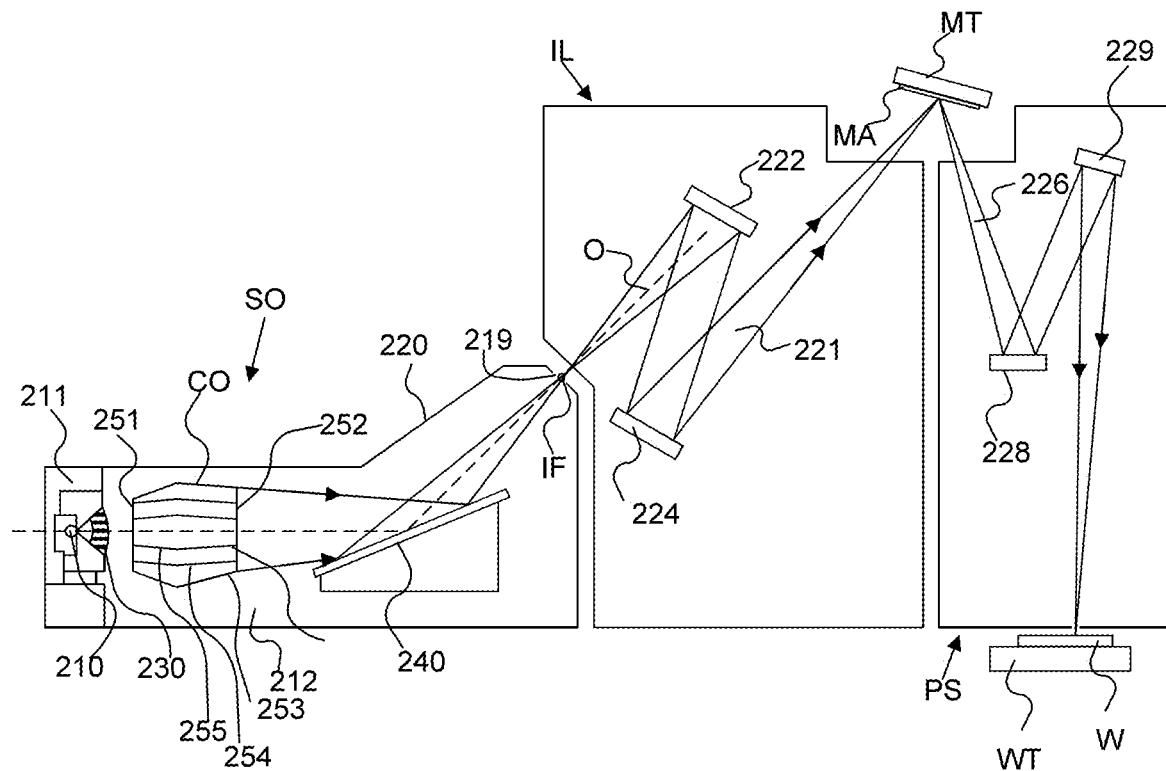
FIG. 2 shows a more detailed schematic of the reflective lithographic apparatus, according to some embodiments.

FIG. 2 shows the lithographic apparatus 100 in more detail, including the source collector apparatus SO, the illumination system IL, and the projection system PS. The source collector apparatus SO is constructed and arranged such that a vacuum environment may be maintained in an enclosing structure 220 of the source collector apparatus SO. An EUV radiation emitting plasma 210 may be formed by a discharge produced plasma source. EUV radiation may be produced by a gas or vapor, for example Xe gas, Li vapor, or Sn vapor in which the very hot plasma 210 is created to emit radiation in the EUV range of the electromagnetic spectrum. The very hot plasma 210 is created by, for example, an electrical discharge causing at least a partially ionized plasma. Partial pressures of, for example, 10 Pa of Xe, Li, Sn vapor, or any other suitable gas or vapor may be required for efficient generation of the radiation. In some embodiments, a plasma of excited tin (Sn) is provided to produce EUV radiation.

The radiation emitted by the hot plasma 210 is passed from a source chamber 211 into a collector chamber 212 via an optional gas barrier or contaminant trap 230 (in some cases also referred to as contaminant barrier or foil trap), which is positioned in or behind an opening in source chamber 211. The contaminant trap 230 may include a channel structure. Contamination trap 230 may also include a gas barrier or a combination of a gas barrier and a channel structure. The contaminant trap or contaminant barrier 230 further indicated herein at least includes a channel structure.

The collector chamber 212 may include a radiation collector CO, which may be a so-called grazing incidence collector. Radiation collector CO has an upstream radiation collector side 251 and a downstream radiation collector side 252. Radiation that traverses collector CO may be reflected off a grating spectral filter 240 to be focused in a virtual source point IF. The virtual source point IF is commonly referred to as the intermediate focus, and the source collector apparatus is arranged such that the intermediate focus IF is located at or near an opening 219 in the enclosing structure 220. The virtual source point IF is an image of the radiation emitting plasma 210. Grating spectral filter 240 is used in particular for suppressing infra-red (IR) radiation.

Subsequently the radiation traverses the illumination system IL, which may include a faceted field mirror device 222 and a faceted pupil mirror device 224 arranged to provide a desired angular distribution of the radiation beam 221, at the patterning device MA, as well as a desired uniformity of radiation intensity at the patterning device MA. Upon reflection of the beam of radiation 221 at the patterning device MA, held by the support structure MT, a patterned beam 226 is formed and the patterned beam 226 is imaged by the projection system PS via reflective elements 228, 229 onto a substrate W held by the wafer stage or substrate table WT.

More elements than shown may generally be present in illumination optics unit IL and projection system PS. The grating spectral filter 240 may optionally be present, depending upon the type of lithographic apparatus. Further, there may be more mirrors present than those shown in the FIG. 2, for example there may be one to six additional reflective elements present in the projection system PS than shown in FIG. 2.

Collector optic CO, as illustrated in FIG. 2, is depicted as a nested collector with grazing incidence reflectors 253, 254, and 255, just as an example of a collector (or collector mirror). The grazing incidence reflectors 253, 254, and 255 are disposed axially symmetric around an optical axis O and a collector optic CO of this type is preferably used in combination with a discharge produced plasma source, often called a DPP source.

Exemplary Lithographic Cell

Figure 3:
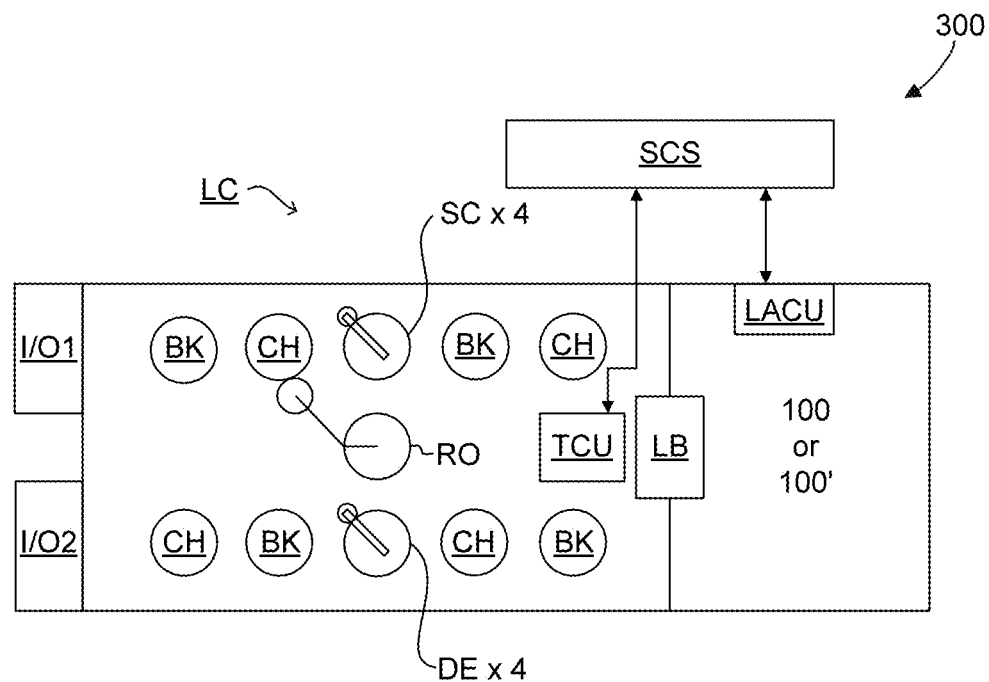
FIG. 3 shows a schematic of a lithographic cell, according to some embodiments.

FIG. 3 shows a lithographic cell 300, also sometimes referred to a lithocell or cluster, according to some embodiments. Lithographic apparatus 100 or 100' may form part of lithographic cell 300. Lithographic cell 300 may also include one or more apparatuses to perform pre- and post-exposure processes on a substrate. Conventionally these include spin coaters SC to deposit resist layers, developers DE to develop exposed resist, chill plates CH, and bake plates BK. A substrate handler, or robot, RO picks up substrates from input/output ports I/O1, I/O2, moves them between the different process apparatuses and delivers them to the loading bay LB of the lithographic apparatus 100 or 100'. These devices, which are often collectively referred to as the track, are under the control of a track control unit TCU, which is itself controlled by a supervisory control system SCS, which also controls the lithographic apparatus via lithography control unit LACU. Thus, the different apparatuses may be operated to maximize throughput and processing efficiency.

Exemplary Inspection Apparatuses

In order to control the lithographic process to place device features accurately on the substrate, alignment marks are generally provided on the substrate, and the lithographic apparatus includes one or more alignment apparatuses and/or systems by which positions of marks on a substrate must be measured accurately. These alignment apparatuses are effectively position measuring apparatuses. Different types of marks and different types of alignment apparatuses and/or systems are known from different times and different manufacturers. A type of system widely used in current lithographic apparatus is based on a self-referencing interferometer as described in U.S. Pat. No. 6,961,116 (den Boef et al.). Generally marks are measured separately to obtain X- and Y-positions. A combined X- and Y-measurement may be performed using the techniques described in U.S. Publication No. 2009/195768 A (Bijnen et al.), however. The full contents of both of these disclosures are incorporated herein by reference.

Figure 4A:
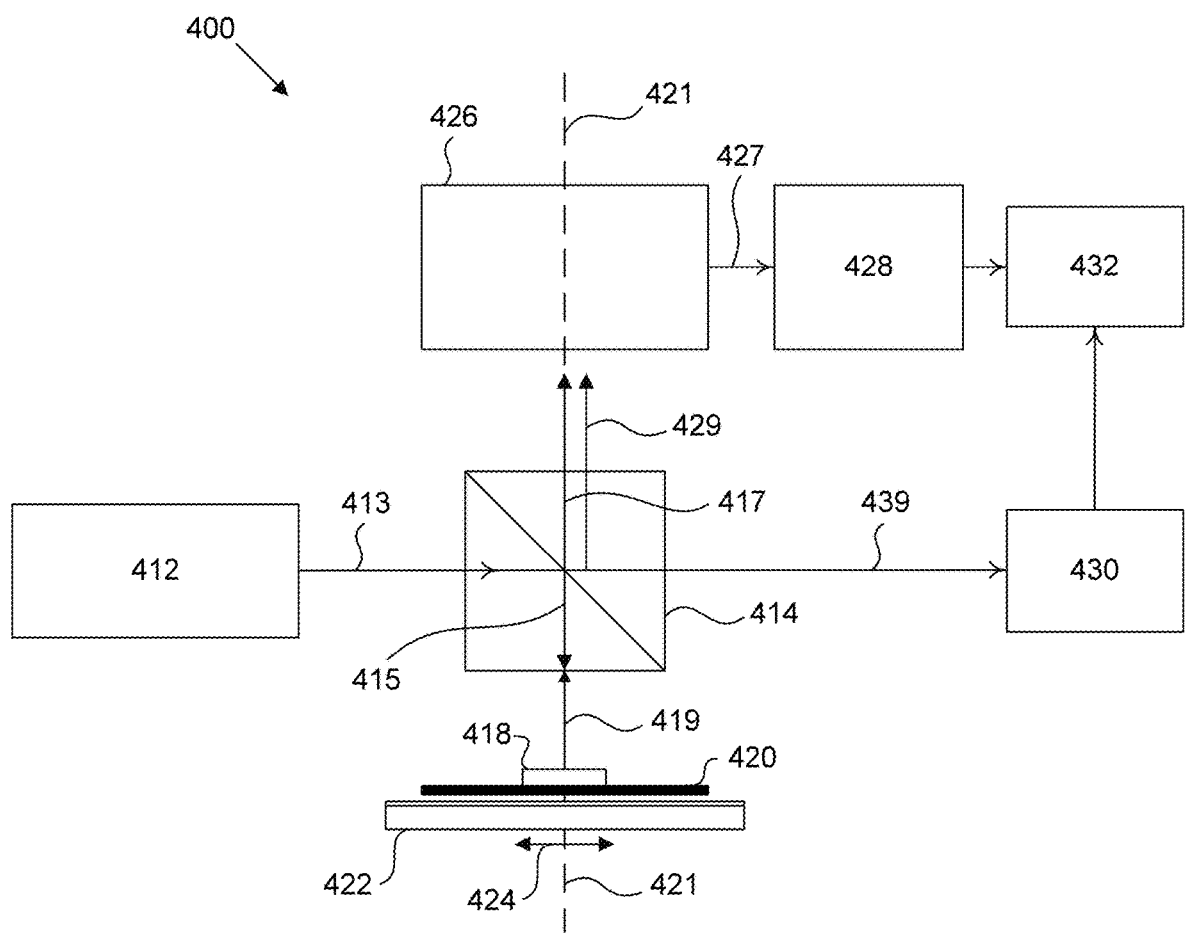
FIGS. 4A and 4B show schematics of inspection apparatuses, according to some embodiments.

FIG. 4A shows a schematic of a cross-sectional view of an inspection apparatus 400, according to some embodiments. In some embodiments, inspection apparatus 400 may be implemented as part of lithographic apparatus 100 or 100'. Inspection apparatus 400 may be configured to align a substrate (e.g., substrate W) with respect to a patterning device (e.g., patterning device MA). Inspection apparatus 400 may be further configured to detect positions of alignment marks on the substrate and to align the substrate with respect to the patterning device or other components of lithographic apparatus 100 or 100' using the detected positions of the alignment marks. Such alignment of the substrate may ensure accurate exposure of one or more patterns on the substrate.

In some embodiments, inspection apparatus 400 may include an illumination system 412, a beam splitter 414, an interferometer 426, a detector 428, a beam analyzer 430, and an overlay calculation processor 432. Illumination system 412 may be configured to provide an electromagnetic narrow band radiation beam 413 having one or more passbands. In an example, the one or more passbands may be within a spectrum of wavelengths between about 500 nm to about 900 nm. In another example, the one or more passbands may be discrete narrow passbands within a spectrum of wavelengths between about 500 nm to about 900 nm. Illumination system 412 may be further configured to provide one or more passbands having substantially constant center wavelength (CWL) values over a long period of time (e.g., over a lifetime of illumination system 412). Such configuration of illumination system 412 may help to prevent the shift of the actual CWL values from the desired CWL values, as discussed above, in current alignment systems. And, as a result, the use of constant CWL values may improve long-term stability and accuracy of alignment systems (e.g., inspection apparatus 400) compared to the current alignment apparatuses.

In some embodiments, beam splitter 414 may be configured to receive radiation beam 413 and split radiation beam 413 into at least two radiation sub-beams. For example, radiation beam 413 may be split into radiation sub-beams 415 and 417, as shown in FIG. 4A. Beam splitter 414 may be further configured to direct radiation sub-beam 415 onto a substrate 420 placed on a stage 422. In one example, the stage 422 is movable along direction 424. Radiation sub-beam 415 may be configured to illuminate an alignment mark or a target 418 located on substrate 420. Alignment mark or target 418 may be coated with a radiation sensitive film. In some embodiments, alignment mark or target 418 may have one hundred and eighty degrees (i.e., 180°) symmetry. That is, when alignment mark or target 418 is rotated 180° about an axis of symmetry perpendicular to a plane of alignment mark or target 418, rotated alignment mark or target 418 may be substantially identical to an unrotated alignment mark or target 418. The target 418 on substrate 420 may be (a) a resist layer grating comprising bars that are formed of solid resist lines, or (b) a product layer grating, or (c) a composite grating stack in an overlay target structure comprising a resist grating overlaid or interleaved on a product layer grating. The bars may alternatively be etched into the substrate. This pattern is sensitive to chromatic aberrations in the lithographic projection apparatus, particularly the projection system PL, and illumination symmetry and the presence of such aberrations will manifest themselves in a variation in the printed grating. One in-line method used in device manufacturing for measurements of line width, pitch, and critical dimension makes use of a technique known as "scatterometry". Methods of scatterometry are described in Raymond et al., "Multiparameter Grating Metrology Using Optical Scatterometry", J. Vac. Sci. Tech. B, Vol. 15, no. 2, pp. 361-368 (1997) and Niu et al., "Specular Spectroscopic Scatterometry in DUV Lithography", SPIE, Vol. 3677 (1999), which are both incorporated by reference herein in their entireties. In scatterometry, light is reflected by periodic structures in the target, and the resulting reflection spectrum at a given angle is detected. The structure giving rise to the reflection spectrum is reconstructed, e.g. using Rigorous Coupled-Wave Analysis (RCWA) or by comparison to a library of patterns derived by simulation. Accordingly, the scatterometry data of the printed gratings is used to reconstruct the gratings. The parameters of the grating, such as line widths and shapes, may be input to the reconstruction process, performed by processing unit PU, from knowledge of the printing step and/or other scatterometry processes.

In some embodiments, beam splitter 414 may be further configured to receive diffraction radiation beam 419 and split diffraction radiation beam 419 into at least two radiation sub-beams, according to an embodiment. Diffraction radiation beam 419 may be split into diffraction radiation sub-beams 429 and 439, as shown in FIG. 4A.

It should be noted that even though beam splitter 414 is shown to direct radiation sub-beam 415 towards alignment mark or target 418 and to direct diffracted radiation sub-beam 429 towards interferometer 426, the disclosure is not so limiting. It would be apparent to a person skilled in the relevant art that other optical arrangements may be used to obtain the similar result of illuminating alignment mark or target 418 on substrate 420 and detecting an image of alignment mark or target 418.

As illustrated in FIG. 4A, interferometer 426 may be configured to receive radiation sub-beam 417 and diffracted radiation sub-beam 429 through beam splitter 414. In an example embodiment, diffracted radiation sub-beam 429 may be at least a portion of radiation sub-beam 415 that may be reflected from alignment mark or target 418. In an example of this embodiment, interferometer 426 comprises any appropriate set of optical-elements, for example, a combination of prisms that may be configured to form two images of alignment mark or target 418 based on the received diffracted radiation sub-beam 429. It should be appreciated that a good quality image need not be formed, but that the features of alignment mark 418 should be resolved. Interferometer 426 may be further configured to rotate one of the two images with respect to the other of the two images 180° and recombine the rotated and unrotated images interferometrically.

In some embodiments, detector 428 may be configured to receive the recombined image via interferometer signal 427 and detect interference as a result of the recombined image when alignment axis 421 of inspection apparatus 400 passes through a center of symmetry (not shown) of alignment mark or target 418. Such interference may be due to alignment mark or target 418 being 180° symmetrical, and the recombined image interfering constructively or destructively, according to an example embodiment. Based on the detected interference, detector 428 may be further configured to determine a position of the center of symmetry of alignment mark or target 418 and consequently, detect a position of substrate 420. According to an example, alignment axis 421 may be aligned with an optical beam perpendicular to substrate 420 and passing through a center of image rotation interferometer 426. Detector 428 may be further configured to estimate the positions of alignment mark or target 418 by implementing sensor characteristics and interacting with wafer mark process variations.

In a further embodiment, detector 428 determines the position of the center of symmetry of alignment mark or target 418 by performing one or more of the following measurements:

1. measuring position variations for various wavelengths (position shift between colors);
2. measuring position variations for various orders (position shift between diffraction orders); and
3. measuring position variations for various polarizations (position shift between polarizations).

This data may for example be obtained with any type of alignment sensor, for example a SMASH (SMart Alignment Sensor Hybrid) sensor, as described in U.S. Pat. No. 6,961,116 that employs a self-referencing interferometer with a single detector and four different wavelengths, and extracts the alignment signal in software, or Athena (Advanced Technology using High order ENhancement of Alignment), as described in U.S. Pat. No. 6,297,876, which directs each of seven diffraction orders to a dedicated detector, which are both incorporated by reference herein in their entireties.

In some embodiments, beam analyzer 430 may be configured to receive and determine an optical state of diffracted radiation sub-beam 439. The optical state may be a measure of beam wavelength, polarization, or beam profile. Beam analyzer 430 may be further configured to determine a position of stage 422 and correlate the position of stage 422 with the position of the center of symmetry of alignment mark or target 418. As such, the position of alignment mark or target 418 and, consequently, the position of substrate 420 can be accurately known with reference to stage 422. Alternatively, beam analyzer 430 may be configured to determine a position of inspection apparatus 400 or any other reference element such that the center of symmetry of alignment mark or target 418 can be known with reference to inspection apparatus 400 or any other reference element. Beam analyzer 430 may be a point or an imaging polarimeter with some form of wavelength-band selectivity. In some embodiments, beam analyzer 430 may be directly integrated into inspection apparatus 400, or connected via fiber optics of several types: polarization preserving single mode, multimode, or imaging, according to other embodiments.

In some embodiments, beam analyzer 430 may be further configured to determine the overlay data between two patterns on substrate 420. One of these patterns may be a reference pattern on a reference layer. The other pattern may be an exposed pattern on an exposed layer. The reference layer may be an etched layer already present on substrate 420. The reference layer may be generated by a reference pattern exposed on the substrate by lithographic apparatus 100 and/or 100'. The exposed layer may be a resist layer exposed adjacent to the reference layer. The exposed layer may be generated by an exposure pattern exposed on substrate 420 by lithographic apparatus 100 or 100'. The exposed pattern on substrate 420 may correspond to a movement of substrate 420 by stage 422. In some embodiments, the measured overlay data may also indicate an offset between the reference pattern and the exposure pattern. The measured overlay data may be used as calibration data to calibrate the exposure pattern exposed by lithographic apparatus 100 or 100', such that after the calibration, the offset between the exposed layer and the reference layer may be minimized.

In some embodiments, beam analyzer 430 may be further configured to determine a model of the product stack profile of substrate 420, and may be configured to measure overlay, critical dimension, and focus of target 418 in a single measurement. The product stack profile contains information on the stacked product such as alignment mark, target 418, or substrate 420, and may include mark process variation-induced optical signature metrology that is a function of illumination variation. The product stack profile may also include product grating profile, mark stack profile, and mark asymmetry information. An example of beam analyzer 430 may be found in the metrology apparatus known as Yieldstar™, manufactured by ASML, Veldhoven, The Netherlands, as described in U.S. Pat. No. 8,706,442, which is incorporated by reference herein in its entirety. Beam analyzer 430 may be further configured to process information related to a particular property of an exposed pattern in that layer. For example, beam analyzer 430 may process an overlay parameter (an indication of the positioning accuracy of the layer with respect to a previous layer on the substrate or the positioning accuracy of the first layer with respective to marks on the substrate), a focus parameter, and/or a critical dimension parameter (e.g., line width and its variations) of the depicted image in the layer. Other parameters are image parameters relating to the quality of the depicted image of the exposed pattern.

In some embodiments, an array of detectors (not shown) may be connected to beam analyzer 430, and allows the possibility of accurate stack profile detection as discussed below. For example, detector 428 may be an array of detectors. For the detector array, a number of options are possible: a bundle of multimode fibers, discrete pin detectors per channel, or CCD or CMOS (linear) arrays. The use of a bundle of multimode fibers enables any dissipating elements to be remotely located for stability reasons. Discrete PIN detectors offer a large dynamic range but each need separate pre-amps. The number of elements is therefore limited. CCD linear arrays offer many elements that may be read-out at high speed and are especially of interest if phase-stepping detection is used.

Figure 4B:
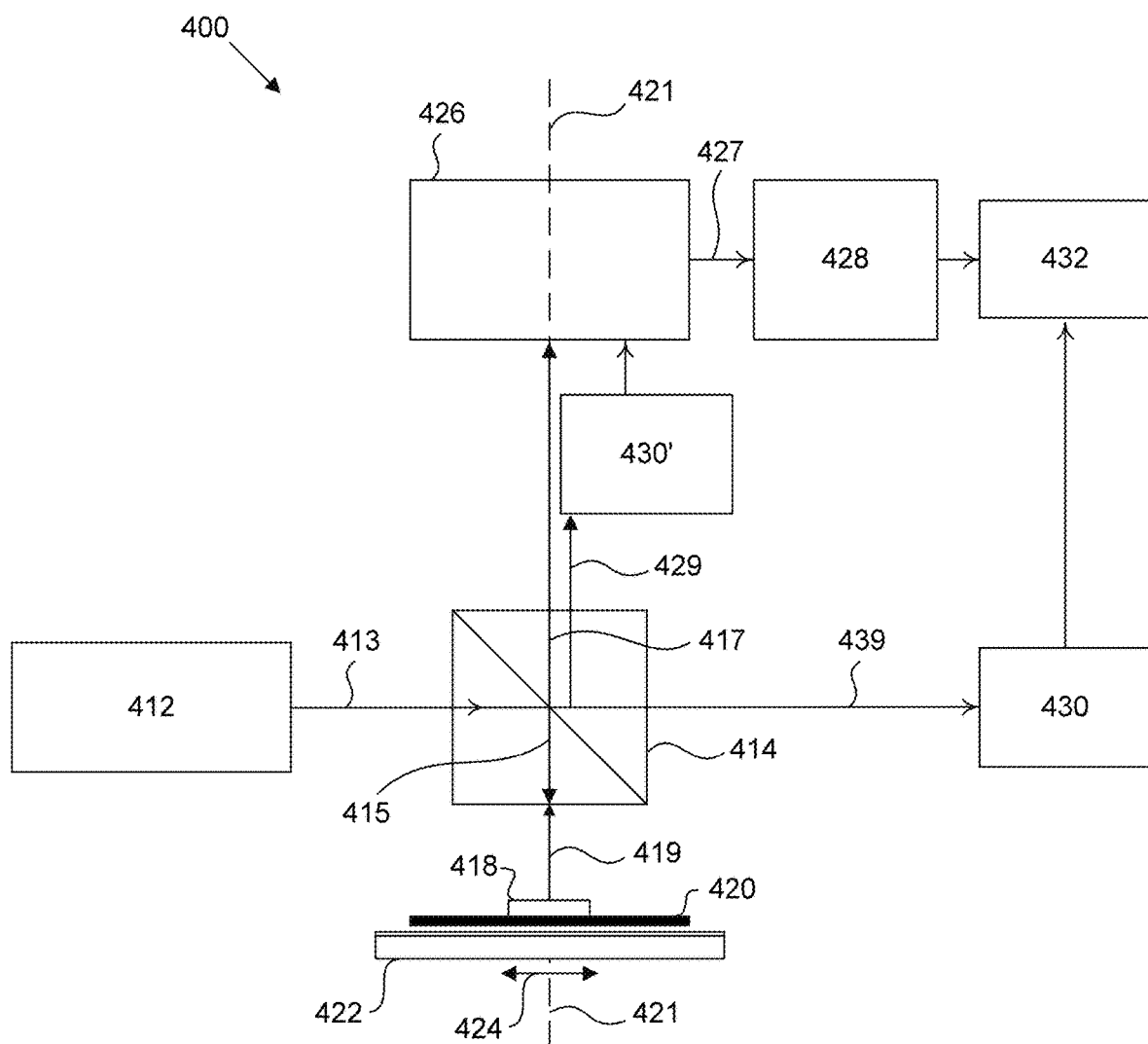

In some embodiments, a second beam analyzer 430' may be configured to receive and determine an optical state of diffracted radiation sub-beam 429, as shown in FIG. 4B. The optical state may be a measure of beam wavelength, polarization, or beam profile. Second beam analyzer 430' may be identical to beam analyzer 430. Alternatively, second beam analyzer 430' may be configured to perform at least all the functions of beam analyzer 430, such as determining a position of stage 422 and correlating the position of stage 422 with the position of the center of symmetry of alignment mark or target 418. As such, the position of alignment mark or target 418 and, consequently, the position of substrate 420, can be accurately known with reference to stage 422. Second beam analyzer 430' may also be configured to determine a position of inspection apparatus 400, or any other reference element, such that the center of symmetry of alignment mark or target 418 may be known with reference to inspection apparatus 400, or any other reference element. Second beam analyzer 430' may be further configured to determine the overlay data between two patterns and a model of the product stack profile of substrate 420. Second beam analyzer 430' may also be configured to measure overlay, critical dimension, and focus of target 418 in a single measurement.

In some embodiments, second beam analyzer 430' may be directly integrated into inspection apparatus 400, or it may be connected via fiber optics of several types: polarization preserving single mode, multimode, or imaging, according to other embodiments. Alternatively, second beam analyzer 430' and beam analyzer 430 may be combined to form a single analyzer (not shown) configured to receive and determine the optical states of both diffracted radiation sub-beams 429 and 439.

In some embodiments, processor 432 receives information from detector 428 and beam analyzer 430. For example, processor 432 may be an overlay calculation processor. The information may comprise a model of the product stack profile constructed by beam analyzer 430. Alternatively, processor 432 may construct a model of the product mark profile using the received information about the product mark. In either case, processor 432 constructs a model of the stacked product and overlay mark profile using or incorporating a model of the product mark profile. The stack model is then used to determine the overlay offset and minimizes the spectral effect on the overlay offset measurement. Processor 432 may create a basic correction algorithm based on the information received from detector 428 and beam analyzer 430, including but not limited to the optical state of the illumination beam, the alignment signals, associated position estimates, and the optical state in the pupil, image, and additional planes. The pupil plane is the plane in which the radial position of radiation defines the angle of incidence and the angular position defines the azimuth angle of the radiation. Processor 432 may utilize the basic correction algorithm to characterize the inspection apparatus 400 with reference to wafer marks and/or alignment marks 418.

In some embodiments, processor 432 may be further configured to determine printed pattern position offset error with respect to the sensor estimate for each mark based on the information received from detector 428 and beam analyzer 430. The information includes but is not limited to the product stack profile, measurements of overlay, critical dimension, and focus of each alignment marks or target 418 on substrate 420. Processor 432 may utilize a clustering algorithm to group the marks into sets of similar constant offset error, and create an alignment error offset correction table based on the information. The clustering algorithm may be based on overlay measurement, the position estimates, and additional optical stack process information associated with each set of offset errors. The overlay is calculated for a number of different marks, for example, overlay targets having a positive and a negative bias around a programmed overlay offset. The target that measures the smallest overlay is taken as reference (as it is measured with the best accuracy). From this measured small overlay, and the known programmed overlay of its corresponding target, the overlay error may be deduced. Table 1 illustrates how this may be performed. The smallest measured overlay in the example shown is −1 nm. However this is in relation to a target with a programmed overlay of −30 nm. Consequently the process must have introduced an overlay error of 29 nm.

TABLE 1

| | | | | | | | |
|---|---|---|---|---|---|---|---|
| Programmed overlay | −70 | −50 | −30 | −10 | 10 | 30 | 50 |
| Measured overlay | −38 | −19 | −1 | 21 | 43 | 66 | 90 |
| Difference between measured and programmed overlay | 32 | 31 | 29 | 31 | 33 | 36 | 40 |
| Overlay error | 3 | 2 | — | 2 | 4 | 7 | 11 |

The smallest value may be taken to be the reference point and, relative to this, the offset may be calculated between measured overlay and that expected due to the programmed overlay. This offset determines the overlay error for each mark or the sets of marks with similar offsets. Therefore, in the Table 1 example, the smallest measured overlay was −1 nm, at the target position with programmed overlay of 30 nm. The difference between the expected and measured overlay at the other targets is compared to this reference. A table such as Table 1 may also be obtained from marks and target 418 under different illumination settings, the illumination setting, which results in the smallest overlay error, and its corresponding calibration factor, may be determined and selected. Following this, processor 432 may group marks into sets of similar overlay error. The criteria for grouping marks may be adjusted based on different process controls, for example, different error tolerances for different processes.

In some embodiments, processor 432 may confirm that all or most members of the group have similar offset errors, and apply an individual offset correction from the clustering algorithm to each mark, based on its additional optical stack metrology. Processor 432 may determine corrections for each mark and feed the corrections back to lithographic apparatus 100 or 100' for correcting errors in the overlay, for example, by feeding corrections into the inspection apparatus 400.

Exemplary Inspection Apparatuses Using Phased Arrays

Until now, the discussion has focused on inspection apparatuses that use optical hardware (e.g., beam splitter 414, interferometer 426) to collect and direct light scattered by the target structure toward a detector. The optical hardware is also often needed for correcting aberrations or otherwise adjusting radiation that has been scattered by a target structure. In some example, size requirements of light-directing optical hardware may mean large sensor footprints, e.g., in the order of approximately 20 mm×20 mm or greater. In these examples, due to large sensor footprints, inspection apparatuses may include only one or a few sensing components for inspecting a wafer, which may impact the ability to inspect large numbers of wafers in a given time frame. The speed of wafer inspection can be increased by, for example, decreasing the time per measurement (e.g., by collecting more photons) and/or increasing the number of independent sensing components (e.g., by reducing the footprint). Embodiments of the present disclosure provide structures and functions to more quickly and efficiently perform inspection of structures on a substrate.

Figure 5:
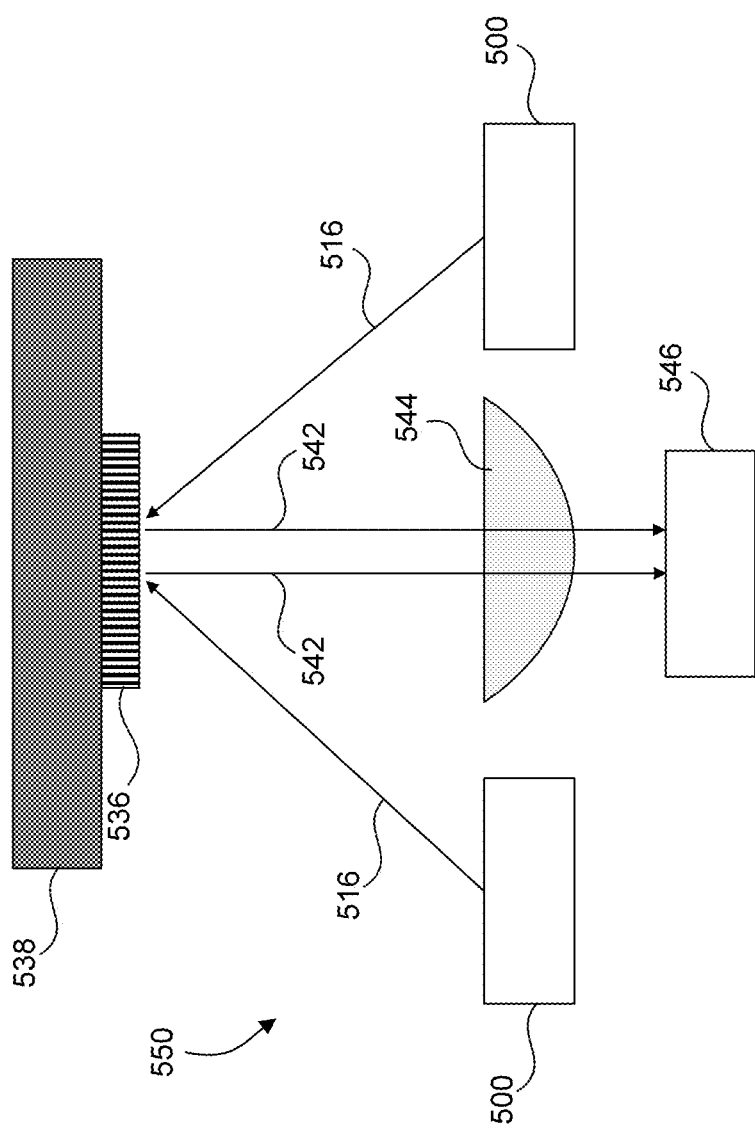
FIG. 5 shows a schematic of an inspection apparatus, according to some embodiments.

FIG. 5 shows a schematic of an inspection apparatus 550, according to some embodiments. In some embodiments, inspection apparatus 550 comprises an illumination system 500 and a detector 546. Inspection apparatus 550 may comprise an optical element 544 and more iterations of illumination system 500. Optical element 544 may comprise a lens or a system of lens elements. Inspection apparatus 550 may comprise a photonic integrated circuit (PIC) on which illumination system 500 is disposed. Optical element 544 and/or detector 546 may also be disposed on the PIC.

In some embodiments, illumination system 500 is configured to generate a beam of radiation 516. Illumination system 500 may adjust the direction beam of radiation 516. It should be appreciated that directions of beam of radiation 516 depicted in FIG. 5 are not limiting. For example, directions of beam of radiation 516 may be adjusted into or out of the page. Illumination system 500 may comprise one or more phased arrays. The phased arrays allow adjusting the direction of beam of radiation 516.

In some embodiments, a measurement comprises directing beam of radiation 516 toward a target structure 536. Target structure 536 is disposed on a substrate 538. Target structure 536 scatters (e.g., diffracts) radiation to generate scattered radiation 542. The measurement further comprises receiving scattered radiation 542 at detector 546. Optical element 544 may be used to focus scattered radiation 542 onto detector 546.

In some embodiments, inspection apparatus 550 may be implemented as part of lithographic apparatus 100 or 100' (FIGS. 1A and 1B). Inspection apparatus 550 may be implemented as an alignment apparatus for aligning a substrate with respect to a reticle.

In some embodiments, inspection apparatus 550 is configured to measure a result of a lithographic process (e.g., overlay error) performed on a substrate. Measuring the result of the lithographic process may be performed outside of a lithographic apparatus (e.g., in a detached metrology apparatus or dedicated overlay inspection tool).

Figure 6:
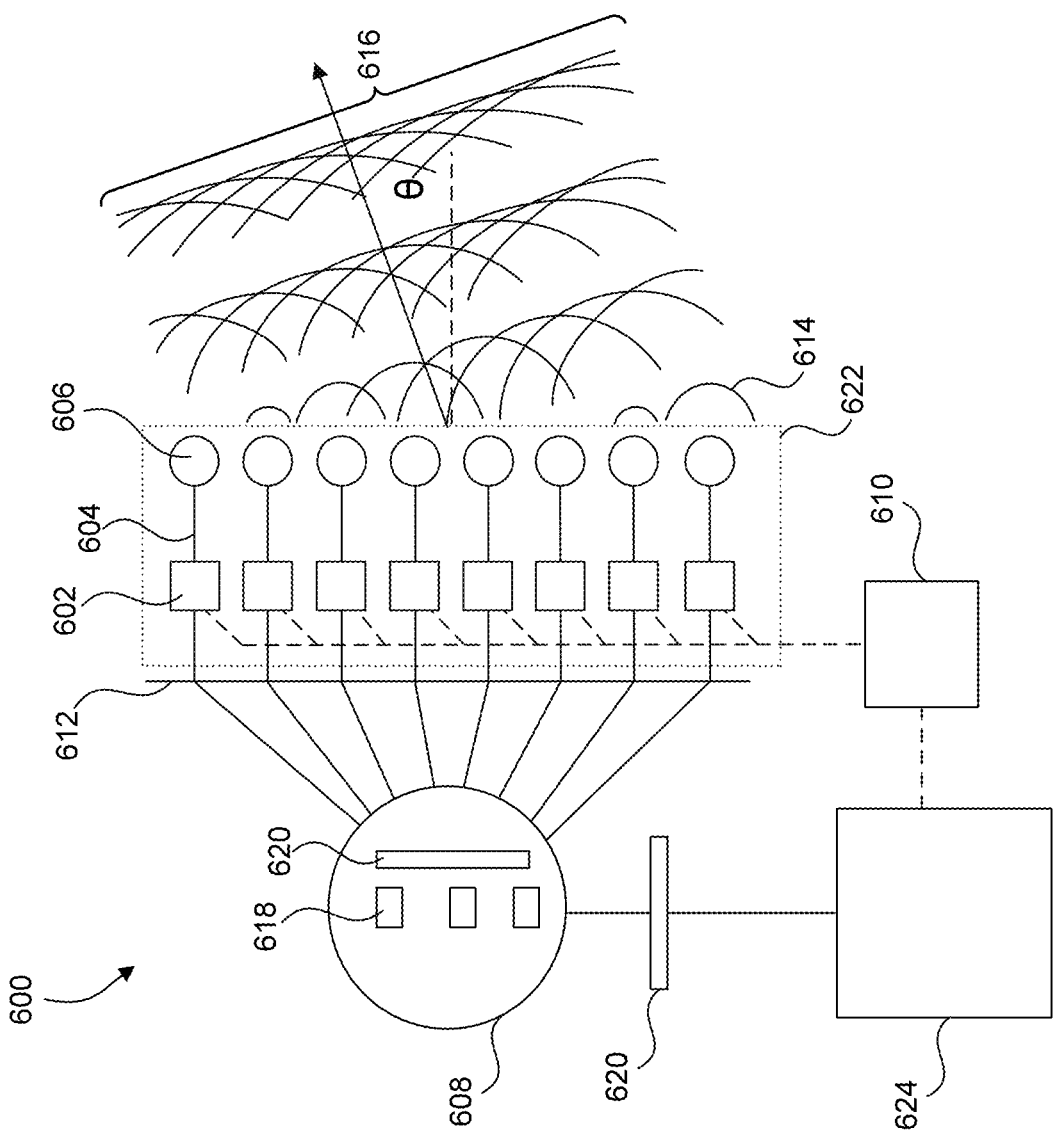
FIGS. 6 and 7 show schematics of illumination systems, according to some embodiments.

FIG. 6 shows a schematic of an illumination system 600, according to some embodiments. In some embodiments, illumination system 600 may be implemented as part of an inspection apparatus, e.g., as illumination system 500 in inspection apparatus 550 (FIG. 5).

In some embodiments, illumination system 600 comprises phase modulators 602, waveguides 604, and optical elements 606. Illumination system 600 further comprises a radiation source 608 and/or a controller 610. Phase modulators 602 may comprise electro-optic modulators, thermo-optic modulators, and the like.

In some embodiments, phase modulators 602 are disposed along waveguides 604 (e.g., intersecting or adjacent to waveguides). In some embodiments, optical elements 606 are disposed downstream of phase modulators 602 along waveguides 604. In some embodiments the number of phase modulators 602, waveguides 604, and optical elements 606 are equal (e.g., there is a one-to-one-to-one correspondence in a set of a phase modulator, waveguide, and optical element). In some embodiments, phase modulators 602, waveguides 604, and optical elements 606 are arranged as a so-called phased array (e.g., an array of radiation elements for generating radiation having given phases).

In some embodiments, waveguides 604 are configured to guide radiation. The radiation may be supplied by radiation source 608 and received at inputs of the phased array. Merely as an example, line 612 indicates the inputs. Waveguides 604 may be configured to guide radiation (e.g., from radiation source 608) to optical elements 606. Optical elements 606 may be configured to radiate radiation waves 614 (e.g., by outcoupling the radiation from waveguides 604). Optical elements 606 may be referred to herein as "emitters," "emission elements," and the like, referencing their function of emitting radiation. Phase modulators 602 are configured to adjust phases of radiation waves 614.

In some embodiments, the phases of radiation waves 614 are adjusted such that radiation waves 614 accumulate to form a beam of radiation 616. The direction of beam 616 is based on the phases of radiation waves 614. The phased array of illumination system 600 may generate of radiation 616 and to direct beam of radiation 616 (e.g., toward a target structure). Phase modulation may comprise adjusting phase delays of radiation waves 614. Phase modulation may comprise staggering phase delays of radiation waves 614. In FIG. 6, the direction angle θ of beam of radiation 616 is provided as an example and is not limiting. It should also be appreciated that illumination system 600 may comprise a 2-dimensional phased array. A 2-dimensional arrangement allows adjusting the direction of beam of radiation 616 in two dimensions (e.g., out of the page; FIG. 6 shows a 1-dimensional array for simplicity).

In some embodiments, illumination system 600 comprises a PIC. In other words, illumination system 600 and components therein (e.g., radiation sources, phase modulators, etc.) may be part of a PIC. The PIC allows illumination system 600 to be built extremely small (e.g., sub-millimeter). In some embodiments, illumination system 600 may reduce the number of optical components in a metrology tool. For example, it is possible to reduce or eliminate the need for optical hardware traditionally used to direct light (e.g., lens, mirror, beam splitter, micro-electro-mechanical system (MEMS), and the like). Illumination system 600 may adjust the direction beam of radiation 616 without using optical hardware or moving elements (e.g., mechanical elements). Consequently, a metrology system (e.g., an alignment sensor) may be substantially miniaturized compared to traditional metrology systems that rely on bulky optical hardware.

In some embodiments, controller 610 is configured to control phase modulators 602 to control the direction of beam of radiation 616. It should be appreciated that controller 610 may be external to illumination system 600.

In some embodiments, radiation source 608 is configured to generate broadband wavelengths or two or more narrowband wavelengths. In some embodiments, radiation source 608 comprises two or more source elements 618. Each source element of source elements 618 is configured to generate a subset of the broadband wavelengths and/or the two or more narrowband wavelengths. The radiation generated by radiation source 608 may be coherent radiation. When generating multiple wavelengths with a single source element, each wavelength component may be coherent. Multi-wavelength coherent radiation sources are commercially available. Source elements 618 may be, e.g., laser diodes.

For ease of discussion, a first phased array 622 is designated by a dotted outline. In some embodiments, illumination system 600 comprises a second phased array 624. For simplicity, phased array has been drawn with simplified inputs from source radiation source 608 and controller 610. However, it should be appreciated that elements and arrangements within second phased array 624 are substantially similar (e.g., symmetrized) to first phased array 622. In some embodiments, illumination system comprises more phased arrays.

In some embodiments, one or more spectral filters 620 may be used to select one or more wavelengths from radiation source 608 to enter first and second phased arrays 622 and 624. For example, first and second spectral filters may be used to select respective first and second wavelengths from radiation source 608. A first wavelength may enter first phased array 622 and the second wavelength may enter a second phased array 624. First phased array 624 may generate beam of radiation 616 having the first wavelength and phased array 622 may be used to generate another beam of radiation having the second wavelength. The first and second wavelengths may be substantially different or similar. A direction of the beam from phased array at 622 may be adjusted independently from beam of radiation 616 (e.g., toward a target structure). In some embodiments, beams from first phased array 622 and second phased array 624 have substantially similar wavelengths.

Figure 7:
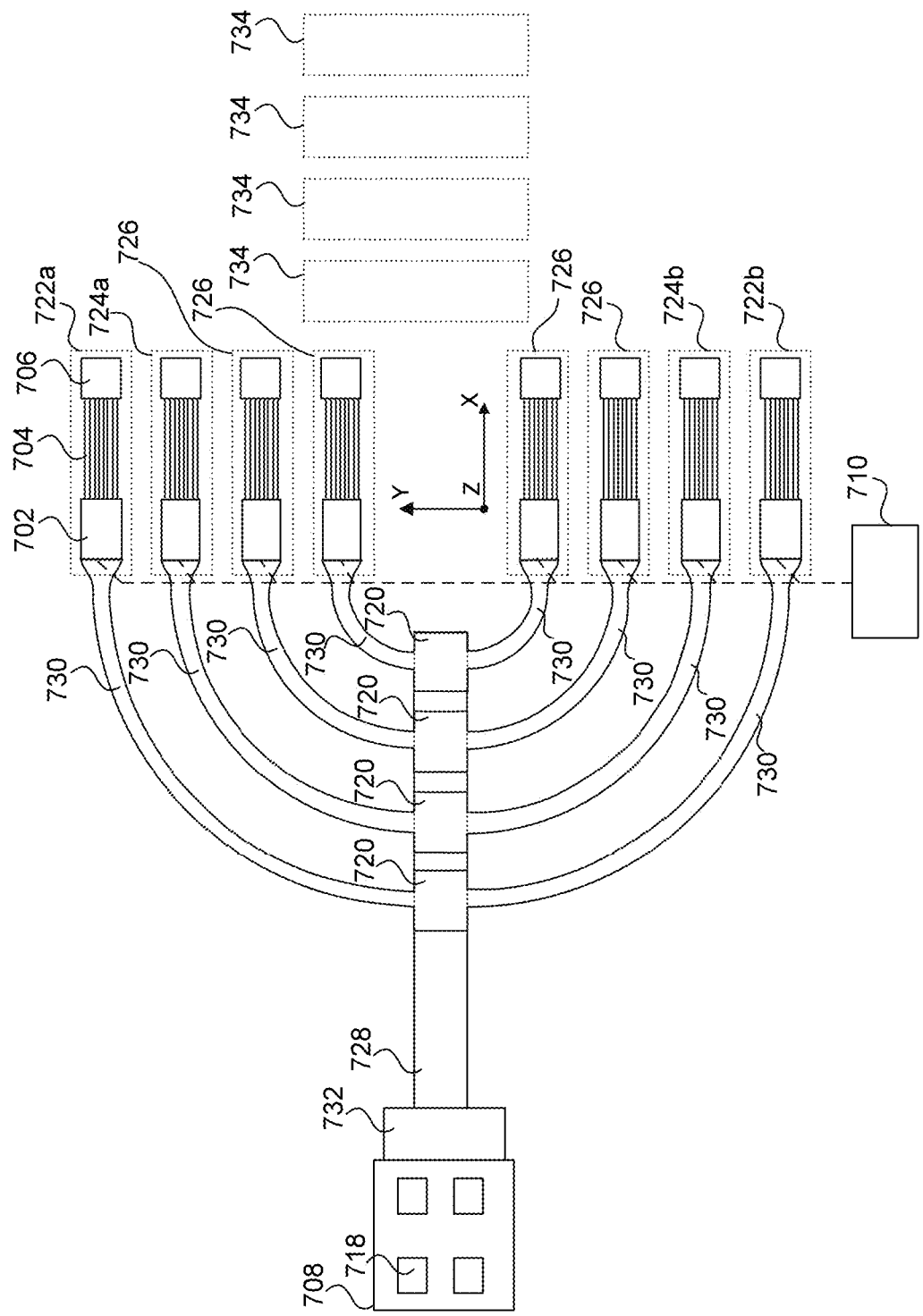

FIG. 7 shows a schematic of an illumination system 700, according to some embodiments. Particularly, FIG. 7 shows a non-limiting example of an arrangement of phased arrays (e.g., illumination system 600 of FIG. 6 may be so altered). Therefore, elements of FIG. 7 may be considered to have similar structures and functions as similarly numbered elements in FIG. 6 (e.g., elements sharing the two right-most numeric digits).

In some embodiments, illumination system 700 comprises phased arrays 722a, 722b, 724a, and 724b. Illumination system 700 may further comprise one or more additional phased arrays 726.

In some embodiment, phased array 722a comprises phase modulators 702, waveguides 704, and optical elements 706 (substantially similar to phase modulators 602, waveguides 604, and optical elements 606 in FIG. 6). In some embodiments, phased arrays 722b, 724a, 724b, and one or more additional phased arrays 726 comprise structures and functions that may be substantially similar to those of phased array 722a. Illumination system 700 may further comprise optical filters 720, a major waveguide 728, waveguides 730, a radiation source 708, a controller 710, and/or a multiplexer 732. In some embodiments, illumination system 700 comprises a PIC. Furthermore, any phased arrays may be omitted, for example, to simplify PIC designs by having single phased array(s) instead of phased array pairs.

In some embodiments, radiation source 708 is configured to generate radiation. Radiation generated by radiation source 708 may have one wavelength, multiple wavelengths, or a continuum of wavelengths. In some embodiments, radiation source 708 comprises two or more source elements 718. Each source element 718 is configured to generate a subset of the broadband wavelengths and/or the two or more narrowband wavelengths. Major waveguide 728 may be a multi-mode waveguide for allowing multiple wavelengths. In embodiments in which two or more wavelengths are generated by distinct source elements, multiplexer 732 may be used to combine radiation of different wavelengths into a single channel (e.g., major waveguide 728).

In some embodiments, radiation generated by radiation source 708 may be received at inputs of phased arrays 722a, 722b, 724a, 724b, and/or one or more additional phased arrays 726. Major waveguide 728 and waveguides 730 may be used to guide the radiation from radiation source 708 to phased arrays 722a, 722b, 724a, 724b, and/or one or more additional phased arrays 726. For example, major waveguide 728 guides radiation from radiation source 708 to a first optical filter of optical filters 720. In some embodiments, the first optical filter of optical filters 720 selects a first wavelength to send to phased arrays 722a and 722b via corresponding waveguides of waveguides 730. Thus optical filters 720 may perform demultiplexing. It should be appreciated that other demultiplexing solutions may be envisioned. For example, optical filters 720 may be replaced with a single demultiplexer for selecting and sending given wavelengths to waveguides 730 and the phased arrays.

A depiction of a single major waveguide 728 should not be construed as limiting (current depiction is merely for simplification of the drawing). It should be appreciated that alternative arrangements can be envisioned for major waveguide 728, radiation source 708, and/or waveguides 730. For example, in some embodiments, illumination system 700 may comprise a major waveguide per pair of phased arrays. In some embodiments, illumination system 700 may omit major waveguide 728 and directly couple waveguides 730 to corresponding source elements 718 (correspondence may be based on desired wavelength for each phased array). In this scenario, optical filters 720 may be omitted since waveguides 730 would be configured to directly receive a single narrowband wavelength from corresponding source elements 718.

It was mentioned that in some embodiments illumination system 600 (FIG. 6) could be used to generate beams of radiation, each beam having a distinct wavelength. Similarly, in some embodiments, phased arrays 722a and/or 722b are configured to generate a beam of radiation having a first wavelength. And phased arrays 724a and/or 724b are configured to generate another beam of radiation having a second wavelength. Corresponding optical filters of optical filters 720 may be used to select the first and second wavelengths. Similarly, one or more additional phased arrays 726 may be used to generate other wavelengths. In some embodiments, illumination system 700 may generate beams of a number of wavelengths A from the phased arrays (e.g., $\lambda_1, \lambda_2, \ldots \lambda_N$).

Therefore, in some embodiments illumination system 700 is capable of generating one or more beams of radiation, some beams having distinct wavelengths and/or some having substantially similar wavelengths. Similar to discussions in reference to FIG. 6, the phased arrays of illumination system 700 allow adjusting directions of the beams. For example, controller 710 is configured to control phase modulators (e.g., phase modulators 702) to control the directions of the beams generated by each phased array. It should be appreciated that controller 710 may be external to illumination system 700.

A polarization state of the beams generated phased arrays may be determined by the orientation of the phased arrays. Therefore, it may be advantageous to introduce a set of phased arrays rotated by 90 degrees. In some embodiments, illumination system 700 may comprise a set of phased arrays 734 that are substantially similar to phased arrays 722a, 722b, 724a, 724b, and one or more additional phased arrays 726. The line of phased arrays 734 may be rotated by 90 degrees with respect to phased arrays 722a, 722b, 724a, 724b, and one or more additional phased arrays 726 (shown by the dotted outlines of phased arrays 734). For simplicity, only half of phased arrays 734 are shown as the other half would be disposed approximately at the locations of optical filters 720. It should be appreciated that all of the phased arrays in illumination system 700 may be disposed on a single PIC substrate (e.g., multi-layered and/or rerouting waveguides) or may be distributed over two or more PICs in order to allow accommodation of all of the phased arrays in illumination system 700.

Figure 8:
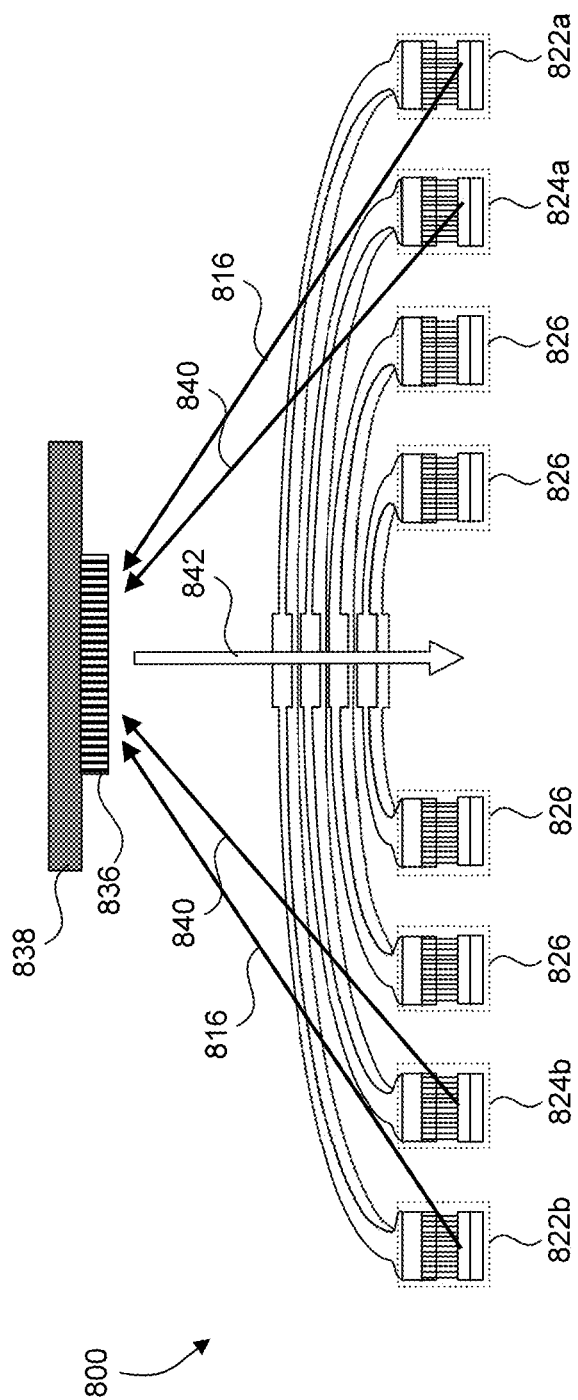
FIG. 8 shows a perspective view of an illumination system, according to some embodiments.

FIG. 8 shows a perspective view of an illumination system 800, according to some embodiments. Elements of FIG. 8 may have similar structures and functions as similarly numbered elements in FIGS. 6 and 7 (e.g., elements sharing the two right-most numeric digits). It should be appreciated that certain structures have been omitted from FIG. 8 in order to enhance clarity (e.g., an analog to radiation source 708 of FIG. 7). Therefore, unless otherwise specified, it should be appreciated that embodiments referencing FIG. 8 may also comprise elements analogous to those shown in FIGS. 6 and 7.

In some embodiments, illumination system 800 comprises phased arrays 822a, 822b, 824a, and 824b. Illumination system 800 may further comprise one or more additional phased arrays 826. Phased arrays 822a, 822b, 824a, 824b, and one or more additional phased arrays 826, may comprise structures and functions that may be substantially similar to those of, e.g., phased array 622 (FIG. 6).

In some embodiments, phased arrays 822a and 822b are configured to generate beams of radiation 816. Beams of radiation 816 may have a first wavelength. Beams of radiation 816 may be directed at a target structure 836. Target structure 836 is disposed on a substrate 838. Phased arrays 824a and 824b are configured to generate beams of radiation 840. Beams of radiation 840 may be directed at a target structure 836. Beams of radiation 840 may have a second wavelength. The first and second wavelengths are generated as described in reference to FIG. 7. In some embodiments, illumination system 800 may generate beams of a number of wavelengths λ from the phased arrays (e.g., $\lambda_1, \lambda_2 \ldots \lambda_N$).

In some embodiments, phased arrays 822a, 822b, 824a, 822b, and one or more additional phased arrays 826, are configured to direct and steer the beams they generate. For example, beams of radiation 816 may be adjusted to illuminate a location on target structure 836 (e.g., beam spots overlap). In some embodiments, target structure 836 scatters (e.g., diffracts) beams of radiation 816 and 840, shown as scattered radiation 842. Beams of radiation 840 may also be adjusted to illuminate the same, or substantially similar, location as illuminated by beams of radiation 816. In some embodiments, steering the beams allows the angle of incidence of the beams on target structure 836 to be adjusted. To change the angle of incidence, substrate 838 may be moved in the Z-direction (toward or away from illumination system 800) and beams of radiation 816 and/or 840 are steered to illuminate target structure 836 at a different angle of incidence. Thus, it is possible to adjust the angle of incidence through a continuum of off-axis angles (e.g., angles of incidence different from zero). An advantage is that a direction of scattered radiation 842 may be adjusted.

Figure 9:
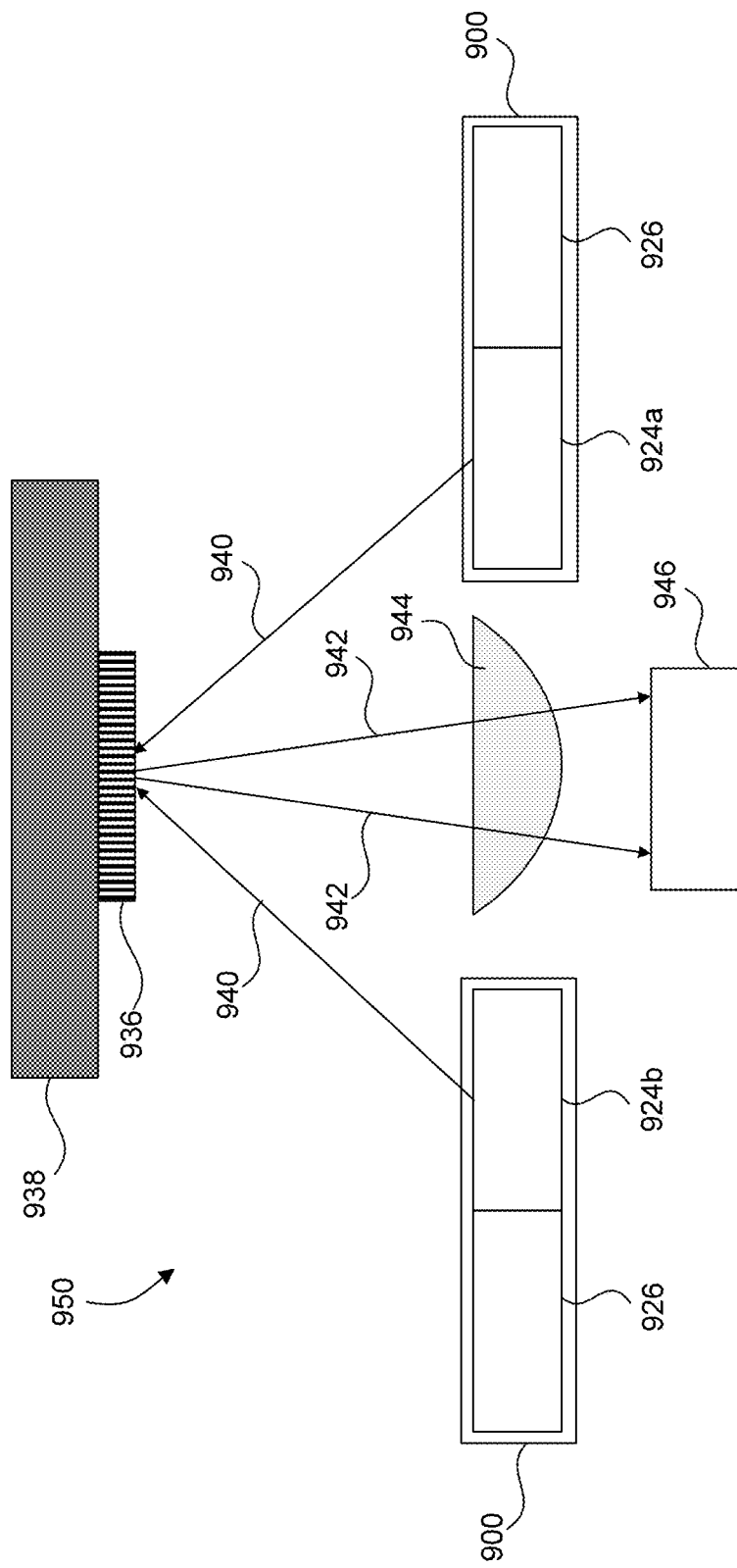
FIG. 9-11 show schematics of metrology systems, according to some embodiments.

FIG. 9 shows a schematic of a metrology system 950, according to some embodiments. Elements of FIG. 9 may have similar structures and functions as similarly numbered elements in FIGS. 5-8 (e.g., elements sharing the two right-most numeric digits). It should be appreciated that certain structures have been omitted from FIG. 9 in order to enhance clarity. Therefore, unless otherwise specified, it should be appreciated that embodiments referencing FIG. 9 may also comprise elements analogous to those shown in, e.g., FIGS. 6-8.

In some embodiments, metrology system 950 comprises an illumination system 900, an optical element 944, and a detector 946. Illumination system 900 comprises phased arrays 924a, 924b, and one or more additional phased arrays 926. Phased arrays 924a, 924b, and/or one or more additional phased arrays 926 comprise structures and functions that may be substantially similar to those of, e.g., phased array 622 (FIG. 6). Optical element 944 may comprise a lens or a system of lens elements.

In some embodiments, phased arrays 924a and 924b are configured to generate beams of radiation 940. Beams of radiation 940 may be directed at a target structure 936. Target structure 836 is disposed on a substrate 938. In some embodiments, illumination system 900 may generate beams of a number of wavelengths λ from the phased arrays (e.g., $\lambda_1, \lambda_2 \ldots \lambda_N$) as described in reference to, e.g., FIGS. 6, 7, and 8.

In some embodiments, phased arrays 924a, 924b, and one or more additional phased arrays 926 are configured to direct and steer the beams they generate. For example, beams of radiation 940 may be adjusted to illuminate a location on target structure 936. Target structure 936 scatters beams of radiation 940, shown as scattered radiation 942. Scattered radiation 942 may be incident on detector 946. That is, detector 946 may receive scattered radiation 942. Detector 946 may generate a measurement signal based on the receipt of scattered radiation 942. In one embodiment, to enhance the optical signal or image, optical element 944 may focus scattered radiation 942 onto detector 946.

Figure 10:
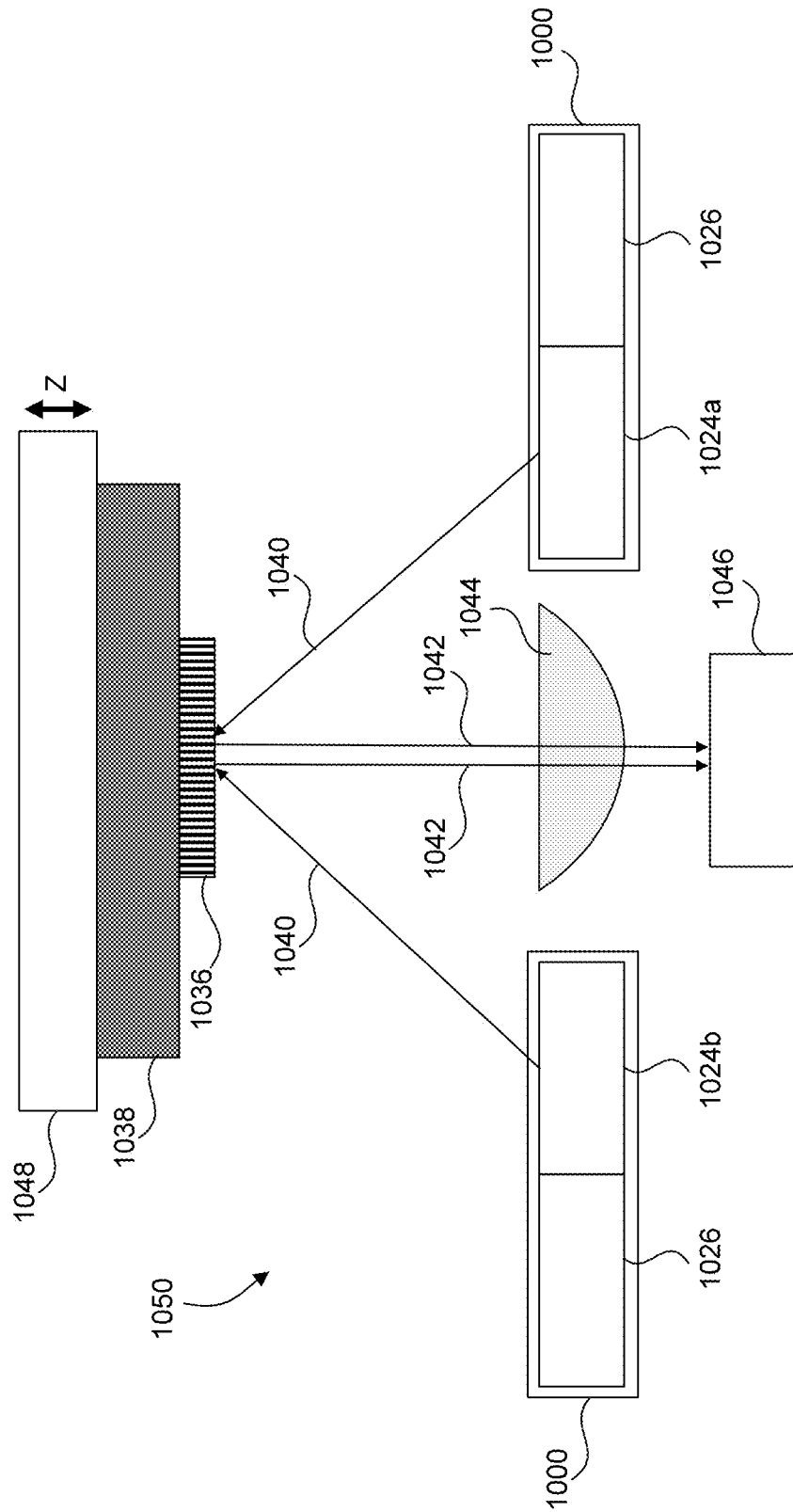

FIG. 10 shows a schematic of a metrology system 1050, according to some embodiments. Earlier it was mentioned that a direction of radiation scattered by a target may be adjusted. Controlling the direction of scattered radiation is shown by example in FIG. 10. Elements of FIG. 10 may have similar structures and functions as similarly numbered elements in FIGS. 5-9 (e.g., elements sharing the two right-most numeric digits). It should be appreciated that certain structures have been omitted from FIG. 10 in order to enhance clarity. Therefore, unless otherwise specified, it should be appreciated that embodiments referencing FIG. 10 may also comprise elements analogous to those shown in, e.g., FIGS. 6-9.

In some embodiments, metrology system 1050 comprises an illumination system 1000, an optical element 1044, and a detector 1046. Illumination system 1000 comprises phased arrays 1024a, 1024b, and one or more additional phased arrays 1026. Phased arrays 1024a, 1024b, and/or one or more additional phased arrays 1026 comprise structures and functions that may be substantially similar to those of, e.g., phased array 622 (FIG. 6).

In some embodiments, phased arrays 1024a and 1024b are configured to generate beams of radiation 1040. Beams of radiation 1040 may be directed at a target structure 1036. Target structure 1036 may be disposed on a substrate 1038. Substrate 1038 may be disposed on a substrate table 1048. Substrate table 1048 may be configured to move in any of axes X, Y, and Z, where the Z-axis is defined in FIG. 10 as being perpendicular to the surface of substrate 1038. Coordinate axes are provided for clarity of description and are not limiting. In some embodiments, illumination system 1000 may generate beams of a number of wavelengths λ from the phased arrays (e.g., $\lambda_1, \lambda_2 \ldots \lambda_N$) as described in reference to, e.g., FIGS. 6, 7, and 8.

In some embodiments, phased arrays 1024a, 1024b, and one or more additional phased arrays 1026 are configured to direct and steer the beams they generate. For example, beams of radiation 1040 may be adjusted to illuminate a location on target structure 1036. Target structure 1036 scatters beams of radiation 1040, shown as scattered radiation 1042.

In some embodiments, the structures, functions, and interactions of optical element 1044, detector 1046 and scattered radiation 1042 may be as described previously for optical element 944, detector 946, and scattered radiation 942 of FIG. 9.

Earlier it was mentioned that embodiments perform, among others things, adjusting directions of both radiation incident on a target and radiation scattered by the target. FIG. 10 illustrates how it may be accomplished. Directions of beams of radiation 1040 may be adjusted by phased arrays 1024a and 1024b (shown via respective angles $\theta_a$ and $\theta_b$, which may or may not be equal). Depending on parameters (e.g., Z distance, geometry of target), scattered radiation 1042 may or may not be directed at detector 1046 (see scattered radiation 942 in FIG. 9). This may be remedied by moving substrate table 1048 (e.g., in the Z direction) so that scattered radiation 1042 (being a diffraction order) is directed substantially perpendicular to the surface of substrate 1038. Consequently, the asphericity requirements of optical element 1044 may be relaxed (e.g., can use lenses with low numerical aperture (NA)) and the overall X-Y footprint of the lens/detector stack can be reduced. In contrast, traditional optical measurements collect radiation over a large range of scattering angles, often requiring collection optics having high NA.

Metrology systems employing optical hardware tend to have large X-Y footprints. For example, it may be difficult to engineer metrology system 400, with all its optical hardware, to fit in a footprint less than 400 mm$^2$ (e.g., 20 mm×20 mm). Since the illumination systems having phased arrays can also be miniaturized via PICs, it is possible to reduce their footprint. The term "footprint" may be used herein to refer to a cross section of a metrology system that is substantially perpendicular to the scattered radiation it receives from a target. For example, the Z-axis in FIG. 10 is perpendicular to the footprint of metrology system 1050.

In some embodiments, a PIC-based metrology system (e.g., having at least a light source and a detector) may comprise a footprint having an area less than approximately 100 mm$^2$, 50 mm$^2$, 25 mm$^2$, or 16 mm$^2$. The PIC-based metrology system may comprise a footprint having a width less than approximately 10 mm, 7 mm, 5 mm, or 4 mm. By transitive property, these dimensions also apply to footprints of individual elements within the PIC-based metrology system.

Figure 11:
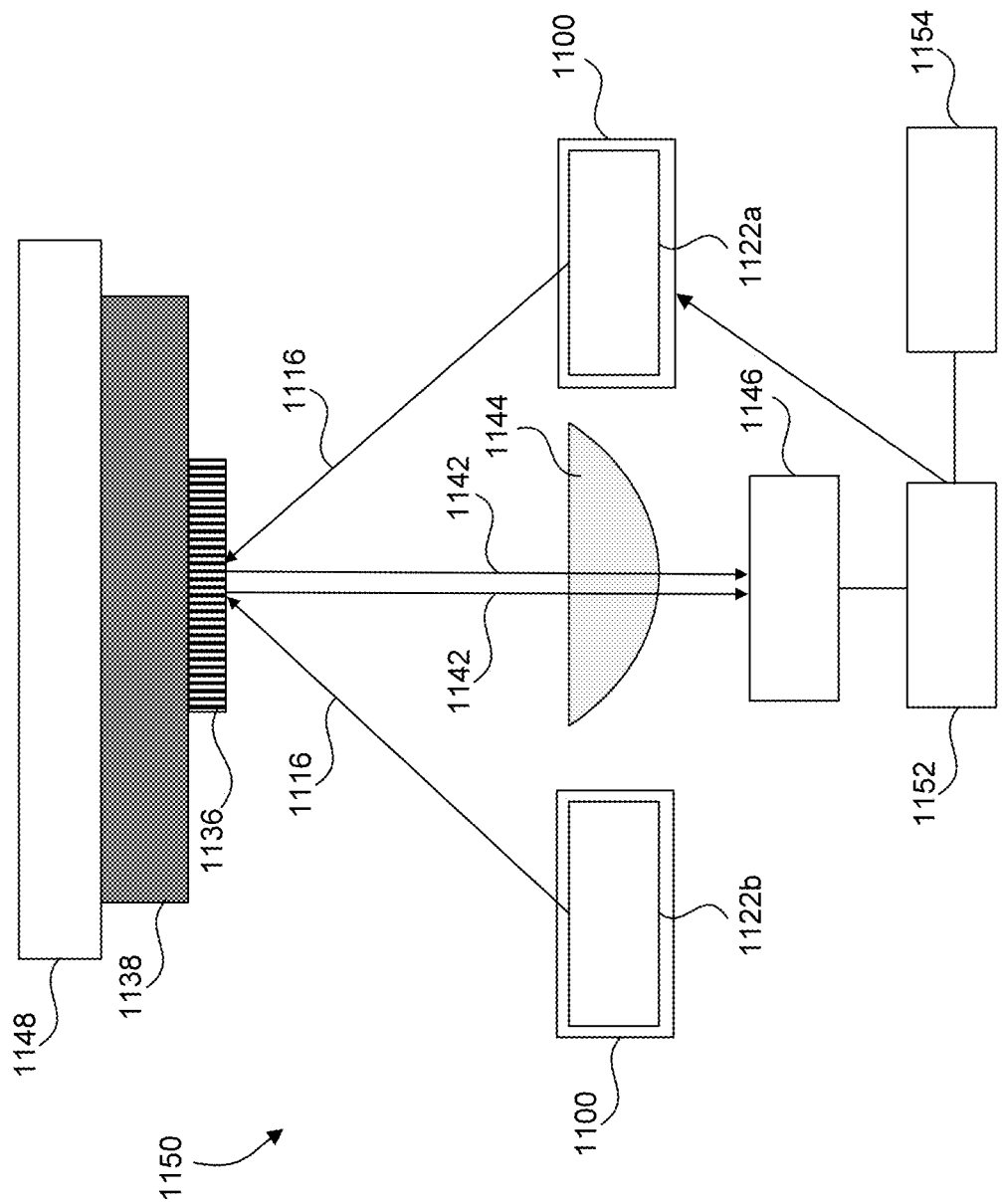

FIG. 11 shows a schematic of a metrology system 1150, according to some embodiments. Embodiments referring to FIG. 11 show, for example, how fewer phased arrays may be employed to further reduce a footprint of a metrology system. Elements of FIG. 11 may have similar structures and functions as similarly numbered elements in FIGS. 5-10 (e.g., elements sharing the two right-most numeric digits). It should be appreciated that certain structures have been omitted from FIG. 10 in order to enhance clarity. Therefore, unless otherwise specified, it should be appreciated that embodiments referencing FIG. 11 may also comprise elements analogous to those shown in, e.g., FIGS. 6-10.

In some embodiments, metrology system 1150 comprises an illumination system 1100, an optical element 1144, and a detector 1146. Metrology system 1150 further comprises a time multiplexer 1152 and a phase shifter 1154. Illumination system 1100 comprises phased arrays 1122a and 1122b. Time multiplexer 1152 and phase shifter 1154 may be comprised within illumination system 1100 as they are components related to beam generation. For example, time multiplexer 1152 and phase shifter 1154 may be disposed on a PIC substrate of metrology system 1150. Phased arrays 1122a and 1122b comprise structures and functions that may be substantially similar to those of, e.g., phased array 622 (FIG. 6).

In some embodiments, phased arrays 1122a and 1122b are configured to generate beams of radiation 1116. Beams of radiation 1116 may be directed at a target structure 1136. Target structure 1136 is disposed on a substrate 1138. Substrate 1138 may be disposed on a substrate table 1148. In some embodiments, phased arrays 1122a and 1122b are configured to direct and steer the beams they generate. For example, beams of radiation 1116 may be adjusted to illuminate a location on target structure 1136. Target structure 1136 scatters beams of radiation 1116, shown as scattered radiation 1142.

In some embodiments, the structures, functions, and interactions of optical element 1144, detector 1146 and scattered radiation 1142 may be as described previously for optical element 944, detector 946, and scattered radiation 942 of FIG. 9.

In some embodiments, illumination system 1100 may generate beams of a number of wavelengths λ from the phased arrays (e.g., $\lambda_1, \lambda_2 \ldots \lambda_N$) as described in reference to, e.g., FIGS. 6, 7, and 8. However, in some embodiments, time multiplexer 1152 and phase shifter 1154 may be used to modify the wavelength generation as described in reference to FIGS. 6, 7, and 8, for example, by allowing phased arrays 1122a and 1122b to output radiation having a wavelength that is selectable from a plurality of wavelengths. That is, phased arrays are not dedicated to a particular wavelength. In contrast, FIG. 7 showed the use of optical filters 720, which would potentially commit a phased array to a particular wavelength if the optical filters are not adjustable.

In some embodiments, multi-wavelength radiation may be passed through time multiplexer 1152. Time multiplexer 1152 is configured to allow through one wavelength at any given time. The multi-wavelength radiation may be generated by a radiation source as described in reference to FIG. 6 (e.g., radiation source 608). The radiation source may be disposed within illumination system 1100. The radiation passed through time multiplexer 1152 may then be passed through phase shifter 1154. The function of phase shifter 1154 is to adjust phases to account for certain changes in beams of radiation 1116 arising from changing their wavelength. In one example, the directions $\theta_a$ and $\theta_b$ of beams of radiation 1116 are sensitive to the wavelength of the radiation. Switching the wavelength (e.g., using a multiplexer) can appreciably shift the beam directions even when other parameters of beam generation are kept the same. Therefore, phase shifter 1154 may further adjust the phases of the radiation in illumination system 1100 (in addition to phase modulators) to account for the changes introduced by going from one wavelength to another, so as to preserve a directional response of beams of radiation 1116. Phase shifter 1154 may be in communication with detector 1146. The phase adjustments made by phase shifter 1154 may be based on the measurement signal generated by detector 1146.

An advantage of using time multiplexer 1152 and/or phase shifter 1154 is that they can be implemented via integrated optics, allowing for size reduction of metrology system 1150 and relying on fewer or no moving parts.

Regarding phased arrays, they are also advantageous because they allow manipulation of more than just a beam direction. For example, the intensity distribution of a beam spot may be adjusted, which as advantageous for metrology systems. For example, an optical measurement can be made more accurately if the beam spot fills only the intended target and avoids illuminating structures outside of the target. FIGS. 12-15 will further illustrate an example of beam spot control.

Figure 12:
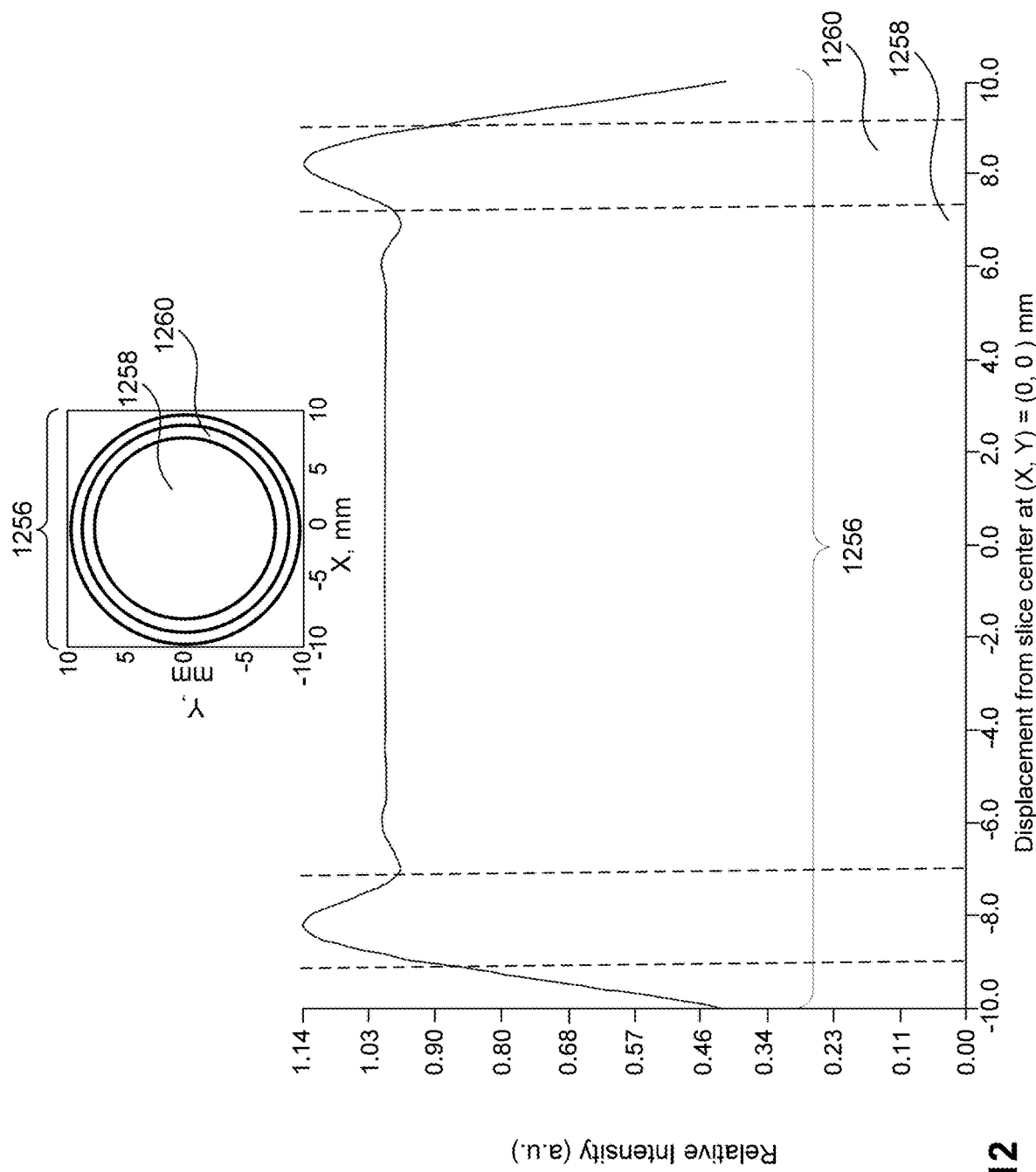
FIG. 12 shows a graph of an intensity profile of a beam of radiation, according to some embodiment.

FIG. 12 shows a graph 1255 of a "top-hat" intensity profile 1256 (or top-hat profile or beam cross section) of a beam of radiation, according to some embodiment. Top-hat intensity profile 1256 departs from a traditional Gaussian intensity distribution of typical coherent beams (e.g., a laser). The vertical axis of graph 1255 represents a relative intensity of a beam of radiation, given in arbitrary units (a. u.). The horizontal axis of graph 1255 represents a distance or displacement, along the X-axis, from the center of the beam at a slice corresponding to Y=0 (beam center is positioned at (X,Y)=(0,0)). Units of mm are provided on the horizontal axis as example only, and should not be construed as limiting. Top-hat intensity profile 1256 was generated by numerical simulation, to be further clarified in reference to FIG. 13. Inset 1257 is a two-dimensional intensity map representation of the data in graph 1255.

In some embodiments, top-hat intensity profile 1256 comprises a constant intensity region 1258 and an outer region 1260. Constant intensity region 1258 has substantially constant or flat illumination intensity, e.g., over most of the cross section of the beam of radiation. Outer region 1260 shows a small crest of the intensity, which is a residual from the numerical simulation. In some embodiments, the crest in outer region 1260 may be reduced to the same magnitude as constant intensity region 1258, whether in simulation or in actual beam generation. Therefore, in some embodiments, outer region 1260 may be absent and the intensity drops off immediately at the edge of constant intensity region 1258.

Top-hat intensity profile 1256 is a trait of a beam spot that may allow for a more uniform illumination of a target structure, while preventing or reducing illumination of features outside of the target structure. Illuminating features outside of the target structure may lead to undesirable scattered radiation being detected (cross-talk).

Figure 13:
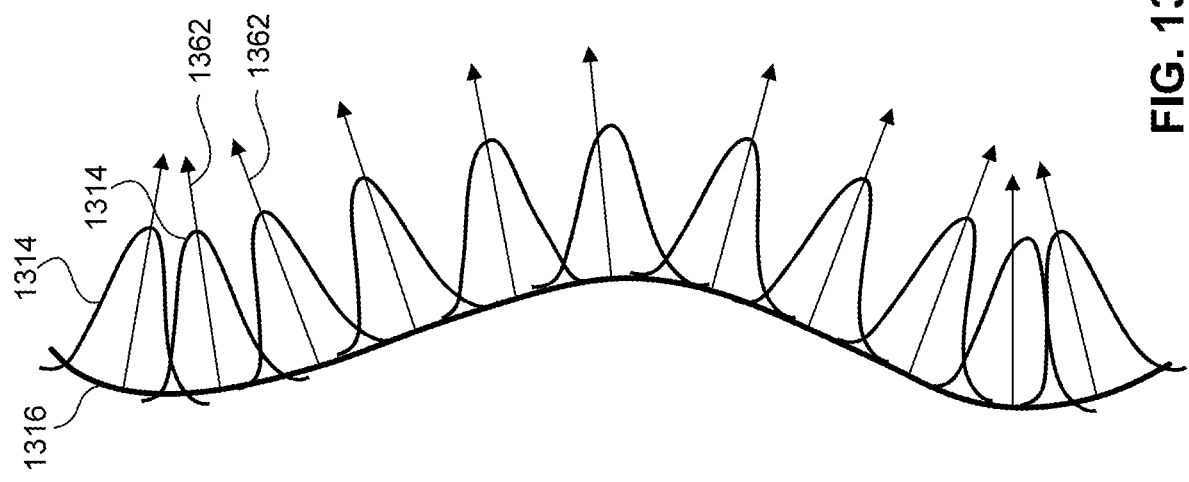
FIG. 13 shows an exemplary wavefront of a beam of radiation, according to some embodiments.

FIG. 13 shows an exemplary wavefront of a beam of radiation 1316, according to some embodiments. FIG. 13 shows how a numerical simulation may be setup to arrive at top-hat intensity profile 1256 (FIG. 12). In some embodiments, the wavefront of beam of radiation 1316 may be modeled via a superposition of radiation waves 1314. Radiation waves 1314 may be beamlets (e.g., Gaussian beamlets). Each radiation wave 1314 may have a wavefront surface normal 1362 that indicates a propagation direction of the beamlet. Parameters of radiation waves 1314 (e.g., phases, amplitudes, position, and the like) may be adjusted to arrive at a wavefront intensity distribution that is substantially similar to top-hat intensity profile 1256 (FIG. 6). Embodiments described hearing provide structures and functions for generating beams of radiation having a top-hat intensity profile.

FIG. 14 shows an illumination branch of a metrology system 1450, according to some embodiments. In some embodiments, metrology system 1450 comprises an illumination system 1400 and an optical element 1462. Optical element 1462 may comprise a lens element 1462a, an aperture 1462b and/or a lens element 1462c. Lens element 1462a may be a beam shaper (e.g., a bi-asphere lens). Lens element 1462c may be a re-image lens or an achromatic mirror.

In some embodiments, illumination system 1400 is configured to generate beam of radiation 1416. Beam of radiation 1416 may comprise beamlets of radiation 1414. Upstream of optical element 1462, beam of radiation 1416 may have a substantially non-flat (e.g., Gaussian) intensity profile 1464. Illumination system 1400 may be of a type that has difficulty generating a top-hat intensity profile (e.g., a typical laser). Therefore, optical element 1462 may be configured to shape an intensity distribution of beam of radiation 1416 so as to generate a top-hat intensity profile 1456 (see top-hat intensity profile 1256, FIG. 12). Beam of radiation 1416, having a top-hat intensity profile 1456 may then be directed at a substrate 1438.

FIG. 15 shows an illumination branch of a metrology system 1550, according to some embodiments. In some embodiments, metrology system 1550 comprises an illumination system 1500 and optical elements 1562. However, different from FIG. 14, optical elements 1562 may comprise a freeform reflective beam shapers.

In some embodiments, illumination system 1500 is configured to generate beam of radiation 1516. Beam of radiation 1516 may comprise beamlets of radiation 1514. Upstream of optical elements 1562, beam of radiation 1516 may have a substantially non-flat (e.g., Gaussian) intensity profile 1564. Illumination system 1500 may be of a type that has difficulty generating a top-hat intensity profile (e.g., a typical laser). Therefore, optical elements 1562 may be configured to shape an intensity distribution of beam of radiation 1516 so as to generate a top-hat intensity profile 1556 (see top-hat intensity profile 1256, FIG. 12). Beam of radiation 1516, having a top-hat intensity profile 1556 may then be directed at a substrate 1538.

Embodiments referencing FIGS. 14 and 15 use optical hardware (e.g., optical elements 1462 and 1562) that can increase the volume requirements of a metrology system. However, in embodiments involving phased arrays, the illumination sources may allow for beam shaping without using additional optical hardware.

In reference to FIG. 6, in some embodiments, the wavefront of beam of radiation 616 may be approximately modeled by superimposing radiation waves 614. One example approximation may be, for example, approximating radiation waves 614 as Gaussian beamlets (e.g., instead of spherical waves). Based on the numerical simulation, parameters of beam generation may be determined (e.g., phases and amplitudes of radiation waves 614) that allow beam of radiation 616 to achieve an intensity profile that is substantially similar to top-hat intensity profile 1256 (FIG. 12). Thus, in some embodiments, beams generated by phased arrays comprise beam profiles that are adjustable based on adjusted phases and amplitudes.

In some embodiments, phased arrays may generate a beam with a top hat-intensity profile having full-width at half-maximum less than approximately 2 microns. In some embodiments, the top hat-intensity profile has a full-width at half-maximum less than approximately 500 nm.

Example Methods for Inspecting Results of a Lithographic Process

In some embodiments, an optical measurement performed on a substrate may comprise capturing a high definition image (e.g., using a camera detector) of a target structure on a substrate. One commercially available example is the previously mentioned Yieldstar™ of ASML. Embodiments of the present disclosure (e.g., FIGS. 5, 9, 10, and 11) may also be used to perform image capture measurements.

In some embodiments (using FIG. 10 as an example), detector 1046 comprises an image capture device (e.g., a camera). Detector 1046 may generate a measurement signal based on the received radiation or detected image (e.g., scattered radiation 1042 from target structure 1036). The measurement signal may comprise information of the received radiation, for example, intensity, phases, and the like.

Metrology system 1050 may divide the detected image into subregions (e.g., image pixels). The subregions may result directly from individual detector elements of a camera (hardware-based) or may be determined by a processor or controller (software-based, e.g., interpolation). Furthermore, known computational enhancement techniques may be used for enhancing image clarity/focus of the detected image and/or reducing aberrations arising from the optics of metrology system 1050. From the measurement signal, a lithographic properties of substrate 1038 may be determined (e.g., overlay error, critical dimension parameters, and the like).

Phase information is different than imaging techniques that illuminate targets with incoherent radiation. For example, using a phased-array based metrology system, a target measured at different Z-positions may result in detected images having different phases. In some embodiments, a first optical measurement comprises illuminating target structure 1036 (e.g., using beam of radiation 1040) and detecting scattered radiation 1042, all at a first Z-position $Z_1$ of target structure 1036. A second optical measurement comprises the steps of the first optical measurement performed at a Z-position $Z_2$ of target structure 1036. The difference in Z-positions may be between approximately 0 to one wavelength of scattered radiation 1042. Metrology system 1050, using a processor or controller, may then compare measurement signals from the first and second optical measurements, for example, phase differences. Aberrations in metrology system 1050 (e.g., from optical element 1044) may be determined based on the phase differences. The aberrations may then be compensated computationally without using additional optical hardware (e.g., more lenses). Thus, metrology systems in embodiments of the present disclosure are capable of making accurate optical measurements while footprints much smaller than dictated by additional optical hardware.

In some embodiments, detecting an image of target structure 1036 comprises moving substrate 1038 in the X-Y plane (e.g., scanning beams of radiation 1040 across target structure 1036 by moving substrate table 1048). However, scanning may cause beams of radiation 1040 to fall on structures outside of target structure 1036 and may cause undesirable interference in the detected image of target structure 1036. Therefore, in some embodiments, detecting an image of target structure 1036 comprises performing the measurement while target structure 1036 is motionless relative to detector 1046 (i.e., substrate 1038 and substrate table 1048 are motionless). In this scenario, the illumination spot generated by beams of radiation 1040 are adjusted such that the spot size of the illumination spot just fills target structure 1036 while minimizing illumination of structures surrounding target structure 1036. The illumination spot may comprise an intensity profile that is substantially similar to top-hat intensity profile 1256 (FIG. 12).

In some embodiments, the term cross-talk is used to describe the phenomena of interference resulting from illuminating structures outside of the target (e.g., cross-talk between desirable and undesirable scattered radiation arriving at the detector). Structures and functions of the present disclosure can be used to reduce cross-talk.

Figure 16B:
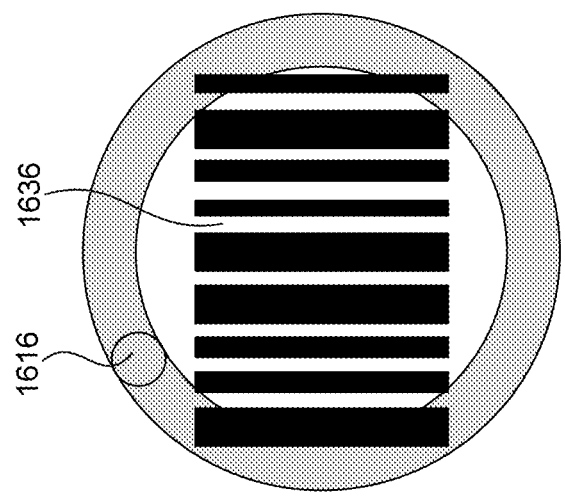
FIGS. 16A and 16B illustrate example illumination techniques for compensating for the effects of cross-talk in a metrology system, according to some embodiments.
Figure 16A:
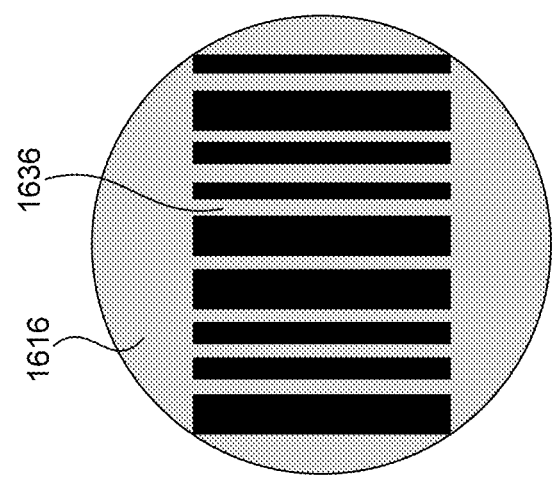

FIGS. 16A and 16B illustrate example illumination techniques for compensating for the effects of cross-talk in a metrology system, according to some embodiments. Particularly, FIG. 16A relates to a stationary beam spot measurement while FIG. 16B relates to a scanning measurement to move the beam spot in an annular path.

Referencing FIG. 16, in some embodiments, a target structure 1636 is illuminated by beam of radiation 1616. Beam of radiation 1616 may be generated using embodiments of metrology and illumination systems of the present disclosure. Beam of radiation 1616 may have a beam spot that just nearly envelops the entirety of target structure 1636 (e.g., just barely overfilled). In some embodiments, beam of radiation 1616 has an intensity profile that is substantially similar to top-hat intensity profile 1256 (FIG. 12). Top-hat intensity profile 1256 provides a steep drop in the illumination intensity near the edge of constant intensity region 1258 (FIG. 12). Therefore, illumination of structures outside of target structure 1636 may be reduced or avoided. A beam spot having a Gaussian-like intensity profile would have an intensity that does not drop off as rapidly, and would therefore result in increased illumination of structures outside of target structure 1636, which in turn increases cross-talk.

There may be instances where structures are printed very close to target structure 1636, for example, for efficient use of substrate surface area. Therefore, it may be difficult to avoid illuminating structures printed closely to target structure 1636. FIG. 16B illustrates an example measurement technique to gather information about how structures nearby target structure 1636 can interfere with measurements. In some embodiments, a beam spot of beam of radiation 1616 is reduced to underfill target structure 1636. The beam manipulation capabilities of phased arrays may be used to achieve the reduced size of the beam spot. Using the beam steering capabilities of phased arrays, beam of radiation 1616 may be scanned around target structure 1636 (e.g., in a circle, a ring path) so as to illuminate structures outside of target structure 1636 (of particular interest are the structures outside of target structure 1636 that would be illuminated by the beam spot illustrated in FIG. 16A). The radiation scattered by the structures outside of target structure 1636 is detected and a measurement signal is generated.

In some embodiments, the measurement information gathered in reference to FIG. 16B (e.g., background measurement) may be used to enhance the clarity of the measurement in reference to FIG. 16A (e.g., signal-of-interest). Thus, the effects of cross-talk may be compensated or reduced by removing, from the signal-of-interest, the influence of the structures outside of target structure 1636.

In some embodiments, using phased arrays as described herein allows selectable wavelength. Different wavelengths may have differing cross-talk contributions. Embodiments in reference to FIG. 16 may be performed at different wavelength selections in order to treat the different cross-talk contributions.

In some embodiments, the structures and functions described herein for inspecting results of a lithographic process may be combined with other inspection techniques, for example, diffraction-based overlay as described in U.S. Pat. No. 8,339,595, which is incorporated by reference herein in its entirety.

Example Methods for Inspecting Alignment of a Substrate

When performing a lithographic process on a substrate, it is important for the substrate to be in precise alignment within the lithographic apparatus such that the newly applied layer lays on top of existing layers on the substrate with precise positioning (overlay). Therefore, lithographic apparatuses rely on metrology systems to measure the position of the substrate relative to the position of the projected illumination pattern of the new layer (e.g., alignment sensors, position sensors IF1 and IF2 in FIG. 1A). Commercially available examples of alignment sensors are the previously mentioned SMASH and ATHENA sensor by ASML of Netherlands. Structures and functions of alignment sensors have been discussed in reference to FIG. 4 and in U.S. Pat. No. 6,961,116 and U.S. Pub. Appl. No. 2009/195768, which are all incorporated by reference herein in their entireties.

Before describing embodiments of alignment metrology systems in more detail, however, it is instructive to describe some of the optical phenomena employed in alignment and position sensing techniques.

In some embodiments, an alignment mark comprises a periodic structure, for example, a grating. The alignment mark may be the target structure to be scanned by an alignment metrology system. The alignment mark may comprise a given pitch, line width, and total width of the entire structure. The pitch of the alignment mark is particularly relevant to positioning accuracy. In some embodiments, a structured illumination may be incident on the alignment mark. The structured illumination may comprise a fringe pattern or periodic structure having parameters that are substantially similar to the alignment mark (e.g., pitch). The structured illumination may be achieved by placing a suitable reference plate (e.g., a grating) in the path of the illumination. When the alignment mark is scanned with a structured illumination, a Moiré effect may be produced, and radiation reflected by the alignment mark may experience periodic intensity variations during the scan. The radiation reflected by the alignment mark is directed at a detector. The detector may output a signal that is based on a property of the detected radiation (e.g., intensity, power, and the like). It should be appreciated that the reference plate may be placed downstream of the alignment mark, i.e., in the detection branch of the metrology system. In this scenario, the alignment mark may produce the structured illumination (e.g., by reflection), which is then passed through the reference plate and then to the detector. The detected intensity may have a similar periodic variation during a scan. The previously mentioned Athena sensor employs a reference plate technique.

In some embodiments, the Moiré effect may be achieved without using a reference plate. For example, an alignment mark is illuminated with a beam having a standard spot (non-structured). The alignment mark, having a periodic structure, may scatter radiation along different diffraction order directions (e.g., −1 and +1). The diffracted radiation may comprise the periodic structure of the alignment mark. Using suitable routing optics, the separated diffraction orders may be brought together to achieve the Moiré effect. Since the alignment mark serves as both the target and the reference, the technique is often referred to as self-referencing. The previously mentioned SMASH sensor employs a self-referencing alignment technique.

Figure 17:
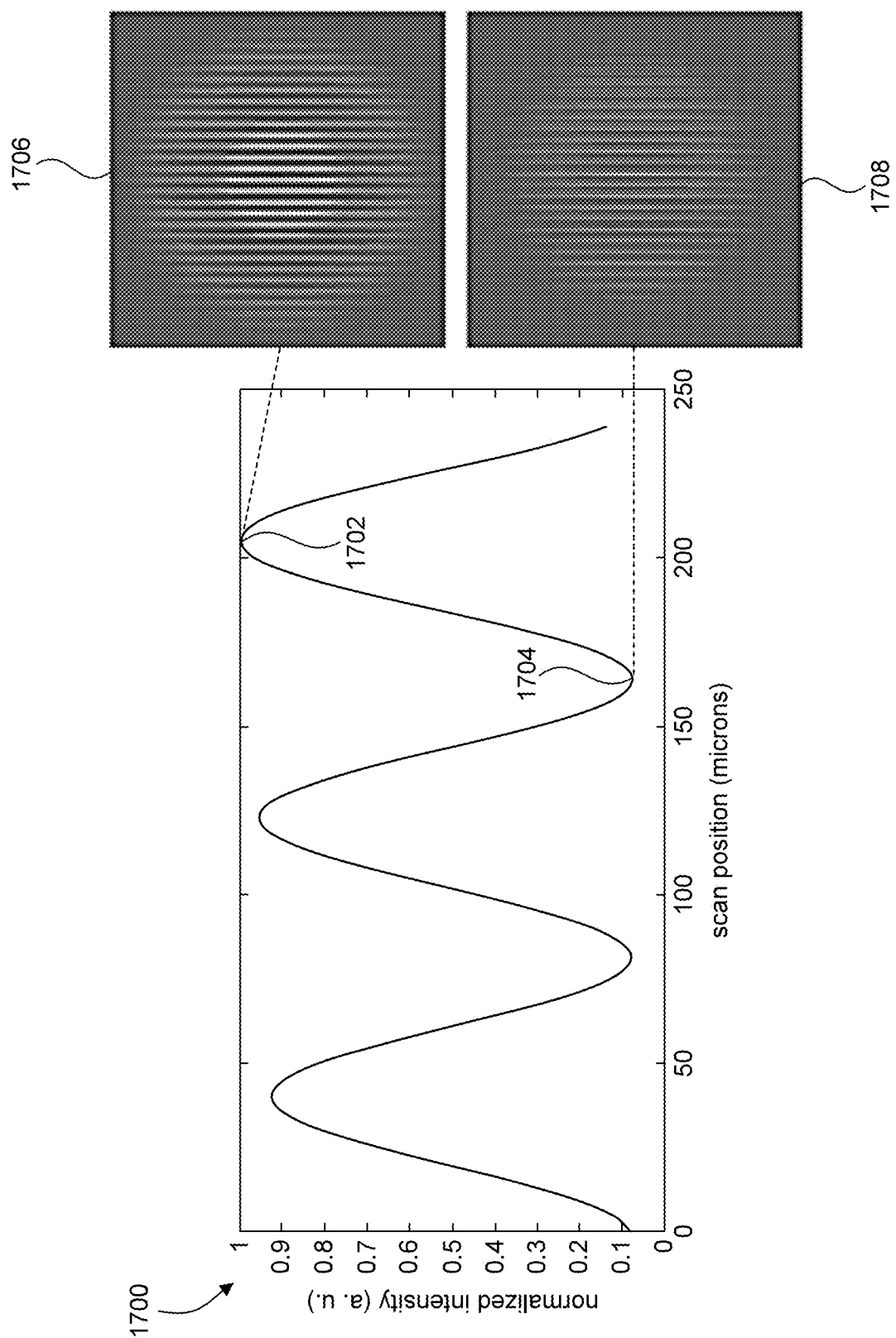
FIG. 17 shows a graph of integrated irradiance as a function of beam position on an alignment mark, according to some embodiments.

FIG. 17 shows a graph 1700 of integrated irradiance as a function of beam position on an alignment mark (e.g., a scanning measurement), according to some embodiments. The vertical axis may represent a normalized intensity of radiation at a detector of a metrology system, given in arbitrary units (a. u.). The detected radiation may comprise a Moiré pattern as discussed above. The horizontal axis may represent a relative position of the beam that illuminates the alignment mark, given in microns as an example and not limiting. As the beam moves across the alignment mark, the radiation incident on the detector may undergo a series of peaks 1702 and valleys 1704. Inset 1706 may represent the intensity distribution on the detector at peaks 1702, where dark is low intensity and bright is high intensity. Inset 1708 may represent the intensity distribution at valleys 1704. In an embodiment where a reference plate is used, so long as the pitch of the structured illumination and the reference plate are substantially matched, the peaks and valleys may be used to accurately determine a position of the alignment mark, for example, by considering the known pitch, the number of peaks and valleys of the detected radiation, and the total width of the alignment mark. Conversely, in an embodiment where there is a pitch mismatch between the reference plate and the alignment mark may reduce accuracy of position determination. In some embodiments, self-referencing technique allows for the pitch to be matched since the reference and the target are based on a same alignment mark.

In some embodiments, devices features follow trends in the IC technology space to shrink device features and achieve an efficient use of wafer surface area. In some embodiments, smaller alignment marks with a continuous range of pitch options may be chosen for the reference structure. A reference plate technique may present difficulties for following such market trends. For example, a reference plate technique forces a user to include, in their wafer products, alignment marks that conform to one of the reference plates, even if the alignment marks adversely impact production performance. Reference plates may not be easily interchangeable. Even if interchangeable reference plates were used, the alignment marks may be limited based on available reference plate options.

In some embodiments, both the reference plate and self-referencing techniques depend on optical hardware that increase the footprint of the metrology system. It can be envisioned that multiple metrology systems may be closely packed together to inspect more targets on a substrate, simultaneously or nearly simultaneously (e.g., to increase inspection throughput and reduce production times). However, metrology systems having large footprints limit the number of metrology systems that can be closely packed. Embodiments of the present disclosure provide structures and functions for overcoming the above-mentioned issues of metrology systems.

Figure 18:
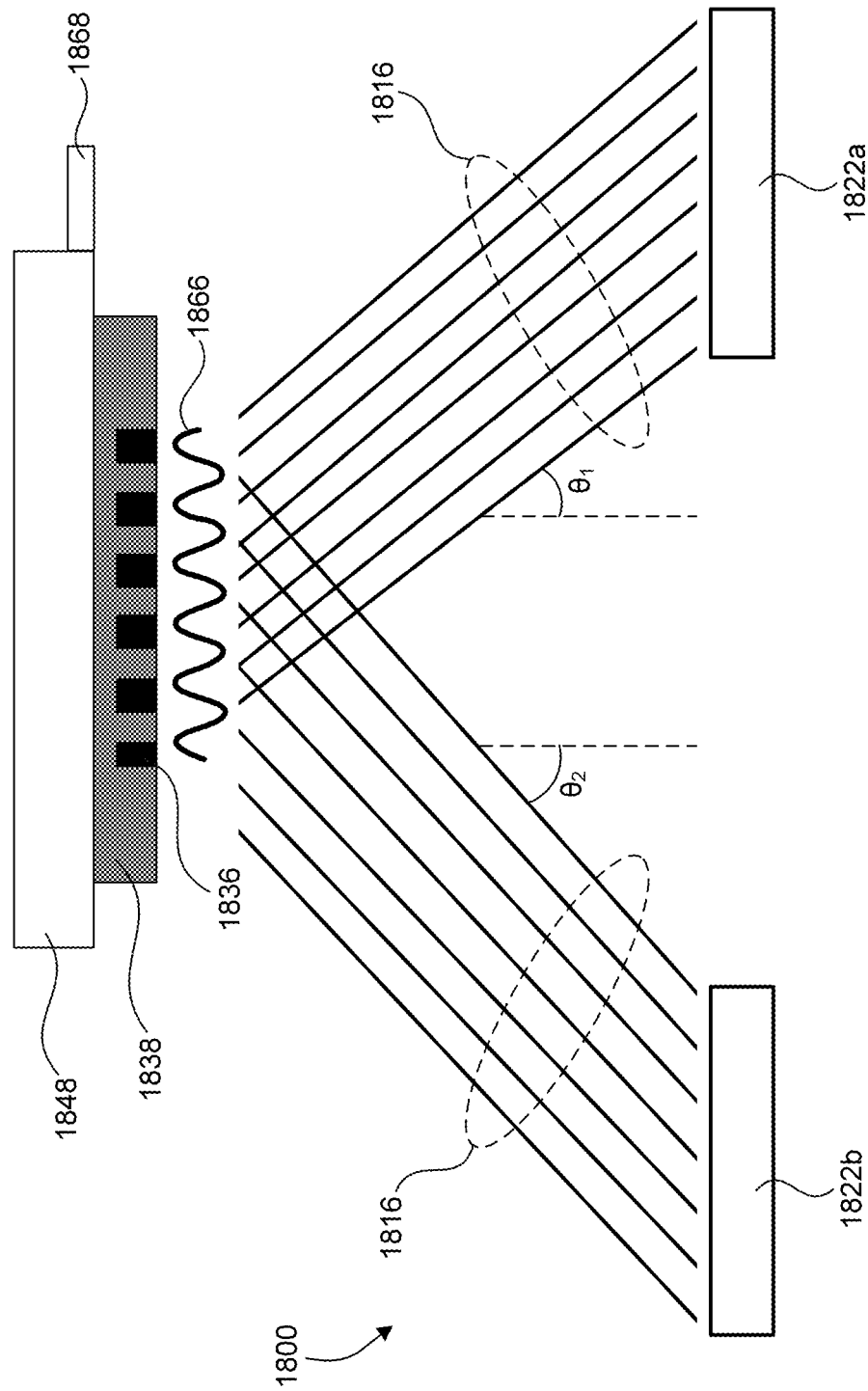
FIG. 18 shows an illumination system, according to some embodiments.

FIG. 18 shows an illumination system 1800, according to some embodiments. Elements of FIG. 18 may have similar structures and functions as similarly numbered elements in FIGS. 5-11 (e.g., elements sharing the two right-most numeric digits). It should be appreciated that certain structures have been omitted from FIG. 11 in order to enhance clarity. Therefore, unless otherwise specified, it should be appreciated that embodiments referencing FIG. 18 may also comprise elements analogous to those shown in, e.g., FIGS. 6-11.

In some embodiments, illumination system 1800 comprises phased arrays 1822a and 1822b. In some embodiments, phased arrays 1822a and 1822b are configured to generate beams of radiation 1816. Beams of radiation 1816 may be directed at a target structure 1836. Target structure 1836 may be disposed on a substrate 1838. Substrate 1838 may be disposed on a substrate table 1848. In some embodiments, phased arrays 1822a and 1822b are configured to direct and steer the beams they generate. For example, beams of radiation 1816 may be adjusted to illuminate a location on target structure 1836.

In some embodiments, illumination system 1800 may generate beams of a number of wavelengths λ from the phased arrays (e.g., $\lambda_1, \lambda_2 \ldots \lambda_N$) as described in reference to, e.g., FIGS. 6, 7, and 8. Phased arrays 1822a and 1822b may output radiation having a wavelength that is selectable from a plurality of wavelengths (e.g., see time multiplexer 1152 of FIG. 11).

Coherent light sources may be interfered to create structured illumination (e.g., fringe pattern). For example, a fringe pattern is created in a laser-sourced interferometer. Similarly, in some embodiments, beams of radiation 1816 may be directed to overlap at a location on target structure 1836. By exploiting the coherence nature of the beams, the beams may be interfered at the location. Consequently, the beam spot may comprise a fringe intensity profile 1866. The position of the beam spot (relative to substrate 1838) may be adjusted. Adjusting the beam spot's position may be achieved by controlling the directions of beams of radiation 1816 and/or moving substrate 1838 using substrate table 1848. The adjustment function of the beam spot may be used for scanning across target structure 1836, during a measurement for example.

In some embodiments, the pitch of fringe intensity profile may depend on the wavelength of radiation used and the angles of incidence of beams of radiation 1816. The spatial distribution of fringe intensity profile 1866 may be approximated with the following equation:

$$I(x,t) = I_1(t) + I_2(t) + 2\sqrt{I_1(t)I_2(t)} \cos(2\pi x/\Lambda). \qquad \text{Eq. 1}$$

In equation 1, $I_1$ and $I_2$ represent intensities of beams from respective phased arrays (e.g., from phased arrays 1822a and 1822b). The cosine term determines the periodic nature of fringe intensity profile 1866. The pitch of fringe intensity profile 1866 is determined by the modulation period $\Lambda$, which is given by the following equation:

$$\Lambda = \frac{\lambda}{|\sin\theta_1 - \sin\theta_2|}. \qquad \text{Eq. 2}$$

In equation 2, $\lambda$ represents the wavelength of beams of radiation 1816. In some embodiments, $\lambda_1$ is the angle of incidence (with respect to the surface of substrate 1838) of beam of radiation 1816 coming from phased array 1822a while $\theta_2$ regards phased array 1822b. Thus, phased arrays 1822a and 1822b may allow controlling the pitch of fringe-structured illumination in a continuous range. In some embodiments, a user of a metrology system employing illumination system 1800 has the freedom to design alignment marks with any pitch within the range afforded by modulation period $\Lambda$. Also, the overall size of alignment marks may be made much smaller than allowed by currently available metrology systems. As described previously in reference to FIG. 10, the Z distance of substrate table 1048 may be adjusted to accommodate a range of values for angles of incidence $\theta_1$ and $\theta_2$.

In some embodiments, a calibration structure 1868 (e.g., a reference plate) may be provided on substrate table 1848 or on some other fiducial of an apparatus that substrate table 1848 may belong to (e.g., a lithographic apparatus). Calibration structure 1868 may comprise a plurality of reference structures for a plurality of pitch settings. A reference structure on calibration structure 1868 may be illuminated with fringe intensity profile 1866. The detection of radiation scattered by calibration structure 1868 may be used to determine whether fringe intensity profile 1866 truly has the selected pitch based on selected parameters of phased arrays 1822a and 1822b. Any detector of a metrology system may be used to receive radiation scattered by calibration structure 1868 (e.g., detector 1046 of FIG. 10 or a dedicated calibration detector (not shown)).

In some embodiments, a controller (e.g., 710 in FIG. 7) may receive a pitch and/or wavelength selections as an input from a user. The controller may then determine phased array parameters (e.g., phase delays for adjusting angles of incidence) to achieve the selected pitch parameters based on the selected wavelength.

In some embodiments, phased arrays, such as 1822a and 1822b, allow metrology systems to avoid the need for reference plates or optical hardware employed in self-referencing techniques. Using compact metrology systems closely packed together may allow alignment marks, which are distributed on a substrate, to be closer to a metrology system. In some embodiments, even if the alignment mark is not perfectly parallel to the closest metrology system, only a short movement will allow the alignment mark to be moved into a measurement position. In some embodiments, the more densely packed the metrology systems are made, the shorter and fewer the movements of alignment marks may get, which may allow many more alignment marks to be inspected in a given time. For example, a size reduction of a metrology system from 400 mm² to 16 mm² allows 25 times more metrology systems to be fit for the same amount of area. And so the number of simultaneous or near simultaneous inspections can be greatly enhanced.

In some embodiments, metrology systems, phased arrays, and associated optical elements of the present disclosure are configured to work in wavelength ranges spanning UV, visible, and IR (e.g., approximately 400-2000 nm).

In some embodiments, a receiving system and the illumination system may be included on a single PIC. The receiver system receives scattered radiation by the target structure and redirect the scattered radiation to a detector. The receiver system may also be implemented on a separate PIC.

Figure 19:
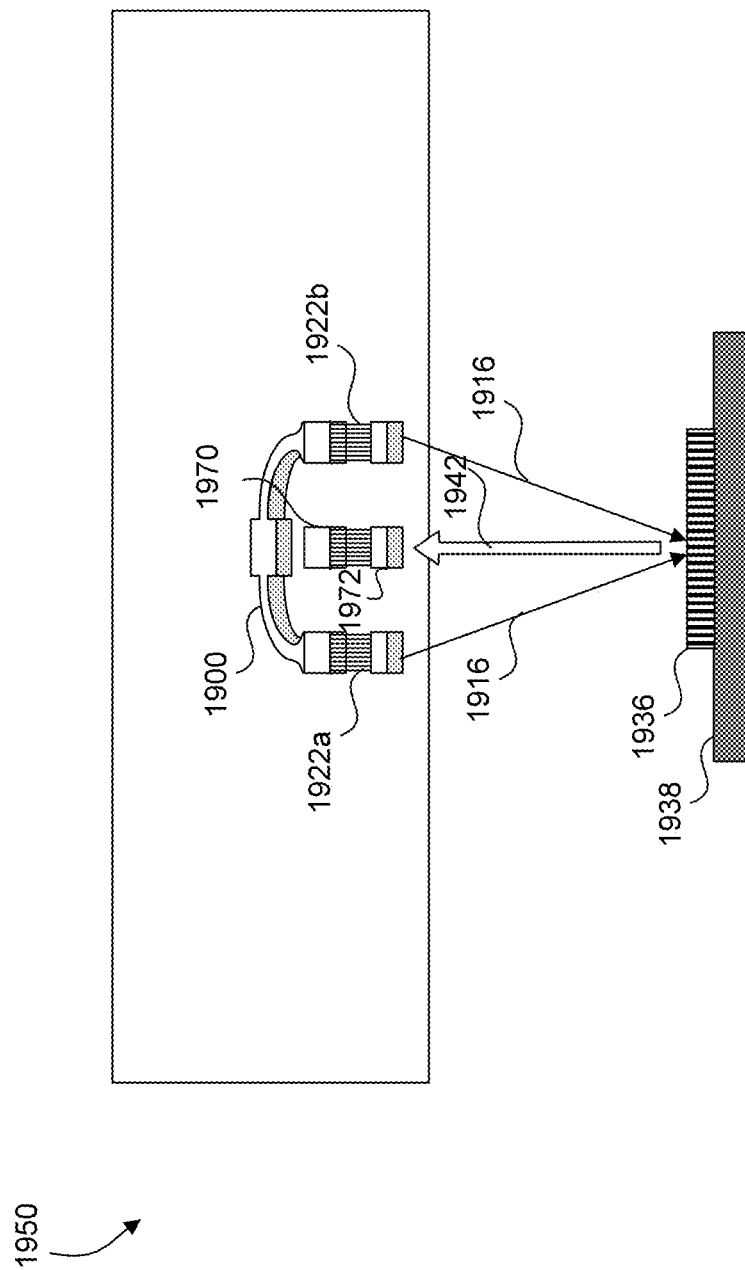
FIG. 19 shows a schematic of an inspection system, according to some embodiments.

FIG. 19 shows a perspective view of an inspection system 1950, according to some embodiments. Elements of FIG. 19 may have similar structures and functions as similarly numbered elements in FIGS. 6 and 7 (e.g., elements sharing the two right-most numeric digits). It should be appreciated that certain structures have been omitted from FIG. 19 in order to enhance clarity (e.g., an analog to radiation source 708 of FIG. 7). Therefore, unless otherwise specified, it should be appreciated that embodiments referencing FIG. 19 may also comprise elements analogous to those shown in FIGS. 6 and 7.

In some embodiments, inspection system 1950 includes an illumination system 1900, a receiver system 1970, and a detector (not shown).

In some embodiments, illumination system 1900 comprises phased arrays 1922a and 1922b. Phased arrays 1922a and 1922b may comprise structures and functions that may be substantially similar to those of, e.g., phased array 622 (FIG. 6).

In some embodiments, phased arrays 1922a and 1922b are configured to generate beams of radiation 1916. Beams of radiation 1916 may have a first wavelength. Beams of radiation 1916 may be directed at a target structure 1936. Target structure 1936 is disposed on a substrate 1938. In some embodiments, illumination system 1900 may generate beams of a number of wavelengths $\lambda$ from the phased arrays (e.g., $\lambda_1, \lambda_2 \ldots \lambda_N$).

In some embodiments, phased arrays 1922a and 1922b, are configured to direct and steer the beams they generate. For example, beams of radiation 1916 may be adjusted to illuminate a location on target structure 1936 (e.g., beam spots overlap). In some embodiments, target structure 1936 scatters (e.g., diffracts) beams of radiation 1916, shown as scattered radiation 1942. In some embodiments, steering the beams allows the angle of incidence of the beams on target structure 1936 to be adjusted. To change the angle of incidence, substrate 1938 may be moved in the Z-direction (toward or away from illumination system 1900) and beams of radiation 1916 is steered to illuminate target structure 1936 at a different angle of incidence. Thus, it is possible to adjust the angle of incidence through a continuum of off-axis angles (e.g., angles of incidence different from zero). An advantage is that a direction of scattered radiation 1942 may be adjusted.

Receiver system 1970 detects scattered radiation 1942. In one embodiment, scattered radiation 1942 may be perpendicularly incident on receiver system 1970 (i.e., normal incidence). Detection system 1970 may redirect the scattered radiation to a detector and/or generate a measurement signal based on the received radiation or detected image (e.g., scattered radiation 1942 from target structure 1936). The measurement signal may comprise information of the received radiation, for example, intensity, phases, and the like.

Receiver system 1970 includes a receiver array including one or more phased arrays 1972. Phased array 1972 includes optical elements and waveguides. Phased array 1972 is substantially similar to phased arrays 1922a and 1922b but is operating in a receiving mode. For example, optical elements of the phased array 1972 (e.g., optical elements 606 of FIG. 6) are configured to receive radiation 1942. Optical elements may couple the received radiation to waveguides of the phased array (e.g., waveguide 604 of FIG. 6).

Figure 20:
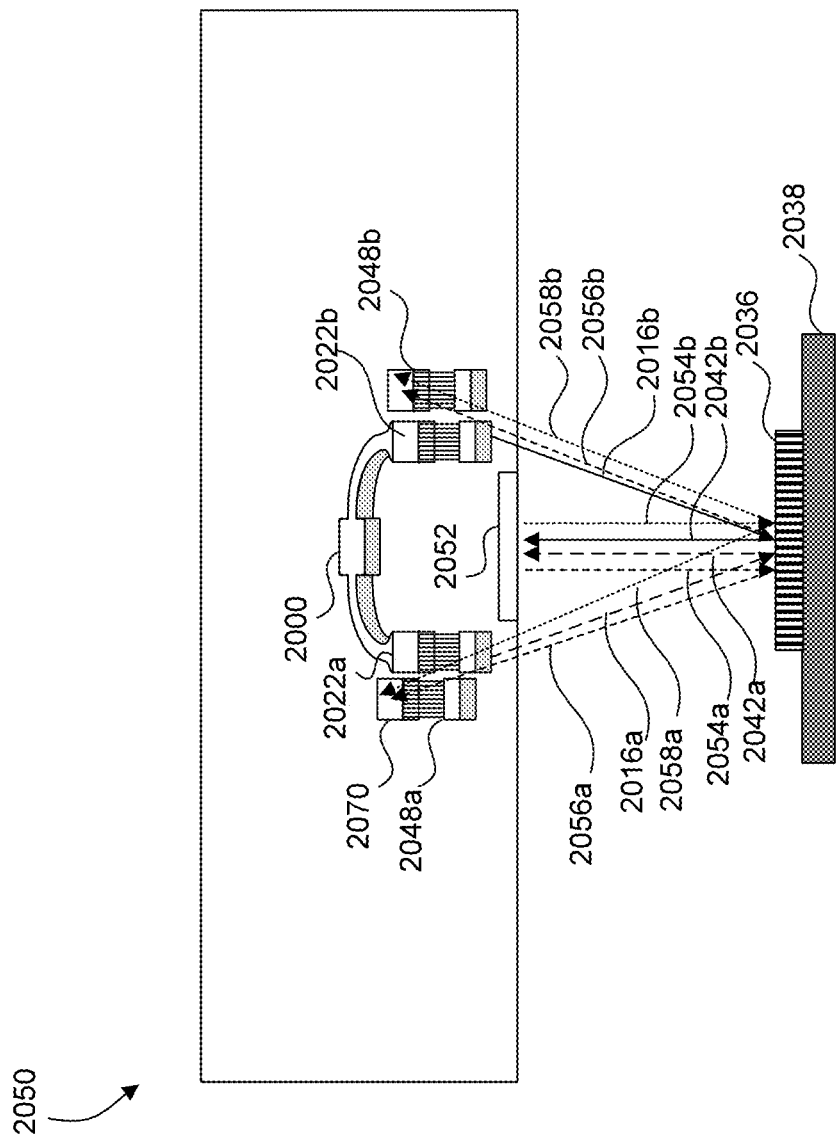
FIG. 20 shows a schematic of an inspection system, according to some embodiments.

FIG. 20 shows an inspection system 2050, according to some embodiments. Elements of FIG. 20 may have similar structures and functions as similarly numbered elements in FIGS. 6 and 7 (e.g., elements sharing the two right-most numeric digits). It should be appreciated that certain structures have been omitted from FIG. 20 in order to enhance clarity (e.g., an analog to radiation source 708 of FIG. 7). Therefore, unless otherwise specified, it should be appreciated that embodiments referencing FIG. 20 may also comprise elements analogous to those shown in FIGS. 6 and 7.

Inspection system 2050 includes an illumination system 2000, a receiving system 2070. In some embodiments, illumination system 2000 comprises phased arrays 2022a, 2022b. Illumination system 2000 may further comprise one or more additional phased arrays (not shown). Phased arrays 2022a, 2022b may comprise structures and functions that may be substantially similar to those of, e.g., phased array 622 (FIG. 6).

In some embodiments, phased arrays 2022a and 2022b are configured to generate beams of radiation 2016a, 2016b. Beams of radiation 2016a, 2016b may have a first wavelength. Beams of radiation 2016a, 2016b may be directed at a target structure 2036. Target structure 2036 is disposed on a substrate 2038. In some embodiments, phased arrays 2022a, 2022b, are configured to direct and steer the beams they generate. For example, beams of radiation 2016a, 2016b may be adjusted to illuminate a location on target structure 2036 (e.g., beam spots overlap). In some embodiments, target structure 2036 scatters (e.g., diffracts) beams of radiation 2016, shown as scattered radiation 2042. In some embodiments, steering the beams allows the angle of incidence of the beams on target structure 2036 to be adjusted. To change the angle of incidence, substrate 2038 may be moved in the Z-direction (toward or away from illumination system 2000) and beams of radiation 2016a, 2016b are steered to illuminate target structure 2036 at a different angle of incidence. Thus, it is possible to adjust the angle of incidence through a continuum of off-axis angles (e.g., angles of incidence different from zero). An advantage is that a direction of scattered radiation 2042 may be adjusted.

In some embodiments, receiver system 2070 also includes phased array 2048a, 2048b, a reflecting element 2052, and one or more detectors. Reflecting element 2052 may be configured to receive scattered radiation from the target structure 2036. Reflecting element 2052 may be a mirror formed by a reflective material. For example, reflecting element 2052 may be formed using a silver layer, a gold layer, a copper layer, an aluminum layer, or the like as would be understood by one of ordinary skill in the art. Reflecting element 2052, illumination system 2044, and phased arrays 2048a, 2048b may be formed on a single PIC.

Phased arrays 2048a, 2048b may be configured to receive scattered radiation by the target structure 2036. Phased arrays 2048a, 2048b may be substantially similar to phased arrays 2022a and 2022b but are operating in a receiving mode. For example, optical elements of phased arrays 2048a, 2048b are configured to receive scattered radiation and couple the scattered radiation to waveguides of the phased arrays.

In some embodiments, beams of radiation 2016a, 2016b are scattered by the target structure 2036 forming scattered radiation 2042a, 2042b. Reflecting element 2050 receives scattered radiation 2042a, 2042b and reflects scattered radiation 2042a, 2042b back towards target structure 2036 forming reflected radiation 2054a, 2054b. Reflected radiation 2054a, 2054b incident on target structure 2036 is scattered toward each of the phased arrays 2048a, 2048b. For example, radiation 2054a is scattered towards phased array 2048a and phased array 2048b forming two scattered radiation 2056a, 2056b. Similarly, radiation 2052b is scattered towards phased array 2048a and phased array 2048b forming scattered radiation 2058a, 2058b. That is, two copies of the radiation are received by each of the phased arrays 2048a, 2048b. Phased arrays 2048a, 2048b may be coupled to one or more detectors. Measurement signals from the two phased arrays 2048a, 2048b can be used for calibration (i.e., by using a reference signal) and to check the reliability of measurement. For example, a difference between the two measurement signals may be used to monitor asymmetry, imbalance, and phased array angle mismatch.

Figure 21:
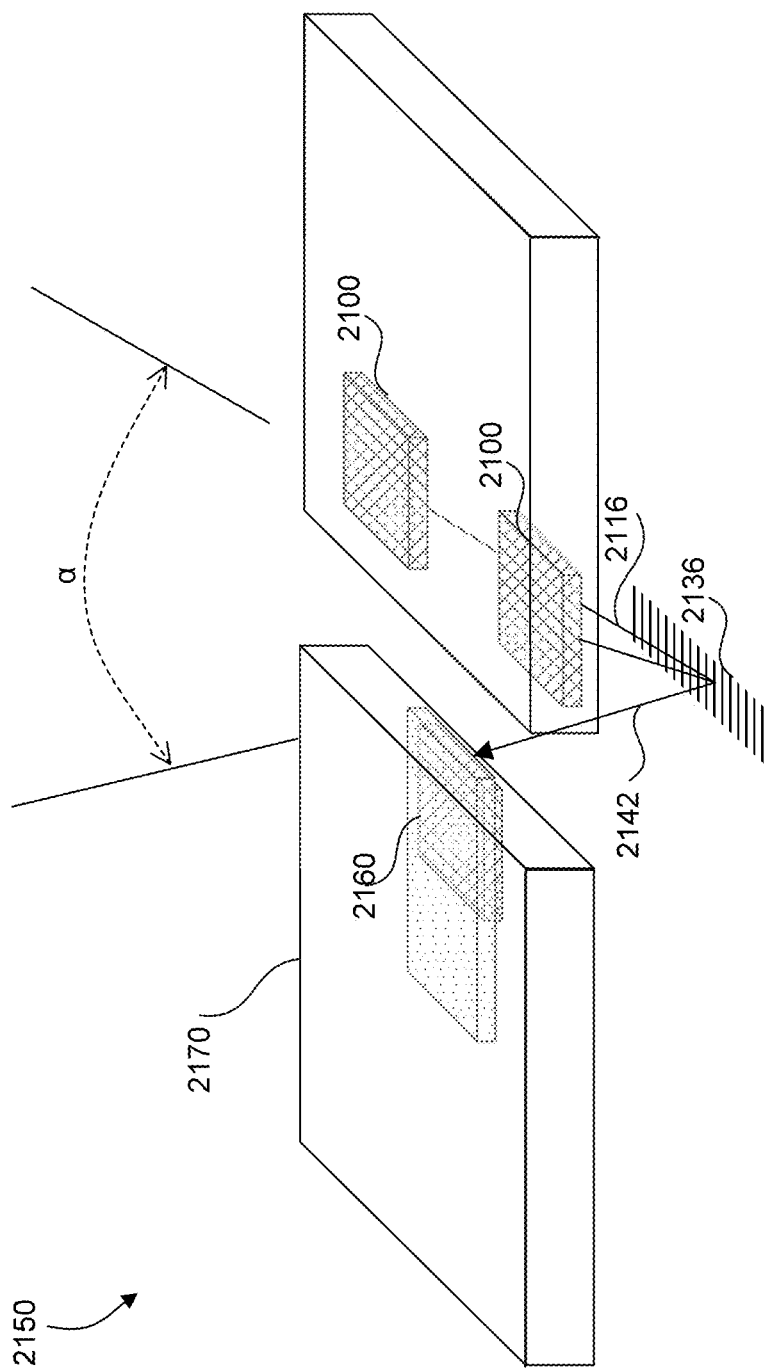
FIG. 21 shows a schematic of an inspection system, according to some embodiments.

FIG. 21 shows an inspection system 2150, according to some embodiments. Elements of FIG. 21 may have similar structures and functions as similarly numbered elements in FIGS. 6 and 7 (e.g., elements sharing the two right-most numeric digits). It should be appreciated that certain structures have been omitted from FIG. 21 in order to enhance clarity (e.g., an analog to radiation source 708 of FIG. 7). Therefore, unless otherwise specified, it should be appreciated that embodiments referencing FIG. 21 may also comprise elements analogous to those shown in FIGS. 6 and 7.

In some embodiments, inspection system 2150 includes an illumination system 2100 and a receiver system 2170. Illumination system 2100 and receiver system 2170 may be formed on separate photonic integrated circuits.

In some embodiments, illumination system 2100 is configured to generate a beam of radiation 2116. Illumination system 2100 may adjust the direction beam of radiation 2116. It should be appreciated that directions of beam of radiation 2116 depicted in FIG. 21 are not limiting. Beams of radiation 2116 may be directed to a target structure 2036. Illumination system 2100 is tilted with respect to a normal of target structure 2036. In other words, a small angle α exists between a plane of detection system 2128 and a plane of illumination system 2100. Thus, the beams of radiation 2116 are incident at an angle on target structure 2136 (i.e., oblique incidence). Target structure 2136 scatters (e.g., diffracts) radiation to generate scattered radiation 2142. Scattered radiation 2142 is at an angle with respect to a normal to target structure 2136 and is scattered towards the receiver system 2170.

Illumination system 2100 may comprise one or more phased arrays. The phased arrays allow adjusting the direction of beam of radiation 2116.

Receiver system 2170 may include one or more receiving elements such as an optical coupler 2160. Optical coupler 2160 is configured to couple scattered radiation 2142 into a detector of receiver system 2170. Optical coupler 2160 may be a phased array, a grating, or the like as would be understood by one of ordinary skill in the art.

In one embodiment, receiver system 2170 includes a fiber configured to collect the radiation and focus the radiation into a detector.

In one embodiment, the detector may be an array of detectors. For the detector array, a number of options are possible: a bundle of multimode fibers, discrete pin detectors per channel, or CCD or CMOS (linear) arrays. The use of a bundle of multimode fibers enables any dissipating elements to be remotely located for stability reasons. Discrete PIN detectors offer a large dynamic range but each need separate pre-amps. The number of elements is therefore limited. CCD linear arrays offer many elements that may be read-out at high speed and are especially of interest if phase-stepping detection is used.

In some embodiments, inspection apparatus 2150 may be implemented as part of lithographic apparatus 100 or 100' (FIGS. 1A and 1B). Inspection apparatus 2150 may be implemented as an alignment apparatus for aligning a substrate with respect to a reticle.

In some embodiments, inspection apparatus 2150 is configured to measure a result of a lithographic process (e.g., overlay error) performed on a substrate. Measuring the result of the lithographic process may be performed outside of a lithographic apparatus (e.g., in a detached metrology apparatus or dedicated overlay inspection tool).

Figure 22:
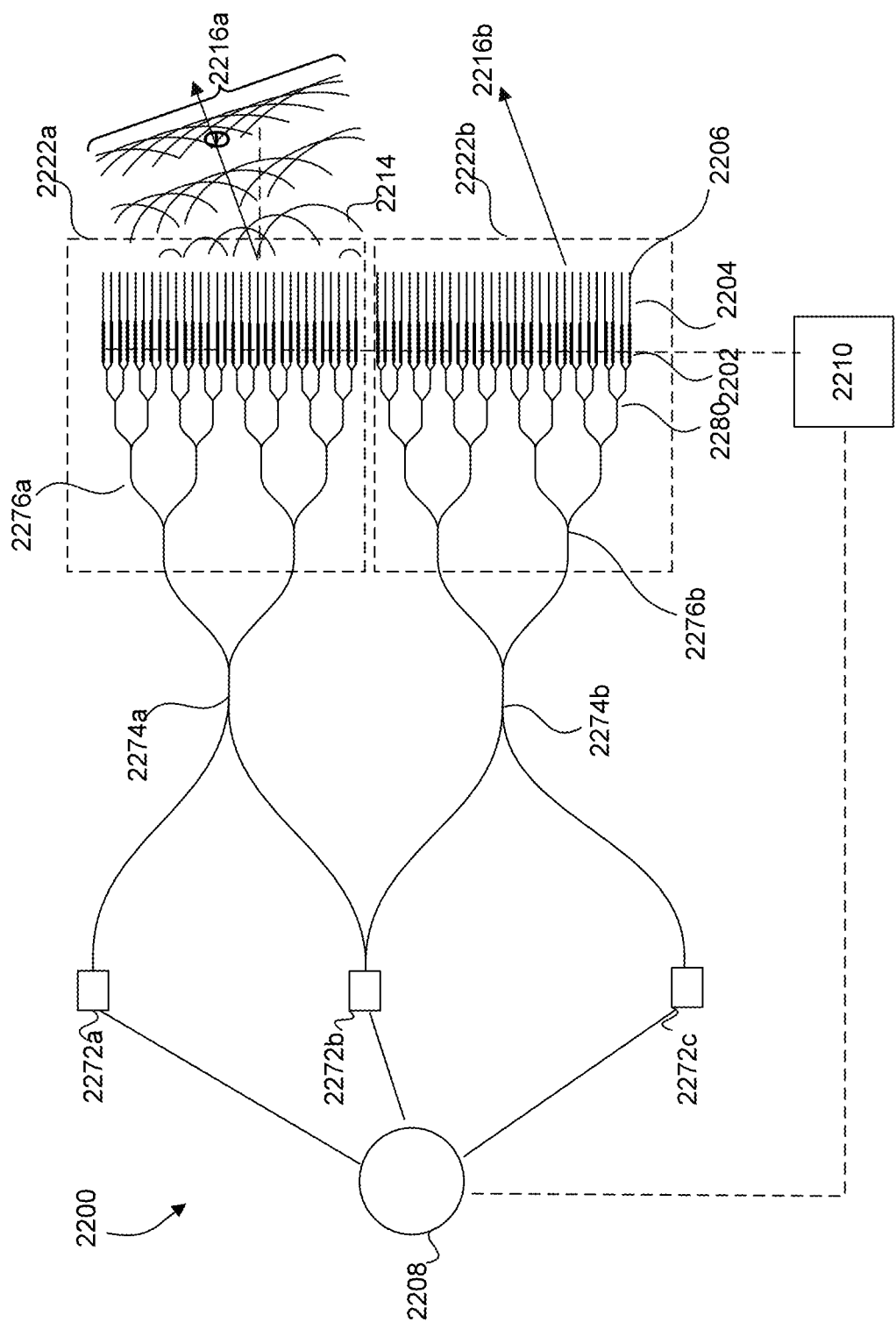
FIG. 22 shows a schematic of an illumination system, according to some embodiments.

FIG. 22 shows a schematic of an illumination system 2200, according to some embodiments. In some embodiments, illumination system 2200 may be implemented as part of an inspection apparatus, e.g., as illumination system 500 in inspection apparatus 550 (FIG. 5). Elements of FIG. 22 may have similar structures and functions as similarly numbered elements in FIG. 6 (e.g., elements sharing the two right-most numeric digits). It should be appreciated that certain structures have been omitted from FIG. 22 in order to enhance clarity. Therefore, unless otherwise specified, it should be appreciated that embodiments referencing FIG. 22 may also comprise elements analogous to those shown in, e.g., FIG. 6.

In some embodiments, illumination system 2200 comprises phase modulators 2202, waveguides 2204, and optical elements 2206. Illumination system 2200 further comprises a radiation source 2208 and/or a controller 2210. Phase modulators 2202 may comprise electro-optic modulators, thermo-optic modulators, and the like.

In some embodiments, phase modulators 2202 are disposed along waveguides 2204 (e.g., intersecting or adjacent to waveguides). In some embodiments, optical elements 2206 are disposed downstream of phase modulators 2202 along waveguides 2204. In some embodiments the number of phase modulators 2202, waveguides 2204, and optical elements 2206 are equal (e.g., there is a one-to-one-to-one correspondence in a set of a phase modulator, waveguide, and optical element). In some embodiments, phase modulators 2202, waveguides 2204, and optical elements 2206 are arranged as a so-called phased array (e.g., an array of radiation elements for generating radiation having given phases).

For ease of discussion, a first phased array 2222a is designated by a dotted outline. In some embodiments, illumination system 2200 comprises a second phased array 2222b (also designated by a dotted outline). In some embodiments, illumination system comprises more phased arrays.

In some embodiments, light is coupled to phased arrays 2222a and 2222b using two or more input ports 2272. For example, light may be coupled to phased arrays 2222a and 2222b using a first port 2272a, a second port 2272b, and a third port 2272c.

In some aspects, illumination system 2200 further comprises a first coupler 2274a and a second coupler 2272b. First coupler 2274a can couple light from first input port 2272a and second input port 2272b. Second coupler 2274b can couple light from second input port 2272b and third input port 2272c. In some aspects, first coupler 2274a and second coupler 2274b comprise two by two couplers.

In some embodiments, illumination system 2200 comprises a first splitter tree 2276a and a second splitter tree 2276b. In some aspects, first splitter tree 2276a can extend from the first coupler 2274a to optical elements 2206 of first phased array 2222a. And, e.g., second splitter tree 2276b can extend from the second coupler 2274b to optical elements 2206 of second phased array 2222b. In some aspects, first splitter tree 2276a and second splitter tree 2276b can include a plurality of splitters 2280. The plurality of splitters 2280 comprise one to two splitters. In some aspects, each optical element 2206 of phased arrays 2222a and 2222b can be located at a leaf of respective first splitter tree 2276a and second splitter tree 2276b.

In some embodiments, waveguides 2204 are configured to guide radiation. The radiation may be supplied by a radiation source 2208 and received at one or more ports of the phased arrays. Waveguides 2204 may be configured to guide radiation (e.g., from the input ports 2272a, 2272b, or 2227c) to optical elements 2206. Optical elements 2206 may be configured to radiate radiation waves. Optical elements 2206 may be referred to herein as "emitters," "emission elements," and the like, referencing their function of emitting radiation. Optical element 2206 may comprise waveguide gratings or antenna emitters.

In some embodiments, phase modulators 2202 are configured to adjust phases of radiation waves. In some embodiments, the phases of radiation waves 2214 are adjusted such that radiation waves 2214 accumulate to form a beam of radiation 2216. For example, the radiation waves 2214 may form a first beam of radiation 2216a and a second beam or radiation 2216b. The direction of beams 2216a and 2216b is based on the phases of radiation waves 2214. The phased arrays of illumination system 2200 may generate first and second beams of radiation 2216a and 2216b and direct first and second beams of radiation 2216a and 2216b (e.g., toward a target structure). Phase modulation may comprise adjusting phase delays of radiation waves 2214.

In some embodiments, light may be emitted from phased array 2222a and/or phased array 2222b by selecting an input port. For example, light may be emitted from phased array 2222a and phased array 2222b when second input port 2272b is used. Light can be emitted from phased array 2222a when first input port 2272a is used. Light can be emitted from phased array 2222b when third input port 2272c is used. In other words, first beam of radiation 2216a may form when the radiation source 2208 is coupled to first input port 2272a. Second beam of radiation 2216b may form when the radiation source 2208 is coupled to third input port 2272c. In some aspects, first beam of radiation 2216a and second beam of radiation 2216b may simultaneously form when the radiation source 2208 is coupled to second input port 2272b.

In some embodiments, first input port 2272a and third input port 2272c can be used during spot size characterization. In some aspects, second input port 2272b can be used during alignment measurements. Thus, an alignment mark (not shown, example alignment mark 418 in FIG. 4A) is illuminated by both optical phase arrays 2222a and 2222b simultaneously while performing alignment measurements. For example, alignment measurements may include measuring a result of a lithographic process (e.g., overlay error) performed on a substrate. During spot size characterization, first input port 2272a or third input port 2272c may be used to illuminate structures outside of the target structure as described in FIGS. 16A and 16B.

In some embodiments, controller 2210 is configured to receive from a user a selection of a measurement mode (i.e., alignment measurement, spot size characterization). In some aspects, controller 2210 can identify the port based on the selection. Further, controller 2210 may control a connection between radiation source 2208 and the identified port. For example, controller 2210 can couple radiation source 2208 to second input port 2272b when alignment measurement mode is inputted by the user. In some embodiments, radiation source 2208 may include multiple radiation sources. Each input port (e.g., first input port 2272a, second input port 2272b, third input port 2272c) may be coupled to a different radiation source.

In some embodiments, illumination system 2200 comprises a photonic integrated circuit (PIC). In other words, illumination system 2200 and components therein (e.g., radiation sources, phase modulators, etc.) may be part of the PIC. The PIC allows illumination system 2200 to be built extremely small (e.g., sub-millimeter).

Figure 23:
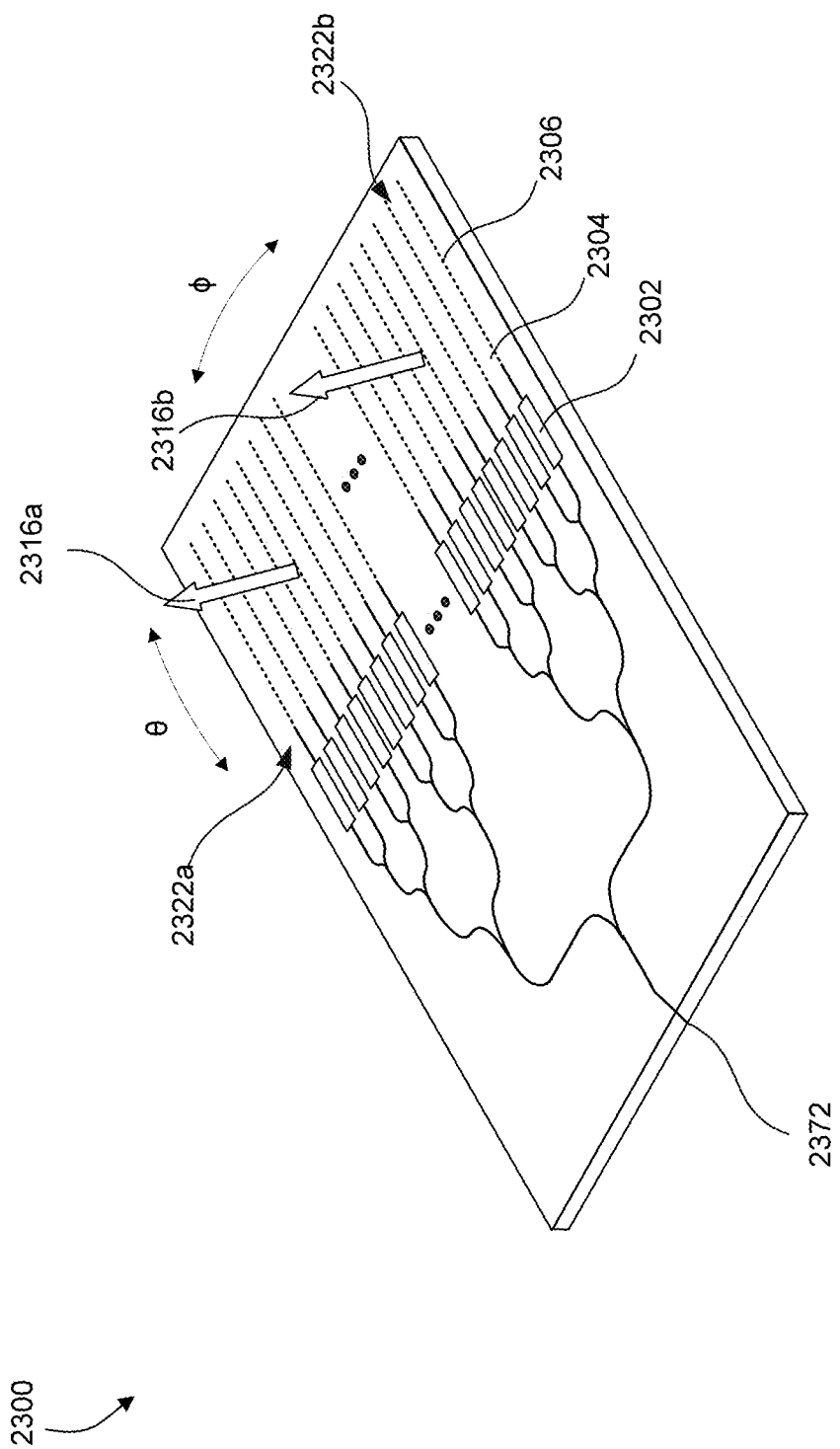
FIG. 23 shows a schematic of an illumination system of an inspection system, according to some embodiments.

FIG. 23 shows a schematic of an illumination system 2300, according to some embodiments. In some embodiments, illumination system 2300 may be implemented as part of an inspection apparatus, e.g., as illumination system 500 in inspection apparatus 550 (FIG. 5). Elements of FIG. 23 may have similar structures and functions as similarly numbered elements in FIG. 22 (e.g., elements sharing the two right-most numeric digits). It should be appreciated that certain structures have been omitted from FIG. 23 in order to enhance clarity. Therefore, unless otherwise specified, it should be appreciated that embodiments referencing FIG. 23 may also comprise elements analogous to those shown in, e.g., FIG. 22. For example, illumination system 2300 may comprise a radiation source and a controller.

In some embodiments, illumination system 2300 comprises phase modulators 2302, waveguides 2304, and optical elements 2306. Phase modulators 2302 may comprise electro-optic modulators, thermo-optic modulators, and the like. Radiation from a radiation source (not shown) may be coupled to the phased arrays 2322a and 2322b via input port 2372. Phased arrays 2322a and 2322b may comprise structures and functions that may be substantially similar to those of, e.g., phased array 622 (FIG. 6).

In some embodiments, phase modulators 2302 are disposed along waveguides 2304 (e.g., intersecting or adjacent to waveguides). In some embodiments, optical elements 2306 are disposed downstream of phase modulators 2302 along waveguides 2304.

In some embodiments, the phases of radiation waves (not shown) are adjusted such that radiation waves accumulate to form a beam of radiation 2316. For example, the radiation waves may form a first beam of radiation 2316a and a second beam of radiation 2316b. The direction of beams 2316a and 2316b is based on the phases of radiation waves.

In some embodiments, phase modulation may comprise staggering phase delays of radiation waves. In some embodiments, a phase offset may be applied to each emitter (i.e., optical element 2306) to steer the emitted beam. In some aspects, the beams of radiation 2316a, 2316b may be steered in two directions θ and φ. In some embodiments, a controller (not shown in FIG. 23, e.g., controller 610 of FIG. 6) is configured to control phase modulators 2302 to control the direction of beam of radiation 2316. In some aspects, phase modulators 2302 can comprise multi-pass phase shifters.

In some embodiments, the controller may control the direction of the beam of radiation 2316 to scan the substrate (e.g., substrate 538 of FIG. 5). Thus, in some aspects, the substrate may be fixed with respect to the inspection apparatus. A target structure may be scanned by steering the emitted beam in the horizontal or vertical direction.

Figure 24:
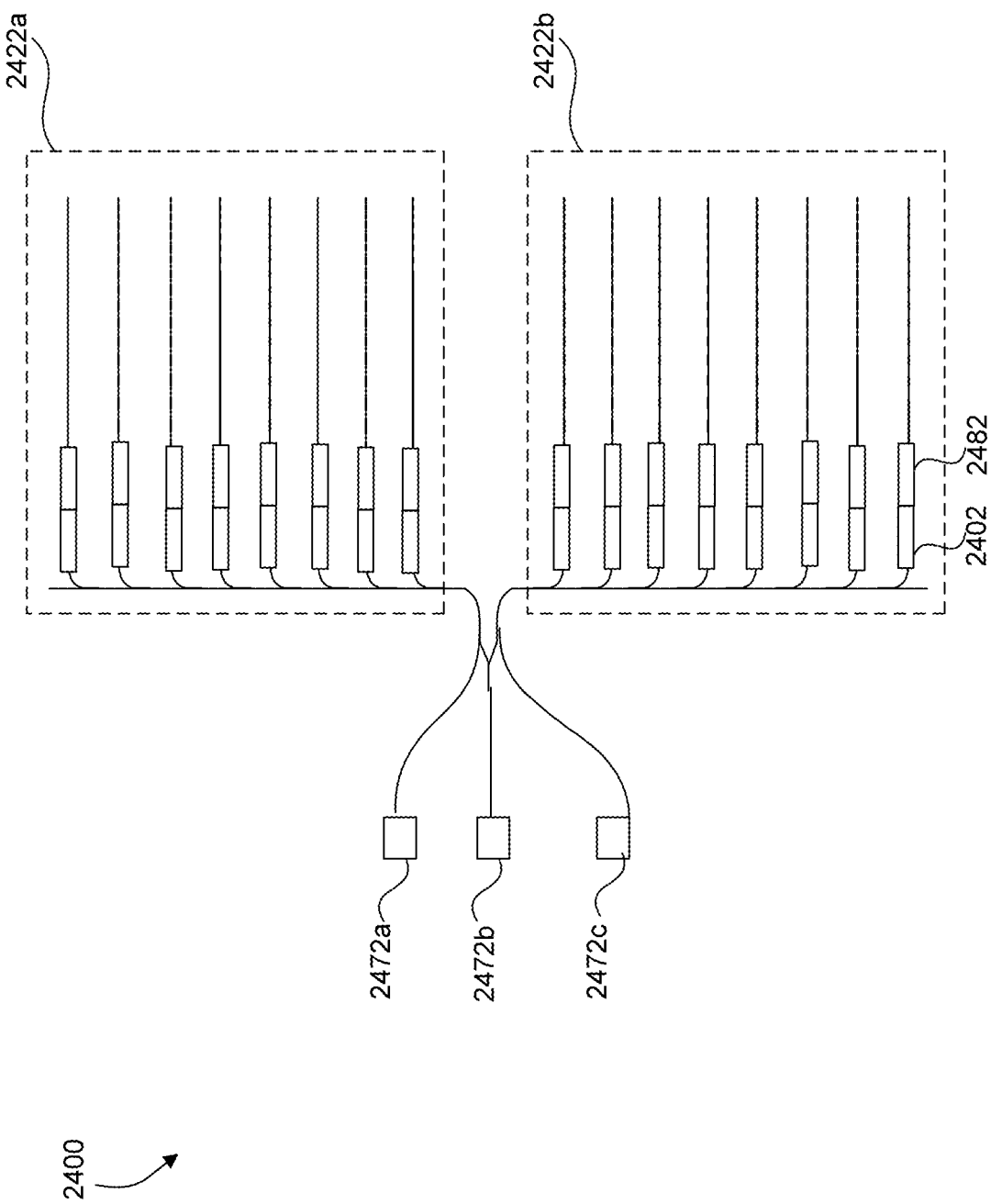
FIG. 24 shows a schematic of illumination system of an inspection system, according to some embodiments.

FIG. 24 shows a schematic of an illumination system 2400, according to some embodiments. In some embodiments, illumination system 2400 may be implemented as part of an inspection apparatus, e.g., as illumination system 500 in inspection apparatus 550 (FIG. 5). Elements of FIG. 24 may have similar structures and functions as similarly numbered elements in FIG. 22 (e.g., elements sharing the two right-most numeric digits). It should be appreciated that certain structures have been omitted from FIG. 24 in order to enhance clarity. Therefore, unless otherwise specified, it should be appreciated that embodiments referencing FIG. 24 may also comprise elements analogous to those shown in, e.g., FIG. 22.

Illumination system 2400 may include a first phased array 2422a and a second phased array 2422b. Phased arrays 2422a and 2422b may comprise structures and functions that may be substantially similar to those of, e.g., phased array 622 (FIG. 6).

In some embodiments, the illumination system 2400 may include a first input port 2472a, a second input port 2472b, and a third input port 2472c. First input port 2472a may couple radiation from a radiation source (e.g., radiation source 608 of FIG. 6) to first phased array 2422a. Second input port 2472b may simultaneously couple light to first phased array 2422a and second phased array 2422b. Third input port 2472c may couple light to second phased array 2422b.

In some embodiments, illumination system 2400 further comprises a controller (e.g., 2210 of FIG. 22). The controller may be configured to apply amplitude weighting to each of the optical elements. Thus, the controller may vary the amplitude weight of each element. The controller may be coupled to an attenuator 2482 coupled to the optical element. For example, the attenuator 2482 may be coupled to phase modulator 2402 (i.e., positioned downstream from phase modulator 2402). Amplitude weighting (via attenuator 2482) may be used for modifying beam of radiation.

In some embodiments, amplitude weighting may be used in transmit and/or receiver mode. For example, attenuators 2482 may be included in receiver system 2170 of FIG. 21. Thus, amplitude weighting may be applied to receiver arrays. In some aspects, a receiver array can be substantially similar to a phased array, e.g., first phased array 2422a but operating in a receiver mode.

Figure 25:
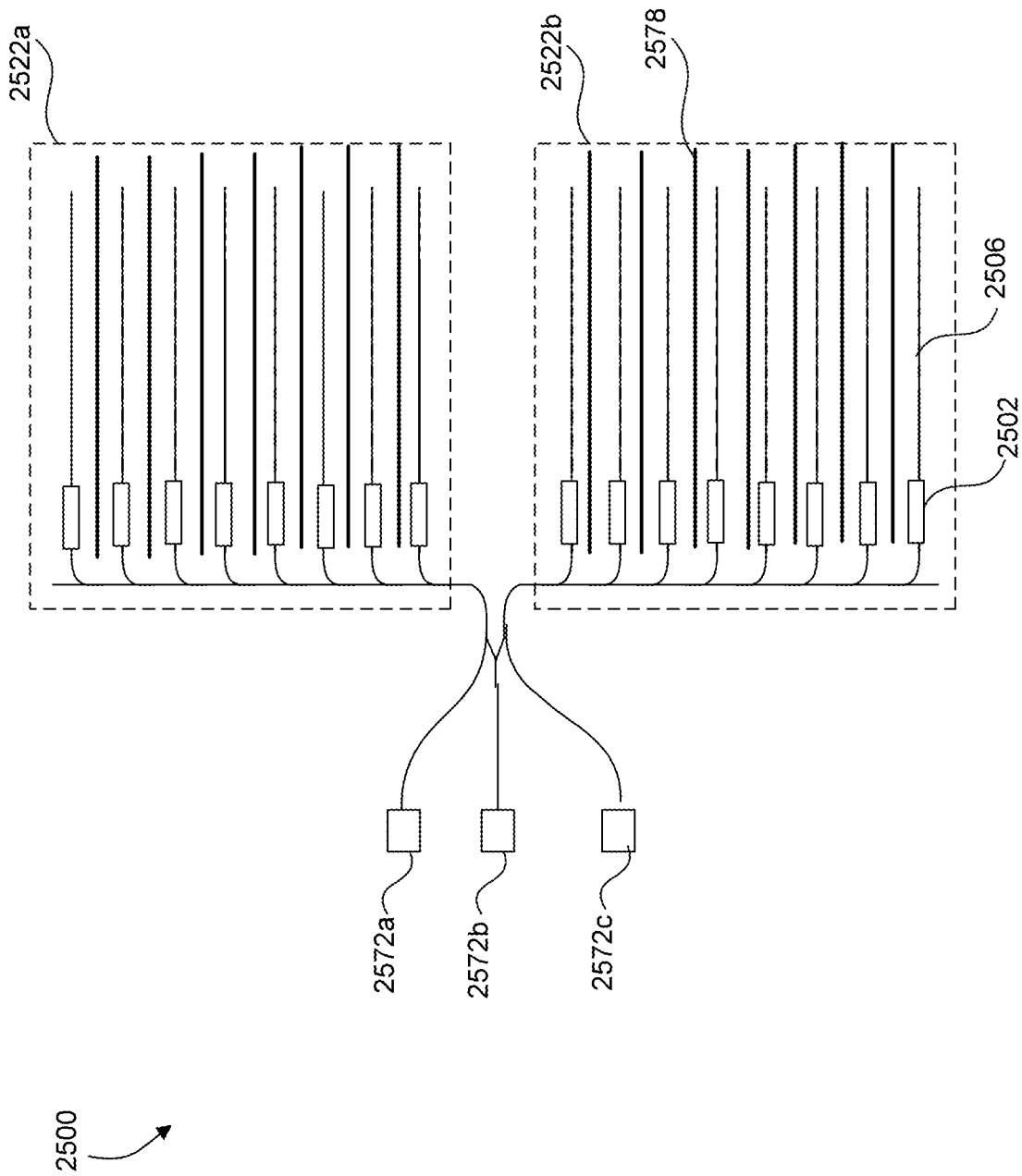
FIG. 25 shows a schematic of a phased arrays system of an inspection system, according to some embodiments.

FIG. 25 shows a schematic of an illumination system 2500, according to some embodiments. In some embodiments, illumination system 2500 may be implemented as part of an inspection apparatus, e.g., as illumination system 500 in inspection apparatus 550 (FIG. 5). Elements of FIG. 25 may have similar structures and functions as similarly numbered elements in FIG. 22 (e.g., elements sharing the two right-most numeric digits). It should be appreciated that certain structures have been omitted from FIG. 25 in order to enhance clarity. Therefore, unless otherwise specified, it should be appreciated that embodiments referencing FIG. 25 may also comprise elements analogous to those shown in, e.g., FIG. 22.

Illumination system 2500 may include a first phased array 2522a and a second phased array 2522b. Phased arrays 2522a and 2522b may comprise structures and functions that may be substantially similar to those of, e.g., phased array 622 (FIG. 6).

In some embodiments, the illumination system 2500 may include a first input port 2572a, a second input port 2572b, a third input port 2572c, waveguides 2504, and optical elements 2506.

In some embodiments, metal elements 2578 (i.e., conducting elements) may be positioned between optical elements 2506 to reduce coupling (e.g., mutual coupling) between adjacent optical elements 2506. In some aspects, the approaches described herein can improve the performance of the illumination system 2500. In some aspects, metal elements 2578 may be interposed between waveguides 2504. In some aspects, metal elements 2578 may be from copper or other conductive materials. In some aspects, metal elements 2578 are approximately co-planar with optical elements 2506. In some embodiments, metal elements 2578 can bisect a distance between an optical element 2506 and a corresponding adjacent optical element 2506. In some embodiments, metal elements 2578 can be parallel to waveguides 2504 and co-planar with the waveguides 2504.

In some embodiments, metal elements 2578 may be formed on the photonic integrated circuit (PIC).

In some embodiments, metal elements 2578 may be interposed in a receiver system, e.g., receiver system 2170 of FIG. 21. In some aspects, metal elements may be interposed between optical elements and waveguides in a receiver array. In some aspects, a receiver array is substantially similar to a phased array, e.g., phased array 2522a but is operating in a receiving mode.

The embodiments may further be described using the following clauses:

1. A system comprising:
   a radiation source;
   a phased array configured to generate a beam of radiation and to direct the beam toward a target structure on a substrate, the phased array comprising:
      optical elements configured to radiate radiation waves,
      waveguides configured to guide radiation from the radiation source to the optical elements, and
      phase modulators configured to adjust phases of the radiation waves such that the radiation waves accumulate to form the beam; and
   a detector configured to receive radiation scattered by the target structure and to generate a measurement signal based on the received radiation.
2. The system of clause 1, wherein a direction of the beam is based on the phases.
3. The system of clause 2, further comprising a controller configured to control the phase modulators to control the direction of the beam.
4. The system of clause 1, wherein the phased array is configured to adjust the direction of the beam without moving elements.
5. The system of clause 1, wherein the phased array further comprises a photonic integrated circuit.
6. The system of clause 1, wherein each of the phase modulator comprises an electro-optic phase modulator.
7. The system of clause 1, further comprising a lens configured to focus the radiation scattered by the target structure onto the detector.
8. The system of clause 1, wherein the radiation source is configured to generate broadband wavelengths or two or more narrowband wavelengths.
9. The system of clause 8, wherein:
   the radiation source comprises source elements; and
   each of the source elements is configured to generate a subset of the broadband wavelengths or the two or more narrowband wavelengths.
10. The system of clause 1, further comprising a spectral filter configured to select a wavelength from the radiation source to enter the phased array, wherein the beam has the wavelength.
11. The system of clause 1, further comprising a time multiplexer configured to select a sequence of wavelengths from the radiation source to enter the phased array, wherein the beam has the sequence of wavelengths one wavelength at a time.
12. The system of clause 1, further comprising a phase shifter configured to compensate a directional shift of a beam resulting from a selection of a wavelength from the radiation source to enter the phased array.
13. The system of clause 1, wherein:
   the phased array is further configured to adjust amplitudes of the radiation waves; and
   the beam comprises a beam profile that is based on the amplitudes and phases.
14. The system of clause 13, wherein the beam profile comprises a substantially flat intensity distribution.
15. The system of clause 13, wherein a full-width at half-maximum of the flat intensity distribution is less than approximately 2 microns.
16. The system of clause 12, wherein a full-width at half-maximum of the beam profile is less than approximately 500 nm.
17. The system of clause 1, wherein the system has a footprint area less than approximately 100 mm$^2$, 50 mm$^2$, 25 mm$^2$, or 16 mm$^2$.
18. The system of clause 1, wherein the detector comprises an image capture device.
19. The system of clause 1, wherein the system is configured to selectively illuminate structures near the target structure and to use radiation detected by the detector resulting from the illumination to reduce interference of the received radiation.
20. The system of clause 1, wherein the system is configured to determine at least one of overlay error and critical dimension of the target structure based on the measurement signal.
21. The system of clause 1, further comprising another phased array configured to generate another beam of radiation and to direct the beam toward the target structure.
22. The system of clause 21, further comprising:
   a first spectral filter configured to select a first wavelength from the radiation source to enter the phased array, wherein the beam has the first wavelength; and
   a second spectral filter configured to select a second wavelength from the radiation source to enter the another phased array, wherein the another beam has the second wavelength.
23. The system of clause 21, wherein the beam and the another beam have substantially similar wavelengths.

24. The system of clause 21, wherein the beam and the another beam are directed to overlap at the target structure and to form a beam profile having a fringe pattern.

25. The system of clause 24, wherein a pitch of the fringe pattern is adjustable based on a selection of phases of radiation waves radiated by the phased array and the another phased array and a selection of wavelength of the beam and the another beam.

26. The system of clause 24, further comprising a controller configured to receive, from a user, input comprising selections of at least one of pitch and wavelength of the fringe pattern and to determine adjustments to the phases based on the input so as to set a pitch of the fringe pattern according to the selections.

27. The system of clause 24, wherein the measurement signal is further based on scattered radiation resulting from the fringe pattern and the system is configured to scan the fringe pattern across the target structure and to determine a position of the target structure based on the measurement signal.

28. A lithographic apparatus comprising:
an illumination system configured to illuminate a pattern of a patterning device;
a support configured to support the patterning device;
a substrate table configured to support a substrate;
a projection system configured to project an image of the pattern onto the substrate; and
a metrology system comprising:
a radiation source;
a phased array configured to generate a beam of radiation and to direct the beam toward a target structure on the substrate, the phased array comprising:
optical elements configured to radiate radiation waves,
waveguides configured to guide radiation from the radiation source to the optical elements, and
phase modulators configured to adjust phases of the radiation waves such that the radiation waves accumulate to form the beam; and
a detector configured to receive radiation scattered by the target structure and to generate a measurement signal based on the received radiation.

29. An illumination system comprising:
first and second phased arrays configured to generate first and second beams of radiation respectively, each of the first and second phased arrays comprising:
optical elements configured to radiate radiation waves;
waveguides configured to guide source radiation to the optical elements; and
phase modulators configured to adjust phases of the radiation waves,
wherein the phases of the radiation waves from the first and second phased arrays are adjusted such that the radiation waves from the first and second phased arrays respectively accumulate to form the first and second beams, and
wherein the first and second beams are directed to overlap and interfere to form a beam profile having a fringe pattern.

30. The illumination system of clause 29, wherein directions of the first and second beams are respectively based on the phases in the first and second phased arrays.

31. The illumination system of clause 29, wherein the illumination system is configured to adjust a property of at least one of the first and second beams to adjust a property of the fringe pattern.

32. The illumination system of clause 31, wherein a property of the fringe pattern is pitch.

33. The illumination system of clause 31, wherein the property of the at least one of the first and second beams comprises phase delays of the radiation waves from the first and second phased arrays, respectively.

34. The illumination system of clause 31, wherein the property of the at least one of the first and second beams is wavelength.

35. The system of clause 29, wherein a pitch of the fringe pattern is adjustable based on a selection of phases of radiation waves radiated by the phased array and the another phased array and a selection of wavelength of the beam and the another beam.

36. The illumination system of clause 29, further comprising a controller configured to receive, from a user, input comprising selections of at least one of pitch and wavelength of the fringe pattern and to determine adjustments to the phases in the first and second phased arrays based on the input so as to set a pitch of the fringe pattern according to the selections.

37. The illumination system of clause 29, further comprising a radiation source configured to generate the source radiation that is received at the first and second phased arrays.

38. The illumination system of clause 37, wherein the radiation source is further configured to generate broadband wavelengths or two or more narrowband wavelengths.

39. The illumination system of clause 38, wherein:
the radiation source comprises source elements; and
each of the source elements is configured to generate a subset of the broadband wavelengths or the two or more narrowband wavelengths.

40. The illumination system of clause 37, further comprising:
a first spectral filter configured to select a first wavelength from the radiation source to enter the first phased array, wherein the first beam has the first wavelength; and
a second spectral filter configured to select a second wavelength from the radiation source to enter the second phased array, wherein the second beam has the second wavelength.

41. A lithographic apparatus comprising:
an illumination system configured to illuminate a pattern of a patterning device;
a support configured to support the patterning device;
a substrate table configured to support a substrate;
a projection system configured to project an image of the pattern onto the substrate; and
a metrology system comprising:
first and second phased arrays configured to generate first and second beams of radiation and respectively and to direct the first and second beams respectively toward a target structure on the substrate, each of the first and second phased arrays comprising:
optical elements configured to radiate radiation waves;
waveguides configured to guide source radiation to the optical elements; and phase modulators configured to adjust phases of the radiation waves, wherein the phases of the radiation waves from the first and second phased arrays are adjusted such that the radiation waves from the first and second phased arrays respectively accumulate to form the first and second beams, and wherein the first and second beams are directed to overlap at the target structure to form a beam profile having a fringe pattern; and a detector configured to receive radiation scattered by the target structure and to generate a measurement signal based on the received radiation.

42. A method comprising:

generating a beam of radiation using a phased array, the generating comprising:

generating source radiation;

guiding the source radiation to optical elements using waveguides;

radiating radiation waves using the optical elements; and setting phases of the radiation waves using phase modulators such that the radiation waves accumulate to form the beam;

directing the beam toward a target structure on a substrate, wherein the direction of the beam is based on the phases;

receiving, at a detector, radiation scattered by the target structure; and generating a measurement signal based on the received radiation.

43. A system comprising:

a radiation source;

first and second phased arrays comprising optical elements configured to radiate radiation waves, waveguides configured to guide radiation from the radiation source to the optical elements, and phase modulators configured to adjust phases of the radiation waves, wherein the first and second phased arrays are respectively configured to form first and second beams of radiation directed toward a target structure to form an illumination profile having a fringe pattern based on the adjusting;

a receiver array configured to receive radiation scattered by the target structure; and a detector configured to generate a measurement signal based on the received radiation.

44. The system of clause 43, wherein the receiver array comprises: waveguides configured to guide the received radiation to the detector; and optical elements configured to couple the received radiation into the waveguides.

45. The system of clause 43, wherein the receiver array is disposed between the first and second phased arrays.

46. The system of clause 43, further comprising a second receiver array.

47. The system of clause 46, wherein the receiver array is disposed adjacent to the first phased array and the second receiver array is disposed adjacent to the second phased array.

48. The system of clause 46, wherein the receiver array receives the scattered radiation via a reflecting element.

49. The system of clause 48, wherein the reflecting element is a mirror made of silver, gold, aluminum, or copper.

50. The system of clause 49, wherein the reflecting element reflects the scattered radiation back to the target structure.

51. The system of clause 50, wherein both of the receiver array and the second receiver array receives the scattered radiation.

52. The system of clause 43, wherein the first and second phased arrays and are parts of a photonic integrated circuit and the receiver array is a part of the integrated circuit or a separate photonic integrated circuit.

53. The system of clause 52, wherein the photonic integrated circuit and the separate photonic integrated circuit are tilted with respect to a perpendicular of the target structure.

54. A lithographic apparatus comprising:

an illumination system configured to illuminate a pattern of a patterning device;

a support configured to support the patterning device;

a substrate table configured to support a substrate;

a projection system configured to project an image of the pattern onto the substrate; and a metrology system comprising:

first and second phased arrays configured to generate first and second beams of radiation respectively and to direct the first and second beams respectively toward a target structure on the substrate, each of the first and second phased arrays comprising:

optical elements configured to radiate radiation waves;

waveguides configured to guide source radiation to the optical elements; and phase modulators configured to adjust phases of the radiation waves, wherein the phases of the radiation waves from the first and second phased arrays are adjusted such that the radiation waves from the first and second phased arrays respectively accumulate to form the first and second beams, and wherein the first and second beams are directed to overlap at the target structure to form a beam profile having a fringe pattern;

a receiver array configured to receive radiation scattered by the target structure; and a detector configured to generate a measurement signal based on the received radiation.

55. A method comprising:

generating a beam of radiation using a phased array, the generating comprising:

generating source radiation;

guiding the source radiation to optical elements using waveguides;

radiating radiation waves using the optical elements; and setting phases of the radiation waves using phase modulators such that the radiation waves accumulate to form the beam;

directing the beam toward a target structure on a substrate, wherein the direction of the beam is based on the phases;

receiving, at a receiver array, radiation scattered by the target structure; and generating, at a detector, a measurement signal based on the received radiation.

56. The method of clause 55, further comprising:

receiving at a second receiver array, the radiation scattered by the target structure;

generating a second measurement signal based on the received radiation at the second receiver array; and analyzing the measurement signal and the second measurement signal to perform a reliability measurement.

57. A system comprising:
a radiation source;
first and second phased arrays comprising optical elements configured to radiate radiation waves, a plurality of ports, waveguides configured to guide radiation from a port of the plurality of ports to the optical elements, and phase modulators configured to adjust phases of the radiation waves, wherein one or both of the first and second phased arrays are respectively configured to form a first beam and/or a second beam of radiation directed toward a target structure based on the port coupled to the radiation source; and
a detector configured to receive radiation scattered by the target structure and to generate a measurement signal based on the received radiation.

58. The system of clause 57, wherein the plurality of ports comprise:
a first input port coupled to the first phased array;
a second input port coupled to the first and second phased arrays; and
a third input port coupled to the second phased array.

59. The system of clause 58, wherein:
the first beam is formed when the radiation source is coupled to the first input port,
the second beam is formed when the radiation source is coupled to the third port, and
the first beam and the second beam are simultaneously formed when the radiation source is coupled to the second input port.

60. The system of clause 58, wherein the radiation source is coupled to the second input port during alignment measurements.

61. The system of clause 58, wherein the radiation source is coupled to the first input port or the third input port during spot size characterization of the respective first or second beams.

62. The system of clause 57, further comprising:
a first tree extending from a first coupler to the optical elements of the first phased array; and
a second tree extending from a second coupler to the optical elements of the second phased array,
wherein each optical element of the optical elements is located at a leaf of the first tree or the second tree.

63. The system of clause 62, wherein:
the first coupler comprises a two by two coupler connecting a first input port and a second input port to the first tree; and
the second coupler comprises a two by two coupler connecting the second input port and a third input port to the second tree.

64. The system of clause 62, wherein the first and second trees comprises a plurality of splitters.

65. The system of clause 57, wherein the first beam and the second beam have the same direction.

66. The system of clause 57, further comprising one or more metal elements interposed between the waveguides.

67. The system of clause 57, further comprising:
a controller configured to receive from a user, to input a selection of a measurement mode, to identify the port from the plurality of ports according to the selection, and to control a connection between the radiation source and the identified port.

68. A system comprising:
a radiation source;
a phased array configured to generate a beam of radiation and to direct the beam toward a target structure on a substrate, the phased array comprising:
optical elements configured to radiate radiation waves,
waveguides configured to guide radiation from the radiation source to the optical elements, and
phase modulators configured to adjust phases of the radiation waves such that the radiation waves accumulate to form the beam;
a detector configured to receive radiation scattered by the target structure and to generate a measurement signal based on the received radiation; and
a controller configured to control a phase offset of each respective optical element to control a direction of the beam.

69. The system of clause 68, wherein the controller is further configured to control the direction of the beam to scan the substrate.

70. The system of clause 69, wherein the beam is configured to scan the substrate without moving elements.

71. The system of clause 68, wherein the phased array comprises a splitter tree from the radiation source to the optical elements.

72. The system of clause 68, further comprising one or more metal elements interposed between the waveguides.

73. The system of clause 68, wherein the controller is further configured to apply amplitude weighting to each optical element of the optical elements.

74. A system comprising:
a phased array comprising:
optical elements configured to radiate or detect radiation waves;
waveguides configured to guide radiation from the radiation source to the optical elements or from the optical elements to a detector;
phase modulators configured to adjust phases of the radiation waves; and
one or more metal elements interposed between the waveguides configured to reduce coupling between optical elements.

75. The system of clause 74, wherein the phased array further comprises a photonic integrated circuit.

76. The system of clause 75, wherein the one or metal elements are formed on the photonic integrated circuit.

Although specific reference can be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, LCDs, thin-film magnetic heads, etc. The skilled artisan will appreciate that, in the context of such alternative applications, any use of the terms "wafer" or "die" herein can be considered as synonymous with the more general terms "substrate" or "target portion", respectively. The substrate referred to herein can be processed, before or after exposure, in for example a track unit (a tool that typically applies a layer of resist to a substrate and develops the exposed resist), a metrology unit and/or an inspection unit. Where applicable, the disclosure herein can be applied to such and other substrate processing tools. Further, the substrate can be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention can be used in other applications, for example imprint lithography, and where the context allows, is not limited to optical lithography. In imprint lithography a topography in a patterning device defines the pattern created on a substrate. The topography of the patterning device can be pressed into a layer of resist supplied to the substrate whereupon the resist is cured by applying electromagnetic radiation, heat, pressure or a combination thereof. The patterning device is moved out of the resist leaving a pattern in it after the resist is cured.

It is to be understood that the phraseology or terminology herein is for the purpose of description and not of limitation, such that the terminology or phraseology of the present disclosure is to be interpreted by those skilled in relevant art(s) in light of the teachings herein.

The term "substrate" as used herein describes a material onto which material layers are added. In some embodiments, the substrate itself can be patterned and materials added on top of it may also be patterned, or may remain without patterning.

Although specific reference can be made in this text to the use of the apparatus and/or system according to the invention in the manufacture of ICs, it should be explicitly understood that such an apparatus and/or system has many other possible applications. For example, it can be employed in the manufacture of integrated optical systems, guidance and detection patterns for magnetic domain memories, LCD panels, thin-film magnetic heads, etc. The skilled artisan will appreciate that, in the context of such alternative applications, any use of the terms "reticle," "wafer," or "die" in this text should be considered as being replaced by the more general terms "mask," "substrate," and "target portion," respectively.

While specific embodiments of the invention have been described above, it will be appreciated that the invention can be practiced otherwise than as described. The description is not intended to limit the invention.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein.

The breadth and scope of the present invention should not be limited by any of the above-described exemplary embodiments, but should be defined only in accordance with the following claims and their equivalents.

The invention claimed is:

1. A system comprising:
   a radiation source;
   first and second phased arrays comprising optical elements configured to radiate radiation waves;
   a plurality of ports;
   waveguides configured to guide radiation from a port of the plurality of ports to the optical elements; and
   phase modulators configured to adjust phases of the radiation waves;
   wherein one or both of the first and second phased arrays are respectively configured to form a first beam and/or a second beam of radiation directed toward a target structure based on the port coupled to the radiation source; and
   a detector configured to receive radiation diffracted by the target structure and to generate a measurement signal based on the received radiation, wherein the measurement signal is indicative of an alignment characteristic or an overlay characteristic of the target structure.

2. The system of claim 1, wherein the first beam and the second beam have a same direction.

3. The system of claim 1, further comprising one or more metal elements interposed between the waveguides.

4. The system of claim 1, further comprising:
   a controller configured to receive from a user a selection of a measurement mode, to identify the port from the plurality of ports according to the selection, and to control a connection between the radiation source and the identified port.

5. The system of claim 1, wherein the first beam of radiation has a first wavelength and the second beam of radiation has a second wavelength different from the first wavelength.

6. The system of claim 1, wherein the first beam of radiation and the second beam of radiation illuminate a location of the target structure at different angles of incidence.

7. The system of claim 1, further comprising:
   a third phased array configured to receive the diffracted radiation, wherein the third phased array is coupled to the detector.

8. The system of claim 1, wherein the plurality of ports comprises:
   a first input port coupled to the first phased array;
   a second input port coupled to the first and second phased arrays; and
   a third input port coupled to the second phased array.

9. The system of claim 8, wherein:
   the first beam is formed when the radiation source is coupled to the first input port,
   the second beam is formed when the radiation source is coupled to the third input port, and
   the first beam and the second beam are simultaneously formed when the radiation source is coupled to the second input port.

10. The system of claim 8, wherein the radiation source is coupled to the second input port during alignment measurements.

11. The system of claim 8, wherein the radiation source is coupled to the first input port or the third input port during spot size characterization of the respective first or second beams.

12. The system of claim 1, further comprising:
a first tree extending from a first coupler to the optical elements of the first phased array; and
a second tree extending from a second coupler to the optical elements of the second phased array,
wherein each optical element of the optical elements is located at a leaf of the first tree or the second tree.

13. The system of claim 12, wherein:
the first coupler comprises a two by two coupler connecting a first input port and a second input port to the first tree; and
the second coupler comprises a two by two coupler connecting the second input port and a third input port to the second tree.

14. The system of claim 12, wherein the first and second trees comprises a plurality of splitters.

15. A system comprising:
a radiation source;
a phased array configured to generate a beam of radiation and to direct the beam toward a target structure on a substrate, the phased array comprising:
optical elements configured to radiate radiation waves,
waveguides configured to guide radiation from the radiation source to the optical elements,
one or more metal elements interposed between the optical elements, and
phase modulators configured to adjust phases of the radiation waves such that the radiation waves accumulate to form the beam;
a detector configured to receive radiation diffracted by the target structure and to generate a measurement signal based on the received radiation, wherein the measurement signal is indicative of an alignment characteristic or an overlay characteristic of the target structure; and
a controller configured to control a phase offset of each respective optical element to control a direction of the beam.

16. The system of claim 15, wherein the phased array comprises a splitter tree from the radiation source to the optical elements.

17. The system of claim 15, wherein the one or more metal elements are coplanar with the optical elements.

18. The system of claim 15, wherein the controller is further configured to apply amplitude weighting to each optical element of the optical elements.

19. The system of claim 15, wherein the radiation source, the phased array, and the detector are formed on a photonic integrated circuit.

20. The system of claim 15, wherein the controller is further configured to control the direction of the beam to scan the substrate.

21. The system of claim 20, wherein the beam is configured to scan the substrate without moving elements.

22. A system comprising:
a first phased array comprising:
optical elements configured to radiate radiation waves;
waveguides configured to guide radiation from a radiation source to the optical elements;
phase modulators configured to adjust phases of the radiation waves; and
one or more metal elements, interposed between the waveguides, configured to reduce coupling between optical elements, wherein the first phased array is configured to form a first beam of radiation directed toward a target structure;
a second phased array comprising:
optical elements configured to detect diffracted radiation waves from the target structure;
waveguides configured to guide radiation from the optical elements to a detector;
phase modulators configured to adjust phases of the radiation waves; and
one or more metal elements, interposed between the waveguides, configured to reduce coupling between optical elements;
wherein the detector is configured to generate a measurement signal based on the received radiation, and
wherein the measurement signal is indicative of an alignment characteristic or an overlay characteristic of the target structure.

23. The system of claim 22, wherein the first phased array and the second phased array further comprise a photonic integrated circuit.

24. The system of claim 23, wherein the one or metal elements of the first phased array and the second phased array are formed on the photonic integrated circuit.

* * * * *

UNITED STATES PATENT AND TRADEMARK OFFICE
CERTIFICATE OF CORRECTION

PATENT NO. : 11,994,808 B2
APPLICATION NO. : 17/029845
DATED : May 28, 2024
INVENTOR(S) : Swillam et al.

Page 1 of 1

It is certified that error appears in the above-identified patent and that said Letters Patent is hereby corrected as shown below:

In the Specification

In Column 20, Line 23, delete "A" and replace with --$\lambda$--.

In Column 21, Line 17, delete "A" and replace with --$\lambda$--.

In Column 31, Line 24, delete "$\lambda_1$" and replace with --$\theta_1$--.

Signed and Sealed this
Second Day of July, 2024

Katherine Kelly Vidal
*Director of the United States Patent and Trademark Office*